United States Patent
Kern et al.

(10) Patent No.: US 9,450,613 B2
(45) Date of Patent: Sep. 20, 2016

(54) APPARATUS AND METHOD FOR ERROR CORRECTION AND ERROR DETECTION

(71) Applicant: Infineon Technologies AG, Neubiberg (DE)

(72) Inventors: Thomas Kern, Aschheim (DE); Ulrich Backhausen, Taufkirchen (DE); Thomas Rabenalt, Unterhaching (DE); Michael Goessel, Mahlow (DE); Klaus Oberlaender, Neubiberg (DE); Christian Badack, Luebben (DE)

(73) Assignee: Infineon Technologies AG, Neubiberg (DE)

(*) Notice: Subject to any disclaimer, the term of this patent is extended or adjusted under 35 U.S.C. 154(b) by 134 days.

(21) Appl. No.: 14/327,796

(22) Filed: Jul. 10, 2014

(65) Prior Publication Data

US 2015/0007001 A1 Jan. 1, 2015

Related U.S. Application Data

(63) Continuation-in-part of application No. 13/975,621, filed on Aug. 26, 2013, which is a continuation of application No. 12/943,520, filed on Nov. 10, 2010, now Pat. No. 8,539,321.

(51) Int. Cl.
*H03M 13/00* (2006.01)
*H03M 13/15* (2006.01)

(52) U.S. Cl.
CPC ......... *H03M 13/151* (2013.01); *H03M 13/152* (2013.01); *H03M 13/155* (2013.01); *H03M 13/159* (2013.01); *H03M 13/1575* (2013.01); *H03M 13/616* (2013.01); *H03M 13/6575* (2013.01)

(58) Field of Classification Search
None
See application file for complete search history.

(56) References Cited

U.S. PATENT DOCUMENTS

| | | | |
|---|---|---|---|
| 3,623,155 A | 11/1971 | Hsiao et al. | |
| 3,714,629 A | 1/1973 | Hong et al. | |
| 5,657,331 A | 8/1997 | Metzner et al. | |
| 5,938,773 A * | 8/1999 | Hauck | H04L 1/0057 714/18 |
| 7,721,177 B2 | 5/2010 | Gammel et al. | |
| 7,849,388 B2 | 12/2010 | Esumi et al. | |
| 8,230,292 B2 | 7/2012 | Fujiwara et al. | |
| 2002/0018389 A1* | 2/2002 | Ito | G06F 11/1008 365/222 |
| 2003/0023930 A1 | 1/2003 | Fujiwara et al. | |
| 2004/0221098 A1* | 11/2004 | Ito | G06F 11/106 711/106 |
| 2006/0200729 A1* | 9/2006 | Ito | G06F 11/1008 714/763 |
| 2006/0282756 A1 | 12/2006 | Gammel et al. | |
| 2007/0038919 A1* | 2/2007 | Sekiguchi | G06F 11/1044 714/763 |
| 2007/0110188 A1 | 5/2007 | Esumi et al. | |
| 2007/0162821 A1 | 7/2007 | Hwang et al. | |

(Continued)

OTHER PUBLICATIONS

Anfinson et al., "A Linear Algebraic Model of Algorithm-Based Fault Tolerance", 1988, IEEE.
Chen et al., "Error-Correcting Codes for Semiconductor Memory Applications: A State-of-the-Art Review", Mar. 1984, IBM j> Res. Develop, vol. 28, No. 2.
Hsiao, M. Y., "A Class of Optimal Minimum Odd-weight-column SEC-DED Codes", Jul. 1970, IBM Journal of Research and Development, vol. 14, Iss. 4, pp. 395-401.
Notice of Allowance dated May 21, 2013 for U.S. Appl. No. 12/943,520. 27 Pages.
U.S. Appl. No. 13/975,621, filed Aug. 26, 2013.
U.S. Appl. No. 12/943,520, filed Nov. 10, 2010.

*Primary Examiner* — M. Mujtaba K Chaudry
(74) *Attorney, Agent, or Firm* — Eschweiler & Associates, LLC

(57) ABSTRACT

A circuitry comprising a syndrome generator configured to generate a syndrome based on a parity check matrix and a binary word comprising a first set of bits and a second set of bits is provided. For the first set of bits an error correction of correctable bit errors within the first set is provided by the parity check matrix and for the second set of bits an error detection of a detectable bit errors within the second set is provided by the parity check matrix.

25 Claims, 22 Drawing Sheets

(56) References Cited

U.S. PATENT DOCUMENTS

| | | |
|---|---|---|
| 2009/0049369 A1 | 2/2009 | Goessel et al. |
| 2009/0106633 A1 | 4/2009 | Fujiwara et al. |
| 2009/0228758 A1 | 9/2009 | Choi et al. |
| 2010/0169737 A1* | 7/2010 | Litsyn ............... G06F 11/1068 714/752 |
| 2011/0119559 A1 | 5/2011 | Kamoshida |
| 2012/0117431 A1 | 5/2012 | Bremler-Barr et al. |

\* cited by examiner

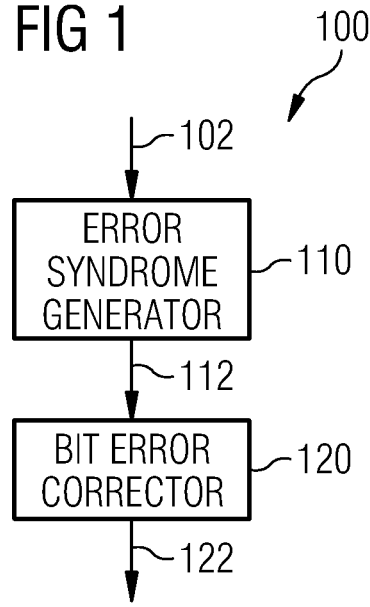
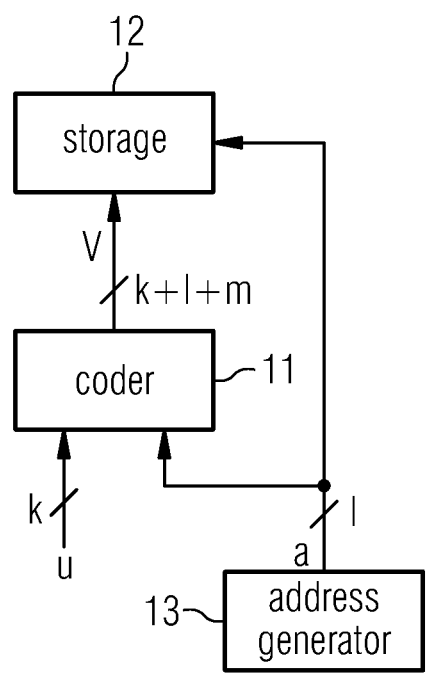

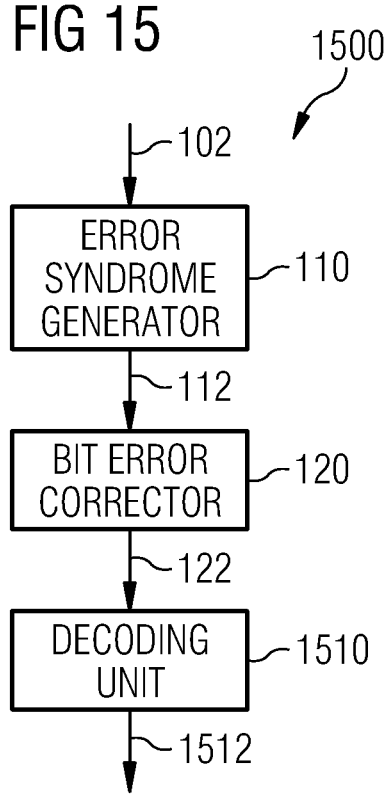
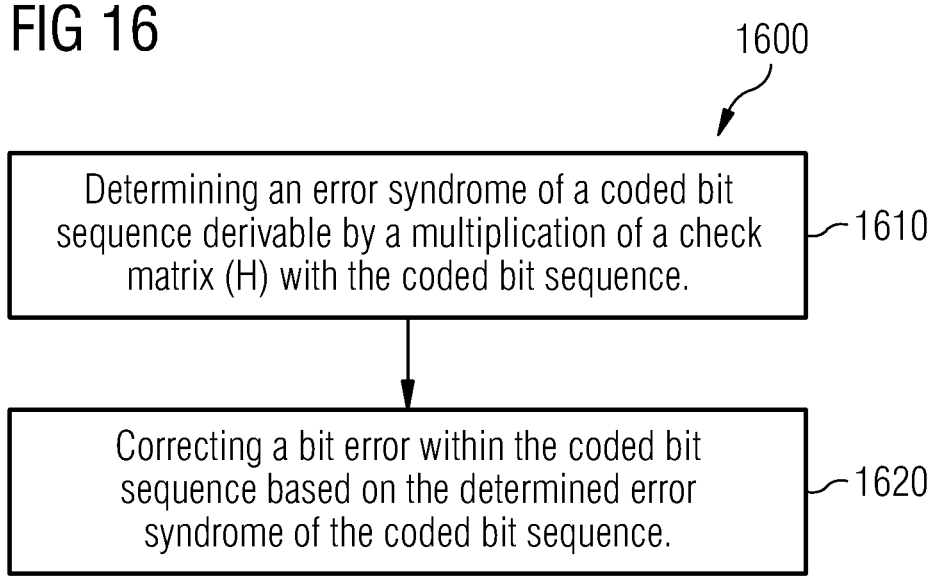

US 9,450,613 B2

APPARATUS AND METHOD FOR ERROR CORRECTION AND ERROR DETECTION

REFERENCE TO RELATED APPLICATION

This application is a continuation-in-part of U.S. application Ser. No. 13/975,621, filed on Aug. 26, 2013, which is a continuation of U.S. application Ser. No. 12/943,520, filed on Nov. 10, 2010.

FIELD

Embodiments according to the invention relate to error correction and error detection of digital signals and particularly to an apparatus and a method for correcting at least one bit error within a coded bit sequence.

BACKGROUND

Due to the high integration density of electronic circuits and storages, the frequency of errors increases.

Apart from 1-Bit-errors, increasingly also 2-Bit-errors and general multi-bit errors are to be considered, i.e. to be corrected and to be detected. In particular, in error correction it is important to correct the occurred errors quickly, if possible within the current clock cycle in order to prevent a delayed processing of the corrected data as compared to the uncorrected data.

Frequently, data are written into a storage under an address and read out after some time. Here it is possible that the data when read out of the storage are faulty or corrupt and have to be corrected after reading it out.

Here, both one bit errors, two bit errors and generally multi-bit errors occur, which are caused randomly with decreasing probability, and also errors occur in which all memory cells take on the value 0 erroneously, which is to be referred to as "All-0", and also errors where all memory cells take on the value 1, to be referred to here as "All-1".

It is also of special interest to detect possible address errors with a high probability, as a faulty address for example when reading out of a storage, may lead to completely different data. It is possible to correct one bit errors by Hamming code or Hsia-codes and 2-Bit-errors relatively fast by BCH-Codes implemented in parallel.

Disadvantageous with prior solutions for 1-bit and 2-bit error correction is, for example, that the errors "All-0" and "All-1" are not part of error detection. Generally, it is of high interest to improve the reliability of error correction and error detection concepts.

SUMMARY

A syndrome generator for forming an error syndrome of a linear code C of length n with an H-matrix $H=(h_1, \ldots, h_n)$ of n columns $h_1, \ldots, h_n$ of m components each such that the H-matrix is an (m, n)-matrix, wherein a codeword $v=v_1, \ldots, v_n$ of the code C comprises a first subword $x_1, \ldots, x_{k+m}$ of length k+m and a second subword $a_1, \ldots, a_l$ of length l, wherein n=k+l+m. The code C is configured for correcting 1, ..., t-bit errors in bits of the first subword and to detect 1, ..., l bit errors in bits of the second subword so that the columns of the H-matrix H corresponding to the bits of the first subword are forming a first (m, k+m)-sub-matrix $H^x=(h_1^x, \ldots, h_{k+m}^x)$ and so that the columns of the H-matrix H corresponding to the bits of the second subword are forming a second sub-matrix $H^a=(h_1^a, \ldots, h_l^a)$. All linear combinations of up to t columns of the first submatrix $H^x$, which do not result in the zero vector, are pairwise different. Moreover, all linear combinations of the columns of the second submatrix $H^a$ are different from all linear combinations of up to t columns of the first sub-matrix $H^x$, which do not result in the zero vector, wherein t≥1, k>0, k+m≥4, and l>t+1.

Moreover, a syndrome generator for forming an error syndrome of a linear code C of length n having m check bits and an H-matrix H is provided, wherein a codeword $v=v_1, \ldots, v_n$ of the code C comprises a first subword $u_1, \ldots, u_k, c_1, \ldots, c_m$ of length k+m and a second subword $a_1, \ldots, a_l$ of length l with n=k+m+l. The code C is configured for correcting 1-bit, ..., t-bit errors in bits of the first subword $u_1, \ldots, u_k, c_1, \ldots, c_m$ and to detect errors in bits of the second subword $a_1, \ldots, a_l$. The H-matrix $H=(H^u, H^a, H^c)$ of the code C is determined so that it consists of a first (m, k+m)-sub-matrix $H^x=(H^u, H^c)=(h_1^x, \ldots, h_{k+m}^x)$ having k+m columns with m components and a second (m, l)-sub-matrix $H^y=H^a=(h_1^y, \ldots, h_l^y)$ having l columns with m components, so that an error syndrome is associated to each 1-bit, ..., t-bit error in the bits $u_1, \ldots, u_k, c_1, \ldots, c_m$, so that pairwise different error syndromes unequal 0 are associated to different errors of said errors, respectively, and so that to each 1-bit error, ... n-bit error in the bits $a_1, \ldots, a_l$, an error syndrome is associated that differs from each error syndrome of a 1-bit error, ..., t-bit error in the bits $u_1, \ldots, u_k, \ldots, c_m$. The first sub-matrix $H^x$ is an H-matrix of a linear t-bit error correcting code of the length k+m, and wherein an arbitrary linear combination of the columns $h_1^y, \ldots, h_l^y$ of the second sub-matrix $H^y$ is unequal to an arbitrary linear combination of t columns of the first sub-matrix $H^x$, wherein t≥1, k+m≥4, and l>t+1.

Moreover, a circuitry comprising a syndrome generator configured to generate a syndrome based on a parity check matrix and a binary word comprising a first set of bits and a second set of bits is provided. For the first set of bits an error correction of one or more correctable bit errors within the first set is provided by the parity check matrix and for the second set of bits an error detection of one or more detectable bit errors within the second set is provided by the parity check matrix. The parity check matrix comprises a first subset of columns that are associated with the first set of bits within the binary word, and a second subset of columns that are associated with the second set of bits within the binary word. Syndromes generated by the first subset of columns in case one of the one or more correctable errors occurs within the first set of bits are all pairwise different for the one or more correctable errors and are also different from all syndromes generated by the second subset of columns in case an arbitrary error occurs within the second set of bits.

An embodiment of the invention provides an apparatus for correcting at least one bit errors within a coded bit sequence. The apparatus comprises an error syndrome generator and a bit error corrector. The error syndrome generator is configured to determine an error syndrome of a coded bit sequence derived by a multiplication of a check matrix with the coded bit sequence. The check matrix comprises a first sub-matrix, a second sub-matrix and a third sub-matrix. Each sub-matrix comprises a plurality of lines, wherein each line comprises a plurality of binary components. Further, at least a first predefined component or a second predefined component of each line of the first sub-matrix comprises a first bit value. The second sub-matrix comprises lines being linearly independent from each other and the first predefined component and the second predefined component of each line of the second sub-matrix comprises a same second bit value. The third sub-matrix comprises lines being linearly independent from each other and the first predefined component or the second predefined component of each line of the third sub-matrix comprises the first bit value. Further, an XOR-sum of the first predefined components of all lines of the first sub-matrix and the third sub-matrix is equal to the second bit value and an XOR-sum of the second predefined components of all lines of the first sub-matrix and the third sub-matrix is equal to 0. Additionally, a result of a multiplication of the check matrix and a test vector is equal to a result of a multiplication of the second sub-matrix and a resulting vector, wherein at least one component of the resulting vector comprises the second bit value. Further, the bit error corrector is configured to correct a bit error within the coded bit sequence based on the determined error syndrome of the coded bit sequence.

By using an error syndrome determined according to a check matrix with properties described above, the error correction and error detection abilities of the proposed concept may be significantly better than with known concepts. For example, the proposed concept enables one to differentiate every 1-bit error from All-1-errors or All-0-errors. Thus, it may not be the case that a word, which is read out of a storage, in case of a correctable 1-bit error is mixed up with an All-0-error or an All-1-error.

BRIEF DESCRIPTION OF THE DRAWINGS

Embodiments according to the invention will be detailed subsequently referring to the appended drawings, in which:

FIG. 1 is a block diagram of an apparatus for correcting at least one bit error within a coded bit sequence;

FIG. 2 is a schematic illustration of a coding under consideration of address bits;

FIG. 15 is a block diagram of a decoder for decoding a faulty, coded bit sequence;

FIG. 16 is a flowchart of a method for correcting at least one bit error within a coded bit sequence;

DETAILED DESCRIPTION

Figure 3:
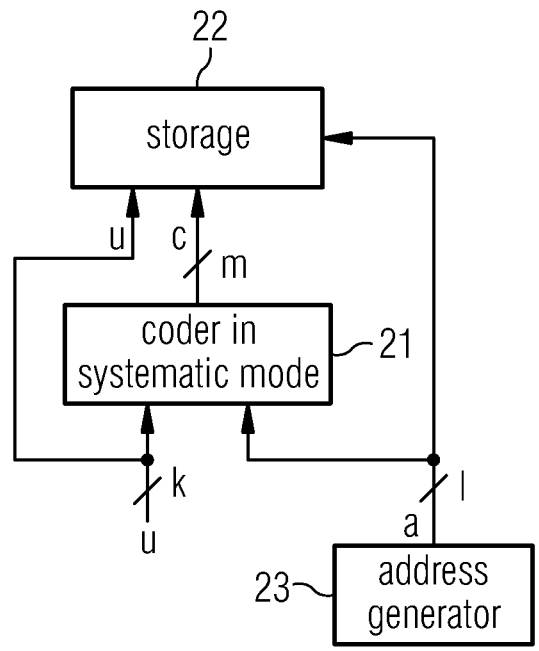
FIG. 3 is a schematic illustration of a coding for a separated H-matrix under consideration of address bits.

In the following, the same reference numerals are partly used for objects and functional units having the same or similar functional properties and the description thereof with regard to a figure shall apply also to other figures in order to reduce redundancy in the description of the embodiments.

A syndrome generator for forming an error syndrome of a linear code C of length n with an H-matrix $H=(h_1, \ldots, h_n)$ of n columns $h_1, \ldots, h_n$ of m components each such that the H-matrix is an (m, n)-matrix, wherein a codeword $v=v_1, \ldots, v_n$ of the code C comprises a first subword $x_1, \ldots, x_{k+m}$ of length k+m and a second subword $a_1, \ldots, a_l$ of length l with n=k+m+l. The code C is configured for correcting 1, ..., t-bit errors in bits of the first subword and to detect 1, ..., l bit errors in bits of the second subword so that the columns of the H-matrix H corresponding to the bits of the first subword are forming a first (m, k+m)-sub-matrix $H^x=(h_1^x, \ldots, h_{k+m}^x)$ and so that the columns of the H-matrix H corresponding to the bits of the second subword are forming a second sub-matrix $H^a=(h_1^a, \ldots, h_l^a)$. All linear combinations of all subsets of up to t columns of the first submatrix $H^x$, which do not result in the zero vector, are pairwise different. Moreover, all linear combinations of all subsets of the columns of the second submatrix $H^a$ are different from all linear combinations of all subsets of up to t columns of the first sub-matrix $H^x$, which do not result in the zero vector, wherein $t \geq 1$, $k > 0$, $k+m \geq 4$, and $l > t+1$.

Before the proposed concept is described in greater detail, some theoretical basics and basic terms on linear block codes, in particular Hamming codes, Hsiao codes and BCH-codes are briefly presented. For example, these are also described in "Fujiwara, E., Code Design for Dependable Systems, Wiley, 2006, p. 49-53, p. 98-101 and in Tzschach, H. and Haflinger, G., Codes für den störungsgesicherten Datentransfer, Oldenburg Verlag, 1993, p. 111-121".

A Hamming code is a linear block code with a code distance 3. If m is the number of check bits, its length is $n=2^m-1$. The number of data bits is $k=2^m-1-m$. As any linear code, the Hamming code may as usual be described by a generator matrix G, briefly G-matrix, and a check matrix H (also called parity-check matrix), briefly H matrix. The check matrix of a unshortened Hamming code is an (m,n) matrix whose columns are any possible different $2^m-1$ binary vectors unequal to 0. These columns are also described as m-digit binary numbers, and the following applies $$H=(h_1, \ldots, h_{2^m-1})=(1_{bin}, 2_{bin}, \ldots, [2^m-1]_{bin}),$$

wherein $i_{bin}$ designates the representation of i as an m-digit binary number.

A Hamming code may be shortened, as any other linear block code by eliminating a certain number of columns in the check matrix of the unshortened code. Apart from that, columns may also be exchanged in thus the check matrix may be transformed.

From the check matrix of a linear code a generator matrix may be determined, briefly called G matrix. The generator matrix is a (k,n) matrix. If k information bits $u_1, \ldots, u_k$ are present, the same are coded by the generator matrix into a code word v $$v=(v_1, \ldots, v_n)=u \cdot G=(u_1, \ldots, u_k) \cdot G$$

If a word $v'=v'_1, \ldots, v'_n$ is checked whether it is a code word, a syndrome S is formed, with $$S=H \cdot v'^T$$

with $S=S_1, \ldots, S_m$. If $S=0$, no error is detected. If $S=h_i$, a 1-bit error is present in the i-th bit of v'.

The error correction of the bits $v'_1, \ldots, v'_n$ may be done by correction circuits $K_1, \ldots, K_n$ which determine a correction value $\Delta v_i$ from the error syndrome S, which is XORed (linked by a logical XOR function) with $v'_i$. For $i=1, \ldots, n$ in case of a 1-bit error the correction circuit K, outputs a value 1, if $S=h_i$. If the error syndrome is equal to 0, the correction circuit $K_i$ outputs the value 0.

A Hsiao-code is a linear code with a code distance of 4. If the Hsiao-code has m check bits, its check matrix H consists of all m-digit binary vectors comprising an odd number of ones. The length of an (unshortened) Hsiao-code with m check bits is $n=2^{m-1}$, as there are $2^{m-1}$ different m-digit binary vectors having an odd number of ones. By deleting columns and by reordering columns of the unshortened Hsiao-code, a check matrix of a shortened Hsiao-code is obtained. Testing a word $v'=v'_1, \ldots, v'_n$ is again done by checking the error syndrome $$S=H \cdot v'^T$$

If $S=h_j$, i.e. equal to the j-th column of the check matrix, a 1-bit error is corrected in the j-th bit, by XOR-ing (applying a logical XOR-function) a correction value $\Delta v_j=1$ with $v'_j$. This correction value $\Delta v_j$ may be determined from the error syndrome S by a correction circuit $K_j$. The correction circuit $K_j$ then outputs a value 1, if $S=h_j$. If S is a binary vector with an even number of ones, an incorrectable error is indicated.

As the application of the proposed concept to BCH-codes (Bose-Chaudhuri-Hocquenghem-Codes) is also of special interest, some characteristics of BCH-codes are to be described. For example, they are also described in "Tzschach, H. and Haßlinger, G.: Codes für den störungssicheren Datentransfer, Oldenburg Verlag 1993, p. 111-121" and "Lin, S., Costello, D.: Error Control Coding, Prentice Hall, 1983, chapter 6".

A BCH-code is a special cyclic code and thus a linear code. A BCH-code may be described as a cyclic code by a special generator polynomial G(z) and as a linear code by a generator matrix G and by a check matrix H.

In case of a 2-bit error correcting BCH-code, the generator polynomial may in its simplest form be represented as $$G(z)=m_\alpha(z) \cdot m_{\alpha^3}(z) \tag{1}$$

Here, $m_\alpha(z)$ is a primitive polynomial also serving as a modular polynomial of the considered Galois field. $\alpha$ is a primitive element of the Galois field and root of the polynomial. The polynomial $m_{\alpha^3}(z)$ is the minimal polynomial of the root $\alpha^3$. The associated Galois field is designated by $GF(2^M)$. The length of the unshortened BCH code is then $2^M-1$. If the overall parity is considered, G(z) may be represented in the following form.

$$G(z)=m_\alpha(z) \cdot m_{\alpha^3}(z) \cdot (z+1) \tag{2}$$

Without integrating the overall parity, the check matrix may be represented in its separated form as $$H_{BCH}^{sep} = \begin{pmatrix} \alpha^{2^M-2} & \ldots & \alpha^i & \ldots & \alpha^1 & \ldots & \alpha^0 \\ \alpha^{3 \cdot (2^M-2)} & \ldots & \alpha^{3 \cdot i} & \ldots & \alpha^{3 \cdot 1} & \ldots & \alpha^0 \end{pmatrix} = \begin{pmatrix} H_1 \\ H_3 \end{pmatrix} \tag{3}$$

wherein $\alpha$ is a primitive element of the Galois field $GF(2^M)$ and the exponents of a are each to be interpreted modulo $2^M-1$. The parity may be included in the error detection by selecting the check matrix as $$H_{BCH}^{sep} = \begin{pmatrix} \alpha^{2^M-2} & \ldots & \alpha^i & \ldots & \alpha^1 & \ldots & \alpha^0 \\ \alpha^{3 \cdot (2^M-2)} & \ldots & \alpha^{3 \cdot i} & \ldots & \alpha^{3 \cdot 1} & \ldots & \alpha^0 \\ 1 & \ldots & 1 & \ldots & 1 & \ldots & 1 \end{pmatrix} = \begin{pmatrix} H_1 \\ H_3 \\ P \end{pmatrix} \tag{4}$$

wherein in the last row there are only ones.

A 1-bit error in the i-th bit position is described as [i], an L-bit error in the positions $i_1, i_2, \ldots, i_L$ as $[i_1, i_2, \ldots, i_L]$. To each error $[i_1, \ldots, i_L]$ an n-component error vector $e(i_1, \ldots, i_L)=(e_0, \ldots, e_{n-1})$ is associated, wherein $$e_i = \begin{cases} 1 & \text{for } i \in \{i_1, \ldots, i_L\} L \geq 0 \\ 0 & \text{else} \end{cases}$$

The component $e_j$ of the error vector $e[i_1, \ldots, i_L]$ is equal to 1 exactly when the corresponding j-th bit is faulty.

To an error $[i_l, \ldots, i_L]$ with the error vector $e=e[i_1, \ldots, i_L]$ an error syndrome $$S = H_{BCH}^{sep} \cdot e^T = \binom{H_1}{H_3} \cdot e^T = \binom{s_1}{s_3}$$

with $$s_1 = H_1 \cdot e^T \text{ and } s_3 = H_3 \cdot e^T$$

is associated.

By deleting columns and by reordering columns of the check matrix $H_{BCH}^{sep}$, a shortened BCH-code is obtained which is adapted to a required word width.

If the parity is not considered, the code distance is 5 and if the parity is considered, the code distance is 6. Then, 1-bit errors and 2-bit errors may be corrected using the syndrome. The syndromes of all 3-bit errors, parity included, are different from the syndromes of all 1-bit and 2-bit errors, but they may be the same among themselves.

The encoding of a BCH-code and a shortened BCH-code as a special linear code may be done with the help of a generator matrix and the decoding with the help of a check matrix. The connection between the generator polynomial and generator matrix and H-matrix is, for example, described in Lin, S. and Costello, D.: Error Control Coding, Prentice-Hall, 1983, p. 92-95".

In the following, the inventive concept is described by some general and some detailed embodiments.

FIG. 1 shows a block diagram of an apparatus 100 for correcting at least one bit error within a coded bit sequence 102 according to an embodiment of the invention. The apparatus 100 comprises an error syndrome generator 110 connected to a bit error corrector 120. The error syndrome generator 110 determines an error syndrome 112 of a coded bit sequence 102 derived by a multiplication of a check matrix H with the bit sequence 102. The check matrix H comprises a first sub-matrix $H^u$, a second sub-matrix $H^a$ and a third sub-matrix $H^c$. Each sub-matrix comprises a plurality of lines and each line comprises a plurality of binary components. At least a first predefined component or a second predefined component of each line of the first sub-matrix $H^u$ comprises a first bit value (1 or 0). In other words: If the first predefined component and the second predefined component of a line of the submatrix $H^u$ are equal to 0,0, then the first and the second component of any line of $H^u$ are unequal 1,1, and if the first predefined component and the second predefined component of the submatrix $H^u$ are equal to 1,1, then the first and the second component of any line of $H^u$ are unequal 0,0.

Further, the second sub-matrix $H^a$ comprises lines being linearly independent from each other (i.e. each line of the second sub-matrix is linearly independent from each other line of the second sub-matrix) and the first predefined component and the second predefined component of each line of the second sub-matrix $H^a$ comprises a same second bit value (0 or 1) which is different from the first bit value. The third sub-matrix $H^c$ comprises lines being linearly independent from each other and the first predefined component or the second predefined component of each line of the third sub-matrix $H^c$ comprises the first bit value (1 or 0).

An XOR-sum of the first predefined components of all lines of the first sub-matrix $H^u$ and the third sub-matrix $H^c$ is equal to the second bit value 0 and the XOR-sum of the second predefined components of all lines of the first sub-matrix $H^u$ and the third sub-matrix $H^c$ is equal to the second bit value 0. Additional results of a multiplication of the check matrix H and a test vector is equal to a result of a multiplication of the second sub-matrix $H^a$ and a resulting vector, wherein at least one component of the resulting vector comprises the second bit value (0 or 1). Further, the bit error corrector 120 corrects a bit error within the coded bit sequence 102 based on the determined error syndrome 112 of the coded bit sequence 102 to obtain a corrected bit sequence 122.

By using an error syndrome 112 derivable by a check matrix described above, an error correction circuit for 1-bit and 2-bit errors can be realized, which is able to detect also the errors All-0 and All-1, for example. In other words, the apparatus 100 enables to differentiate every 1-bit error from errors All-1 and All-0. Thus, for example, it may not be the case anymore that a word read out of a storage in case of a correctable 1-bit error is mixed up with an All-0 or All-1 error. The detection and/or correction of All-0 and All-1 errors is of high interest, because these failures are very common.

The first bit value and the second bit value may be logical 0 or logical 1, or a high level or a low level of a signal in the circuitry. Therefore, there are two possible cases. Either the first bit value is equal to 1 (logical 1) and the second bit value is equal to 0 (logical 0) or the first bit value is equal to 0 and the second bit value is equal to 1. Both cases represent equivalent implementations of the described concept.

Further, a line of a matrix may be a row or a column of a matrix. Since a matrix is easy to transpose, the inventive concept can be realized independent from whether a line of a matrix is a row or a column. Therefore, there are again two possible cases. Either each mentioned line of a matrix is a column of the respective matrix and the same components (e.g. first predefined components or second predefined components) of each line of a matrix represents a row of this matrix. Otherwise each line of a matrix is a row of the respective matrix and the same components of the lines of a matrix represent a column of this matrix.

Consequently, in connection with the described concept, of each line of the first sub-matrix, of the second sub-matrix and of the third sub-matrix is a column of the respective sub-matrix. The first predefined components of the lines of the first sub-matrix $H^u$, of the second sub-matrix $H^a$ and of the third sub-matrix $H^c$ represent a row of the check matrix H and the second predefined components of the lines of the first sub-matrix $H^u$, of the second sub-matrix $H^a$ and of the third sub-matrix $H^c$ represent another row of the check matrix H. Alternatively, each line of the first sub-matrix $H^u$, of the second sub-matrix $H^a$ and of the third sub-matrix $H^c$ is a row of the respective sub-matrix. The first predefined components of the lines of the first sub-matrix $H^u$, of the second sub-matrix $H^a$ and the third sub-matrix $H^c$ represent a column of the check matrix H and the second predefined components of the lines of the first sub-matrix $H^u$, of the second sub-matrix $H^a$ and of the third sub-matrix $H^c$ represent another column of the check matrix H.

Each line of a matrix comprises a plurality of binary components. In other words, each component is either equal to 1 or equal to 0. In this connection, a first predefined component and a second predefined component may be actually the first and the second component of a line, but they can also be arbitrary other components (e.g. the last and the next to last component or the third component and the fifth component or another predefined component combination). However, the first predefined component of the first sub-matrix, the second sub-matrix and the third sub-matrix are the same components within the lines of the respective matrix, which is accordingly valid for the second predefined components of the lines of the first sub-matrix, the second sub-matrix and the third sub-matrix. For example, if the first predefined component is the n-th component of a line of the first sub-matrix, then the first predefined component of a line of the second sub-matrix means also the n-th component of the line. Same is valid for the third sub-matrix as well as for the whole check matrix.

The check matrix may also be called parity-check matrix.

For example, the check matrix may be represented in a separated form. Further, the check matrix may be a check matrix of a shortened Hamming code, a shortened Hsiao-code or a shortened BCH-code, for example.

The error syndrome generator 110 may determine the error syndrome 112 by multiplying the check matrix with the coded bit sequence 102. Alternatively, the error syndrome generator 110 may comprise a storage containing a look-up table. This look-up table may contain information about error syndromes corresponding to different coded bit sequences 102. In other words, the look-up table may contain for each possible coded bit sequence the corresponding error syndrome derived by a multiplication of the check matrix with the coded bit sequence 102. In this example, the error syndrome generator 110 may easily determine the error syndrome 112 by taking the stored error syndrome associated with the coded bit sequence 102.

The error syndrome generator 110, the bit error corrector 120 and/or other optional elements described later on may be independent hardware units or part of a computer or microcontroller as well as a computer program or a software product for running on a computer or microcontroller.

The error syndrome generator 110, the bit error corrector 120 and/or other optional components described later on may be implemented independent from each other or at least partly together. For this, for example, the functionality of the error syndrome generator 110, the bit error corrector 120 and/or other optional components described below may be at least partly united to a combined hardware unit or software unit by a synthesis tool.

During a multiplication of the check matrix H with the coded bit sequence 102, a first group of bits of the coded bit sequence 102 is multiplied with the first sub matrix, a second group of bits of the coded bit sequence is multiplied with the second sub-matrix and a third group of bits of the coded bit sequence is multiplied with the third sub-matrix. In other words, the error syndrome of the coded bit sequence is derived based on a multiplication of the first sub-matrix with a first group of bits of the coded bit sequence, a multiplication of the second sub-matrix with the second group of bits of the coded bit sequence, and a multiplication of the third sub-matrix with a third group of bits of the coded bit sequence.

In some embodiments of the invention, the first group of bits may represent information bits, the second group of bits may represent address bits and the third group of bits may represent check bits. Therefore, the first group of bits may also be called information bits or payload data bits or useful data bits, the second group of bits may be called address bits and the third group of bits may be called check bits.

For example, the coded bit sequence or part of the coded bit sequence may be stored by an addressable storage, also called a storage unit, memory or memory unit (e.g. read only memory, random access memory or non volatile memory).

The first group of bits (data bits) may be independent from the second group of bits (address bits). Therefore, only the first group of bits and the third group of bits of the coded bit sequence may be stored at an address of the addressable storage indicated by the second group of bits. Alternatively, the coded bit sequence may also be coded by an inner code, so that at least one bit of the first group of bits depends on at least one bit of the second group of bits.

In the following, an embodiment of the invention is described in more detail. In this example, the lines of the matrices are columns, the first predefined components of the lines of the matrices represent the first row of the matrices, the second predefined components of the lines of the matrices represent the second rows of the matrices, the first bit value is equal to 1 and the second bit value is equal to 0. If the description of the detailed embodiment several additional and/or optional features can be implemented all together or one or some of them may be implemented independent from the other features described.

It is illustrated in FIG. 2 how the addresses $a=a_1, \ldots a_l$ (e.g. provided by an address generator 13) are to be considered in the encoded storing of the payload data bits $u=u_1, \ldots, u_k$. At the encoder (or coder) 11 k bits wide payload data $u=u_1, \ldots, u_k$ and the l bit wide address $a=a_1, \ldots a_l$ at which the storage 12 is to be written, are applied, so that the address a is also applied to the address input of the storage 12. The coder 11 forms the k+l+m bit wide code word v (coded bit sequence) from the payload data u (information bits) and the address a (address bits), $$v=(u,a) \cdot G$$

In the storage 12 under the address a the code word v is stored, whose bits depend both on the payload data (information bits) and also on the address (address bits). If the generator matrix is used in its systematic form $$G=(I_{k+l}, P_{k+l,m})$$

The code word v has the form v=u, a, c and the check bits c added to the payload data bits and the address bits are designated by $$c=(u,a) \cdot P,$$

while the payload data bits u and the address bits a, are not modified in this example. $I_{k+l}$ is the (k+l) dimensional identity matrix and P is a (k+l,m) matrix determining the test equations of the code.

The encoding including the address bits for a generator matrix in the systematic form is illustrated in FIG. 3. In the storage 22 (addressable storage) only the data bits u and the check bits c are stored, while the address bits a do not have to be stored. The check bits c here both depend on the data bits u and also on the address bits a. The address bits generated by the address generator 23 are applied to the address input of the storage 22 and to the corresponding first inputs of the encoder (or coder) in a systematic form 21, while at the second k bit wide input of the coder the payload data bit u are applied, which are simultaneously also applied to the first k bits wide data input of the storage 22. The coder generates, at its m-bit wide output, the check bits c, which are applied to the second m bit wide data input of the storage 22.

Figure 4:
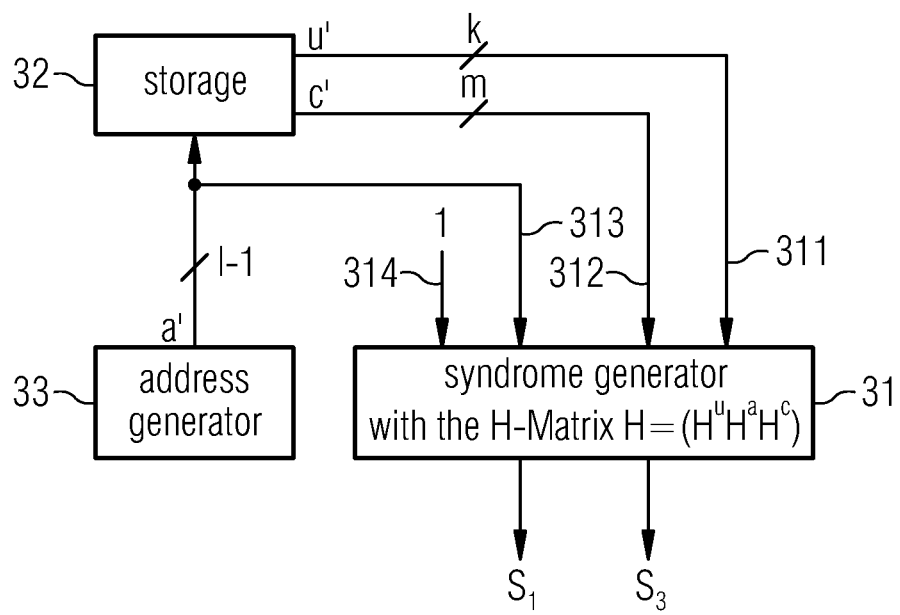
FIG. 4 is a schematic illustration of an integration of a syndrome generator.

FIG. 4 shows a circuitry for generating a syndrome $S=(s_1, s_3)$ for a 2-bit error correcting shortened BCH-code according to an embodiment. The bits u' and c' stored in the storage 32 (addressable storage) are output from the storage 32 under the address a' provided by the address generator 33. The address generated by the address generator here has the word width l−1. The data, the address and the check bits are designated in FIG. 4 by u', a', c' to indicate that the corresponding bits may be erroneously changed. The data bits u' are supplied into a first input 311 of the word width k, the check bits c' are supplied into a second input 312 and the address bits a' are supplied into a third input 313 of the word width l−1 of the syndrome generator 31. At a fourth l−1 bit wide input 314 the constant value 1 is applied. The syndrome generator 31 may be a combinatorial circuit determined by the check matrix. It serves for forming the syndrome $S=(s_1, s_3)$ of the considered BCH code determined as a column vector $S^T$ with respect to $$S^T=(s_1,s_3)^T=(S_1,S_2,\ldots,S_m)^T=H\cdot(u'_1,\ldots,u'_k a'_1,\ldots,a'_l,c'_1,\ldots,c'_m)^T.$$

The address bits $a_1', \ldots, a'_{l-1}$ provided by the address generator and the constant value 1 form, as described in detail later, the address bits $a'_1, \ldots, a'_l$. The check matrix H of the shortened BCH-code consists of a first (m,k) sub-matrix $H^u$, a second (m,l) sub-matrix $H^a$ and a third (m,m) sub-matrix $H^c$, wherein the first k columns of the check matrix H form the sub-matrix $H^u$, the subsequent l columns form the sub-matrix $H^a$ and the last m columns the sub-matrix $H^c$. A sub-matrix may also be called a partial matrix. The following applies here:

$$H^u = \begin{pmatrix} h_{1,1}^u & \cdots & h_{1,k}^u \\ \vdots & \vdots & \vdots \\ h_{m,1}^u & \cdots & h_{m,k}^u \end{pmatrix} = (h_1^u, \ldots, h_k^u),$$

$$H^a = \begin{pmatrix} h_{1,1}^a & \cdots & h_{1,l}^a \\ \vdots & \vdots & \vdots \\ h_{m,1}^a & \cdots & h_{m,l}^a \end{pmatrix} = (h_1^a, \ldots, h_l^a),$$

$$H^c = \begin{pmatrix} h_{1,1}^c & \cdots & h_{1,m}^c \\ \cdots & \cdots & \cdots \\ h_{m,1}^c & \cdots & h_{m,m}^c \end{pmatrix} = (h_1^c, \ldots, h_m^c)$$

For the components $S_1, S_2, \ldots, S_m$ of the syndrome $S=(S_1, \ldots, S_m)=(s_1, s_3)$ applies $$(s_1,s_3)^T=(S_1,\ldots,S_m)^T=(H^u,H^a,H^c)\cdot(u'_1,\ldots,u'_k,a'_1,\ldots,a'_l,c'_1,\ldots,c'_m)^T,$$

and the syndrome generator 31 realizes at its m outputs for $i=1, \ldots, m$ the Boolean functions $$S_i = h_{i,1}^u u'_1 \oplus \ldots \oplus h_{i,k}^u u'_k \oplus h_{i,1}^a a'_1 \oplus \ldots \oplus h_{i,l}^a a'_l \oplus h_{i,1}^c c'_1 \oplus \ldots \oplus h_{i,m}^c c'_m$$

which are uniquely determined by the elements $h_{i,j}^u$, $h_{i,j}^a$, $h_{i,j}^c$ of the sub-matrices $H^u$, $H^a$, $H^c$. A concrete implementation, e.g. by XOR-gates, is easy realizable, so that the proposed syndrome generator is easily described by the concrete form of the matrices $H^u$, $H^a$, $H^c$.

The matrices $H^u$, $H^a$, $H^c$ are determined by deleting certain columns and by reordering columns from the columns of the $(m, 2^M-1)$ check matrix $H_{unverk}^{BCH}$ of an unshortened 2-bit error correcting BCH-code of length $2^M-1$ such that $m+l+k<2^M-1$. Here, the check matrix of the unshortened code is selected in its separated form, for example. The matrix $H_{unverk}^{BCH}$ then has the following form $$H_{unverk}^{BCH} = \begin{pmatrix} H_1 \\ H_3 \end{pmatrix}.$$

As the i-th column of the matrix $H_1$ is determined by $\alpha^i$, $i=0, \ldots, 2^M-2$ and $\alpha$ is a primitive element of the Galois field $GF(2^M)$, all $2^M-1$ M-digit binary vectors, except for 0, occur as columns of $H_1$. Now a j-th component and a k-th component of the first M components of the check matrix are selected, wherein j≠k. The j-th component is designated as the first (selected) component (first predefined component) and the k-th component as the second (selected) component (second predefined component).

As $\alpha$ is a primitive element of the Galois field $GF(2^M)$, and all $2^M-1$ possible m-digit binary vectors occur as columns of the check matrix $H_1$, there are for each of the values 01, 10 and 11 $2^{M-2}$ columns of the check matrix $H_1$ taking on the value 01, 10 and 11 in the two selected components (predefined components). Apart from that, there are $2^{M-2}-1$ columns of the matrix $H_1$ taking on the value 00 in the two selected components. All columns of the check matrix $H_{unverk}^{BCH}$ are classified into four disjoint sets $Sp^{00}$, $Sp^{10}$, $Sp^{01}$ and $Sp^{11}$, wherein $Sp^{00}$ contain all $2^{M-2}-1$ columns with the first two components 00, $Sp^{10}$ all $2^{M-2}$ with the first two components 10, $Sp^{01}$ all $2^{M-2}$ columns with the first two components 01 and $Sp^{11}$ all $2^{M-2}$ columns with the first two components 11.

According to the described concept, l linearly independent columns $h_1^a, \ldots, h_l^a$ form the matrix $H^a$ $$H^a = (h_1^a, \ldots, h_l^a),$$

wherein $h_j^a \in Sp^{00}$ applies.

As the first two components of $Sp^{00}$ are equal to 00 (first predefined component and second predefined component of each line of the first sub-matrix comprises the same second bit value), there are m−2 linearly independent columns, and $l \leq m-2$ applies. For $l=m-2$, the (l, l) matrix $\hat{H}^a$, resulting from $H^a$, by deleting the first two lines (which say 0, …0) may be invertible.

In other words, a number of bits of the second group of bits of the coded bit sequence may be smaller than or equal to a number of bits of the third group of bits of the coded bit sequence minus 2.

The columns of the matrix $H^c$, $$H^c=(h_1^c,\ldots,h_m^c),$$

are selected so that they are linearly independent and that their first two components (first predefined component and second predefined component) are unequal 00 (first predefined component or second predefined component of each line of the third sub-matrix comprises the first bit value), so that for $i=1, \ldots, m$ the following applies $$h_i^c \in \{Sp^{10} \cup Sp^{01} \cup Sp^{11}\}$$

The columns of the matrix $H^c$ form the set $Sp^{H^c} = \{h_1^c, \ldots, h_m^c\}$.

The columns of the matrix $H^u$, $$H^u=(h_1^u,\ldots,h_k^u),$$

are selected so that the first two components are unequal 00 (first predefined component or second predefined component of each line of the second sub-matrix comprises the first bit value), so that for $i=1, \ldots, k$ the following applies $$h_i^u \in \{Sp^{10} \cup Sp^{01} \cup Sp^{11}\} \setminus Sp^{H^c}$$

In other words, the lines (in this example, the columns) of the first sub-matrix are all different from the lines of the third sub-matrix.

In addition to that, the columns of the matrices $H^u$, $H^a$, $H^c$ are determined so that the following applies:
1. The XOR-sum at the first components of all columns is equal to 0 (second bit value).
2. The XOR-sum at the second components of all columns is equal to 0.

3. The l-dimensional binary vector $a''_1, \ldots, a''_l$ (resulting vector), determined by $$s_{All1} = (H^u, H^c) \cdot \underbrace{(1, \ldots, 1)^T}_{k+m} = H^a \cdot (a''_1, \ldots, a''_l)^T \quad 5$$

has at least one component $a''_i = 0$, $i \in \{1, \ldots, l\}$ (at least one component of the resulting vector comprises the second bit value). The vector $(1, \ldots, 1)^T$ to be multiplied with the sub-matrix $H^u$ and the sub-matrix $H^c$ may also be called a test vector. Alternatively, the test vector is multiplied with the whole check matrix. For this, the test vector comprises zeros for bits multiplied with components of lines of the second sub-matrix $H^a$.

In other words, each component of the test vector being multiplied with the component of a line of the first sub-matrix and of the third sub-matrix comprises the first bit value and each component of the test vector being multiplied with a component of a line of the second sub-matrix comprises the second bit value.

In the following it is to be described how the matrices $H^u$, $H^a$, $H^c$ of the inventive syndrome generator may be determined practically.

From the sets $Sp^{10}$, $Sp^{01}$ and $Sp^{11}$, the sets $Spe^{10}$, $Spe^{01}$, $Spe^{11}$ are formed by deleting two random columns each and summarizing the deleted column into the sets $Sp2^{10}$, $Sp2^{01}$ and $Sp2^{11}$. Thus, the set $Sp2^{01}$ contains the two columns which were deleted from the set $Sp^{01}$ in order to determine the set $Spe^{01}$.

From the set $\{Spe^{10} \cup Spe^{01} \cup Spe^{11}\}$ m linearly independent columns are determined, designated by $h_1^c, \ldots h_m^c$ and which form the matrix (third sub-matrix)

$$H^c = (h_1^c, \ldots, h_m^c).$$

As a set, these columns are combined into the set $Sp^{Hc} = \{h_1^c, \ldots, h_m^c\}$.

From the set $Sp^{00}$ l columns are determined which are linearly independent. These columns are designated by $h_1^a, \ldots, h_l^a$ and they form the matrix (second sub-matrix)

$$H^a = (h_1^a, \ldots, h_l^a).$$

The matrix $H^u$ (first sub-matrix) consists of k columns $h_1^u, \ldots, h_k^u$, wherein $$h_i^u \in \{Spe^{10} \cup Spe^{01} \cup Spe^{11}\} \setminus Sp^{Hc}$$

apply and wherein at least one column from $Spe^{10}$, at least one column from $Spe^{01}$ and at least one column from $Spe^{11}$ is contained in $\{h_1^u, \ldots, h_k^u\}$.

Thus, $H^u$ contains at least one column whose first two components are equal to 10, at least one column whose first two components are equal to 01 and at least one column whose first two components are equal to 11.

More general, the first sub-matrix comprises at least one line with the first predefined component being equal to the first bit value and the second predefined component being equal to the second bit value, at least one line with the first predefined component being equal to the second bit value and the second predefined component being equal to the first bit value and at least one line with the first predefined component and the second predefined component being equal to the first bit value.

Now, the XOR-sum of the first and the second components of the columns of $H^u$ and $H^c$ are determined. Depending on the value of this XOR-sum, the following four cases are considered:

1. If the XOR-sum is (1,1), one column of $H^u$ whose first two components are equal to (0,1), are replaced by a column of $Sp2^{10}$. Then, the XOR-sum of the first two components of the columns of $H^u$, $H^c$, after this replacement, is equal to (0,0).
2. If the XOR-sum is equal (0,1), a column of $H^u$ is replaced whose first two components are equal to (1,0), by a column from $Sp2^{11}$. Then, the XOR-sum of the first two components of the columns of $H^u$, $H^c$, after this replacement, are equal to (0,0).
3. If the XOR-sum is equal to (1,0), a column of $H^u$ whose first two components are equal to (0,1) is replaced by a column of $Sp2^{11}$. Then the XOR-sum of the first two components of the columns of $H^u$, $H^c$ after this replacement are equal to (0,0).
4. If the XOR-sum is equal to (0,0), then in this step no modification is executed.

From the matrices $H^u$ and $H^c$ obtained so far, now the vector $a''_1, \ldots, a''_l$ is determined by solving the linear equation system $$(H^u, H^c) \cdot \underbrace{(1, \ldots, 1)^T}_{k+m} = H^a \cdot (a''_1, \ldots, a''_l)^T$$

$$(H^u, H^c) \cdot \underbrace{(1, \ldots, 1)^T}_{k+m} = H^a \cdot (a'_1, \ldots, a'_l).$$

If i, $1 \leq i \leq l$ so that $a''_i = 0$, then by the check matrix $H = (H^u \, H^a \, H^c)$ determined so far, the syndrome generator is determined. At the input 314 of FIG. 4 then the value 1 for the i-th address bits $a''_i = 1$ is input as being constant. If there is no i, $1 \leq i \leq l$, so that $a''_i = 0$, the following applies $$a'_1, \ldots, a'_l = \underbrace{1, \ldots, 1}_{l}.$$

Then, in $H^u$ a column $h_j^u$ with the value of the first two components (0,1) is for example replaced by a column $h \in Sp2^{01}$ which was not part of $H^u$ before. The matrix $H^u$ modified this way is designated by $H^{u'}$. The solution of the linear equation system $$(H^{u'}, H^c) \cdot \underbrace{(1, \ldots, 1)^T}_{k+m} = H^a \cdot (a''_1, \ldots, a''_l)^T \quad (9)$$

then inevitably leads to a solution with $$a'_1, \ldots, a'_l \neq \underbrace{1, \ldots, 1}_{l}, \text{ as}$$

$$(H^{u'}, H^c) \cdot \underbrace{(1, \ldots, 1)^T}_{k+m} = (H^u, H^c) \cdot \underbrace{(1, \ldots, 1)^T}_{k+m} + h_j^u + h$$

and $h_j^u + h \neq 0$.

If $a''_1, \ldots, a''_l$ is the solution of equation (9), then after this modification of $H^u$ into $H^{u'}$ $a''_i = 0$. As illustrated in FIG. 4, then for the i-th bit of the address the constant value 1 is input as the input 314. In other words, a bit of the second group of bits associated to the at least one component of the resulting vector comprising the second bit value comprises the first bit value.

The just determined H-matrix may then determine, for example, the XOR trees implementing the syndrome generator. In this example, the syndrome generator has, for example, the following advantageous characteristics:

1. For any address $a_1, \ldots, a_{i-1}a_i=1, a_{i+1} \ldots, a_l$ and for $u=0, \ldots, 0$ and $c=0, \ldots, 0$ or $u=1, \ldots, 1$ and $c=1, \ldots, 1$ there is no code vector of the shortened BCH-code. The errors "All-0" and "All-1" may thus never be code vectors of the shortened BCH-code, whereby they be detected relatively easily.

For example, this characteristic is achieved in particular by the value of a certain address bit constantly being equal to 1, that the columns of the matrix $H^a$ being linearly independent, that the XOR-sum of the first and the second components of the columns of the matrices $H^u$ and $H^c$ being equal to 0 and that the first and the second components of all columns of the matrix $H^a$ being equal to 0.

2. A word comprising exactly a single 1 in the data bits u or the check bits c may never be a code word.

As the first two components of the columns of $H^u$ and the columns of $H^c \neq 00$ and the first two components of $H^a$ being (0,0), the first two components $S_1$, $S_2$ of the syndrome S for a 1-bit error in the data bits or check bits are always unequal to 00, and no code word may be present. Thus, it is not possible either for a code word being corrupted by a 1-bit error in "All-0".

3. A word comprising exactly a single 0 in the data bits u or the check bits c may never be a code word.

As the first two components of the columns of $H^u$ and the columns $H^0 \neq (0,0)$, and the XOR-sum of these components of all columns of the matrices $H^u$ and $H^c$ equal (0,0), and the first two components of $H^a$ are equal to (0,0), the first two components $S_1$, $S_2$ of the syndrome S are always unequal 00 and no code word may exist. Thus, it is not possible either for a code word to be corrupted by a 1-bit error in "All-1".

The concept described for determining a syndrome generator by determining its check matrix may be generalized relatively easily, if further conditions regarding columns of the check matrix are to be fulfilled. As an example of such a condition the case is regarded that in each column of the check matrix the number of ones in a subset of components (predefined plurality of components) of the column is odd. In other words, an XOR-sum of a predefined plurality of components of each line of the check matrix H is equal to a same bit value. As an example for such a subset, here the lower N components of each column are regarded belonging to the matrix $H_3$. The number of ones in the lower N components thus is to be odd. If this condition is fulfilled, the parity P may be determined as an XOR-sum via the components of the sub-syndrome $s_3$, which may be done by an XOR tree with only N inputs. For the determination of the overall parity from the data bits, the address bits and the check bits, however, an XOR tree with n inputs is required, wherein n is the length of the code.

For example, for a parity bit a row may be added to the check matrix comprising only ones. In other words, a predefined same component of all lines of the check matrix may comprise a same bit value.

From the columns of the check matrix $H_{unverk}^{BCH}$ with $2^M-1$ columns, the columns of this matrix are determined fulfilling the required condition. It is here the columns comprising an odd number of ones in the N bottom components. Depending on whether the first two components of these columns are 00, 10, 01 or 11, these columns are associated to the set $Sp^{*00}$, $Sp^{*10}$, $Sp^{*01}$ and $Sp^{*11}$.

Based on these sets $Sp^{*00}$, $Sp^{*10}$, $Sp^{*01}$ and $Sp^{*11}$ just as described for the set $Sp^{00}$, $Sp^{10}$, $Sp^{01}$ and $Sp^{11}$, a check matrix $H^*=(H^{*u}, H^{*a}, H^{*c})$ and thus a syndrome generator may be determined, so that the columns of its check matrix $H^*$ comprise an additional characteristic. Here it is the characteristic that the bottom N components comprise an odd number of ones.

A concrete example is described for N=7 and the Galois field GF($2^7$). As a modular polynomial, the primitive polynomial $m_\alpha = z^7 + z^3 + 1$ is used, for example, indicated in "Peterson, W., and Weldon, E.: Error Correcting Codes, 2. Auflage, MIT Press, 1972, Annex C, S. 476". The length of the unshortened code is $n=2^7-1=127$. The H-matrix of the unshortened BCH-code for the 2-bit error correction then is $$H_{BCH}^{sep} = \begin{pmatrix} \alpha^{126} & \ldots & \alpha^2 & \alpha^1 & \alpha^0 \\ \alpha^{a \cdot 126} & \ldots & \alpha^{3 \cdot 2} & \alpha^{3 \cdot 1} & \alpha^0 \end{pmatrix}, \quad (10)$$

wherein the exponents j of a' are to be regarded as modulo 127, so that for example the exponent 3·126 means (3·126) modulo 127=124. The values $\alpha^i$ and $\alpha^{3i}$ in the column $\alpha^i, \alpha^{3i}$ are initially illustrated in the vector illustration as 2 seven digit binary vectors, combined into a 14-digit binary vector and regarded as a 14-digit binary number. This 14 digit binary number may be represented as a decimal number.

The following applies $(\alpha^0, \alpha^0) = (\underline{00}000010000001)_{bin} = 129$ $(\alpha^1, \alpha^3) = (\underline{00}000100001000)_{bin} = 264$ $(\alpha^2, \alpha^6) = (\underline{00}001001000000)_{bin} = 576$ Wherein the 129 is the decimal value for the first column, 264 is the decimal value for the second column and 576 is the decimal value for the third column.

Here, the left most bit is the first bit and the right most bit is the fourteenth bit. The first bit and the second bit are underlined. These are the bits whose XOR-sum across all columns of the check matrix of the shortened BCH-code are 0,0. The columns of the unshortened H-matrix are then given by the following decimal numbers.

129, 264, 576, 1060, 2098, 4107, 8280, 1261, 2398, 4701, 9285, 3212, 6496, 12854, 8363, 1482, 2932, 5663, 11377, 7351, 14627, 13962, 10704, 6061, 12154, 6895, 13646, 11988, 6541, 13160, 8950, 399, 888, 1663, 3143, 6172, 12393, 9470, 3535, 7004, 13901, 10444, 5572, 11012, 4768, 9490, 3737, 7489, 14892, 12530, 9647, 4074, 8038, 15878, 14512, 13723, 12241, 7077, 14138, 10955, 4604, 9055, 725, 1285, 2600, 5202, 10301, 5363, 10535, 5802, 11586, 7860, 15675, 16067, 14780, 14331, 11239, 5006, 10096, 2751, 5475, 10798, 4322, 8486, 1698, 3330, 6672, 13321, 11464, 7652, 15126, 12985, 8659, 1973, 3891, 7683, 15384, 15561, 15852, 16342, 15261, 13281, 9150, 1003, 1902, 3654, 7188, 14377, 13530, 11773, 8151, 16149, 15009, 12698, 10201, 3045, 5918, 11897, 6391, 12551, 9912, 2523, 4981, 9751, 2225, 4371, 8721

Based on these 127 columns, now the sets $Sp^{00}$, $Sp^{10}$, $Sp^{01}$ and $Sp^{11}$ are formed, whose first two components in binary representation are 00, 10, 01 and 11. Thus, for example the columns 129, 264 and 576 are part of set $Sp^{00}$, as the first two components of these numbers are equal to 00 in a binary representation.

Based on the sets $Sp^{00}$, $Sp^{10}$, $Sp^{01}$ and $Sp^{11}$, the sets $Sp*^{00}$, $Sp*^{10}$, $Sp*^{01}$ and $Sp*^{11}$ are determined by the additional condition that the columns of the check matrix in their binary representation in the bits 8-14 comprise an odd number of ones. Thus, the columns 1, 2 and 3 (129, 264, 567) belong to $Sp*^{00}$, as these columns belong to $Sp^{00}$ and in addition to that comprise, in the bits 8-14 one 1 each, i.e. an odd number of ones.

The following applies:

$Sp*^{00}$={129, 264, 576, 2098, 1261, 2398, 1482, 1663, 3535, 3737, 3330, 1003, 1902, 3654, 2523, 2225}

$Sp*^{10}$={8280, 9285, 12154, 11988, 8950, 10444, 11012, 9647, 12241, 10301, 11239, 100%, 8486, 9150,11897,9912}

$Sp*^{01}$={4107, 4701, 5663, 7351, 6541, 6172, 4768, 7077, 4604, 5202, 5363, 5802, 7860, 5006, 4322, 6672, 7652, 8151, 4981, 4371}

$Sp*^{11}$={14627, 13160, 14892, 15675, 16067, 15126, 15561, 13281, 14377, 16149, 12698, 12551}.

From the set $Sp*^{10}$, the set $Spe^{10}$ is formed, by removing the two columns 9647, 12241 and combining these two columns into the set $Sp2^{10}$={9647, 12241}. The following applies.

$Spe^{10}$={8280, 9285, 12154, 11988, 8950, 10444, 11012, 10301, 11239, 10096, 8486, 9150, 11897, 9912}.

From the set $Sp*^{01}$, the set $Spe^{01}$ is formed, by removing the two columns 7077, 4604 and combining these two columns into the set $Sp2^{01}$={7077, 4604}. The following applies:

$Spe^{01}$={4107, 4701, 5663, 7351, 6541, 6172, 4768, 5202, 5363, 5802, 7860, 5006, 4322, 6672, 7652, 8151, 4981, 4371}.

From the set $Sp*^{11}$, the set $Spe^{11}$ is formed, by removing the two columns 16149, 13281 and combining these two columns into the set $Sp2^{11}$={16149, 13281}. The following applies:

$Spe^{11}$={14627, 13160, 14892, 15675, 16067, 15126, 15561, 14377, 12698, 12551}.

From the set $Sp*^{00}$, m−2=14−2=12 linearly independent vectors are selected forming the matrix $H^a$. The following applies:

$H^a$=(129, 264, 576, 2098, 1261, 2398, 1482, 3737, 3330, 1003, 3654, 2225).

From the set $Spe^{10} \cup Spe^{01} \cup Spe^{11}$ 14 linearly independent columns are determined forming the matrix $H^c$. The following applies:

$H^c$=(8280, 4107, 6672, 9285, 4768, 11012, 6172, 5202, 8486, 4371, 4322, 10444, 12551, 14377).

These columns form the set $Sp^{Hc}$, wherein $Sp^{Hc}$={8280, 4107, 6672, 9285, 4768, 11012, 6172, 5202, 8486, 4371, 4322, 10444, 12551, 14377}.

From the set $\{Spe^{10} \cup Spe^{01} \cup Spe^{11}\} \setminus sp^{Hc}$ 16 vectors are selected forming the columns of $H^u$. These columns are determined so that they contain at least one vector from $Spe^{10}$, one vector from $Spe^{01}$ and one vector from $Spe^{11}$. Temporarily, the matrix $H^u$ results with $H^u$=(4701, 14627, 6541, 13160, 14892, 10301, 5802, 5006, 10096, 12698, 9912, 5663, 11988, 8950, 15675, 7351).

For the XOR-sum of the first two components of the columns of $H^u$ and $H^c$ the value 10 results. To obtain a value 00 for this sum, a column with the first two components 01 is replaced by a column with the first two components 11 of $Spe^{11}$, so that the XOR-sum now is 00. Concretely, column 7351 is replaced by column 16149 of $Spe^{11}$. The matrix $H^u$ is now:

$H^u$=(4701, 14627, 6541, 13160, 14892, 10301, 5802, 5006, 10096, 12698, 9912, 5663, 11988, 8950, 15675, 16149)

From the thus determined matrices $H^u$, $H^a$, $H^c$ now the vector $a''_1, \ldots, a''_l$ is determined for which $$s_{A111} = (H^u, H^c) \cdot \underbrace{(1, \ldots, 1)}_{16+14}{}^T = H^a \cdot (a''_1, \ldots, a''_{12})^T$$

applies.

Due to $s_{A111}$=00010000110110

$a''_1, \ldots, a''_{12}$ is determined as the solution of the linear equation system $$s_{A111} = H^a \cdot (a''_1, \ldots, a''_{12})^T$$

for $a'_1, \ldots, a'_{12}$=101000000011. As e.g. $a'_2$=0, the syndrome generator is determined by the just determined check matrix simply by an implementation of the corresponding linear equations with a synthesis tool, for example.

The parity signal results in the presented embodiment as an XOR operation of the components of the sub-syndrome $s_3$, i.e. by an XOR operation of the components 8 to 14 of the syndrome S. If the condition that the components 8 to 14 of the check matrix contain an odd number of ones is not required, the check matrix may also be supplemented by a line consisting of all ones. In a 2-bit error correcting BCH-code, then an odd number of check bits is obtained.

Figure 5:
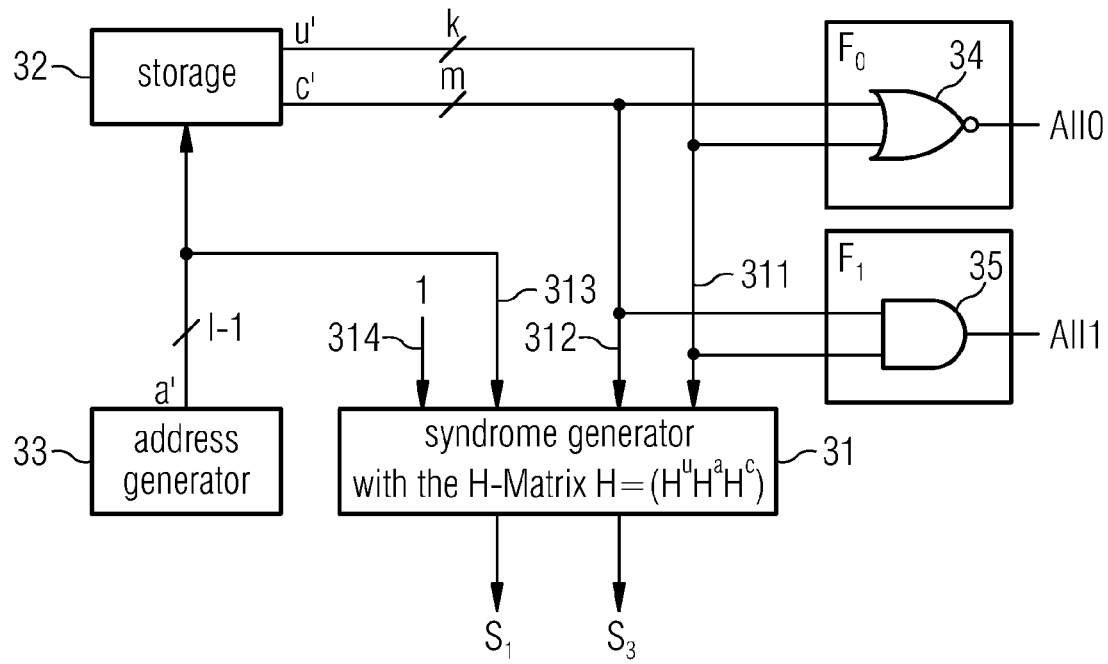
FIG. 5 is a schematic illustration of an integration of a syndrome generator including an all 0 and all 1 detection.

It is illustrated in FIG. 5, how the concept of the memory cells (of the storage) regarding the error "All-1" and "All-0" may be monitored. The partial circuits and connections designated by the same numbers in FIG. 5 and FIG. 4 have the same meaning as in FIG. 4. In addition to FIG. 4, the k bits wide output carrying the signal u' (first group of bits, information bits) and the m bit wide output carrying the signal c' (third group of bits, check bits) of the storage 32 are supplied both into the k+m bit wide inputs of an NOR-gate 34 and also into the k+m bit wide input of the AND gate 35. The NOR-gate 34 outputs the value All-0=1, if the memory outputs the value "All-0" under any address, while the AND-gate outputs the value All-1=1, if the memory outputs the value All-1 under any address. As neither All-1 nor All-0 is a code word for any address, an All-0 error is detected at the outputs of the NOR-gate 34 by 100%, while an All-1 error is detected at the output of the AND-gate 35 at 100%.

More general, the NOR-gate 34 and the AND-gate 35 may also be called same-bit-value-detector. A same-bit-value-detector may provide a signal indicating whether or not all bits of the first group of bits and all bits of the third group of bits of the coded bit sequence comprise a same bit value (All-0 or All-1).

Figure 6:
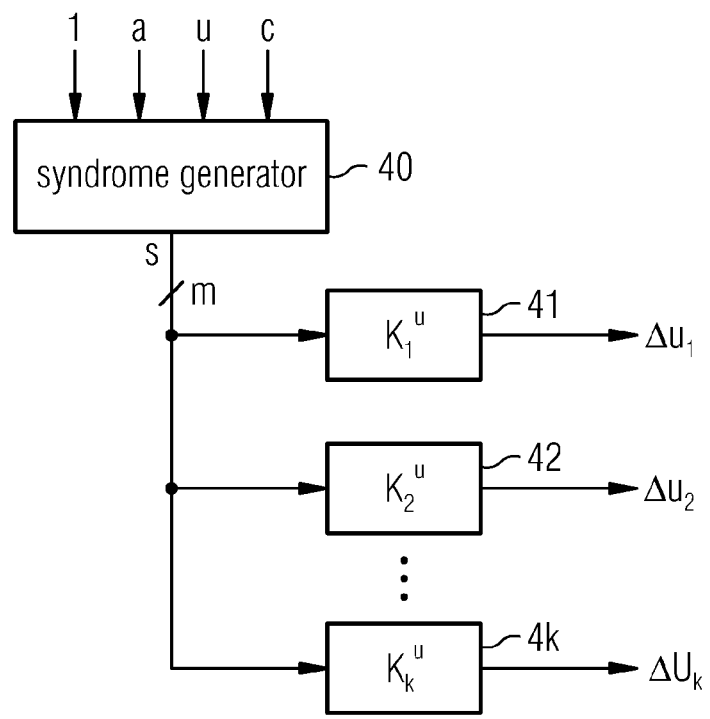
FIG. 6 is a schematic illustration of a derivation of a correction vector for data bits.

FIG. 6 shows an inventive syndrome generator 40 which outputs at its m bit wide output the value of the error syndrome S, the output being connected with the respective inputs of the circuits $K_1^u, K_2^u, \ldots, K_k^u$ 41, 42, . . . 4k (which may be part of the bit error corrector) for determining 1-bit wide correction values $\Delta u_1, \Delta u_2, \ldots, \Delta u_k$, which are outputted by these circuits at their respective outputs and XOR-ed with the data bits $u'_1, u'_2, \ldots u'_k$ to be corrected. Functionally, for $i=1, \ldots, k$ for the correction values is $\Delta u_i$:

$$\Delta u_i = K_i^u(S) = \begin{cases} 1 & \text{for} \quad S = h_i^u \\ 1 & \text{for} \quad S = h_i^u + h \\ 0 & \text{else} \end{cases}$$

Here, $h_i^u$ is the i-th column of the matrix $H^u$ and h a column of the matrix $H^u$ or a column of the matrix $H^c$, wherein $h \neq h_i^u$.

Correction circuits are for example also described in "Okamo, H. and Imai, H.: A Construction Method for Decoders of BCH-Codes for Bose Chaudhuri-Hocquenghem and Reed Salomon Codes, IEEE Trans. Comp. C 36, No 10, pp. 1165-1171, 1985".

Figure 7:
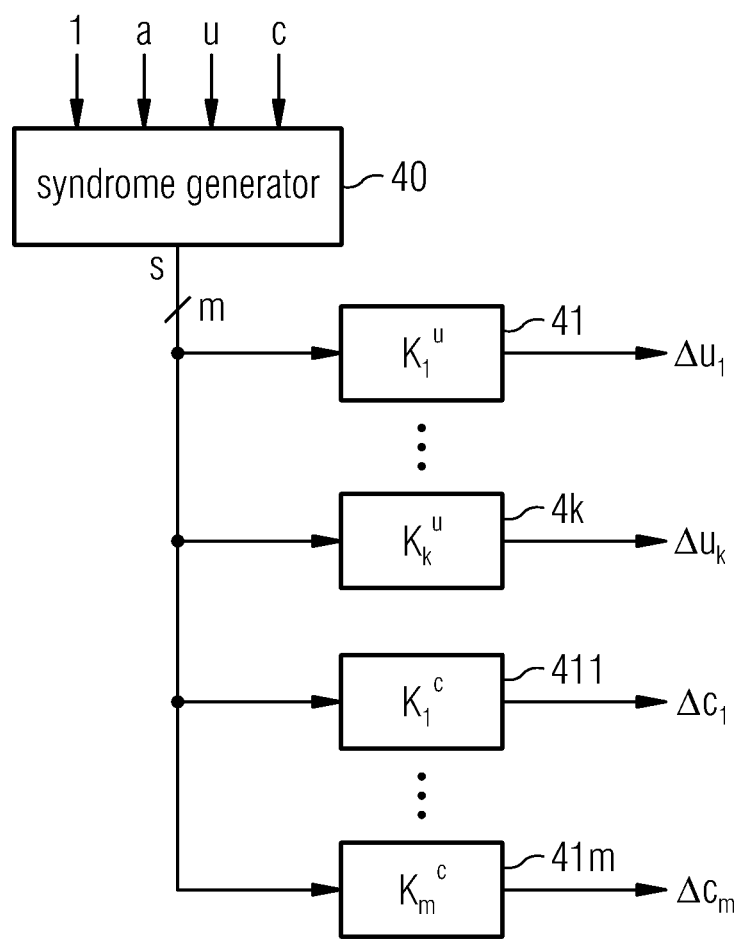
FIG. 7 is a schematic illustration of a derivation of a correction vector for data and check bits.

FIG. 7 shows an inventive syndrome generator 40, comprising, additionally to FIG. 6, further circuits $K_1^c$ 411, $K_2^c$ 412, ..., $K_m^c$ 41m (which may also be part of the bit error corrector) for determining correction values $\Delta c_1, \Delta c_2, \ldots, \Delta c_m$, which are outputted by these circuits at their outputs and that are XORed with the check bits component-by-component for correcting the check bits. The circuit parts not differing from FIG. 6 are numbered as in FIG. 6. Functionally, in the case of a 1-bit or 2-bit error, the circuit $K_j^c$ 41 with $(j=1, \ldots, m)$ realizes the function $$\Delta c_j = K_j^c(S) = \begin{cases} 1 & \text{for} \quad S = h_j^c \\ 1 & \text{for} \quad S = h_j^c + h \\ 0 & \text{else} \end{cases}$$

Thereby, $h_j^c$ is the $j^{th}$ column of matrix $H^c$ and h is a column of the matrix $H^u$ or the matrix $H^c$ with $h \neq h_j^c$.

Figure 8:
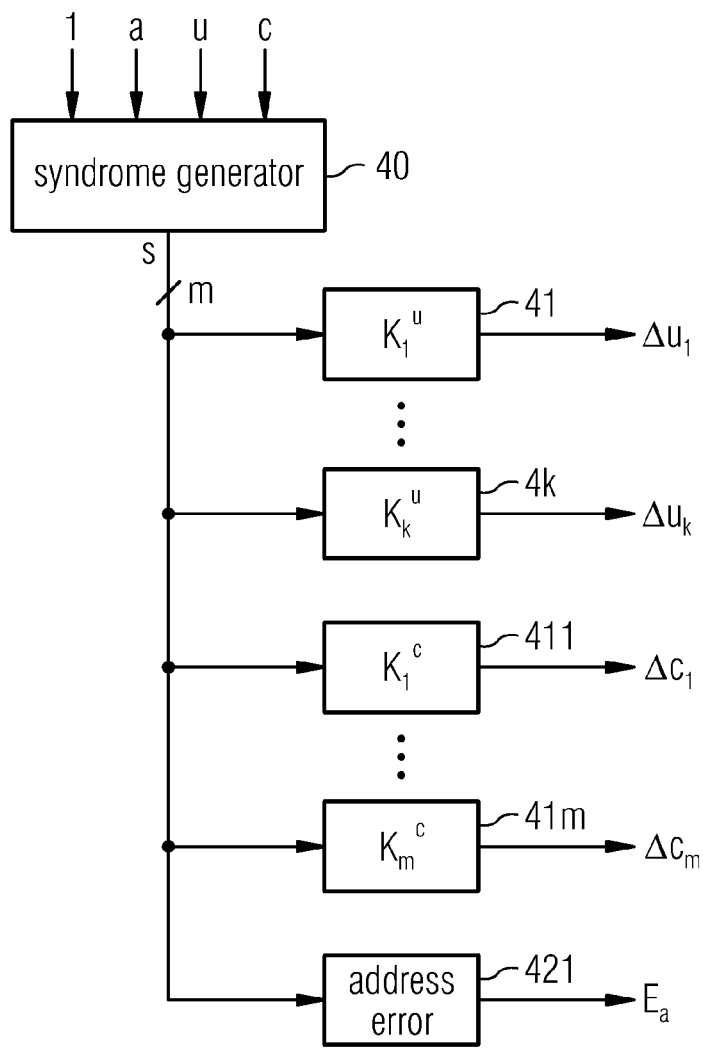
FIG. 8 is a schematic illustration of a derivation of a correction vector for data, check and address bits.

FIG. 8 shows an inventive syndrome generator 40, which comprises, in addition to FIG. 7, a further circuit for determining address errors 421 (which may also be part of the bit error corrector). This circuit outputs the value $E_a = 1$ at its output when a 1-bit or 2-bit address error has occurred. Functionally, for the circuit 421 for determining address errors, the following applies $$E_a(S) = \begin{cases} 1 & \text{for} \quad S = h^a \\ 1 & \text{for} \quad S = h^a + h \\ 0 & \text{for} \quad S = h^* \\ 0 & \text{for} \quad S = h^* + h' \\ 0 & \text{for} \quad S = 0 \\ - & \text{else} \end{cases}$$

wherein $h^a$ is a column of matrix $H^a$, h a column of the matrices $H^u$, $H^a$, $H^c$ with $h \neq h^a$ and $h^*$ and $h'$ are columns of matrices $H^u$ and $H^c$ with $h^* \neq h'$.

Figure 9:
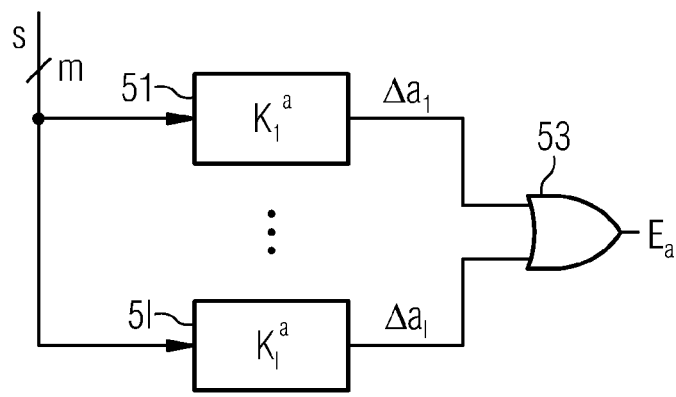
FIG. 9 is a schematic illustration of a generation of an address error signal.

FIG. 9 shows a specific embodiment of a circuit 421 of FIG. 8 for detecting address errors. The circuit of FIG. 9 consists of I circuits $K_1^a$ 51, ..., $K_l^a$ 5l for determining l correction values $\Delta a_1, \ldots, \Delta a_l$ of the possibly erroneous address bits $a'_1, \ldots, a'_l$. The outputs of circuits 51, ..., 5l carrying the correction values $\Delta a_1, \ldots, \Delta a_l$ are provided to the input of an OR-gate 53 outputting the address error signal $E_a$ at its output.

For $i=1, \ldots, l$, for the correction value $\Delta a_i$, the following applies $$\Delta a_i = \begin{cases} 1 & \text{for} \quad S = h_i^a \\ 1 & \text{for} \quad S = h_i^a + h \\ 0 & \text{else} \end{cases}$$

Thereby, $h_i^a$ is the $i^{th}$ column of matrix $H^a$ and h is a column of matrices $H^u$, $H^a$, $H^c$ with $h \neq h_i^a$.

Figure 10:
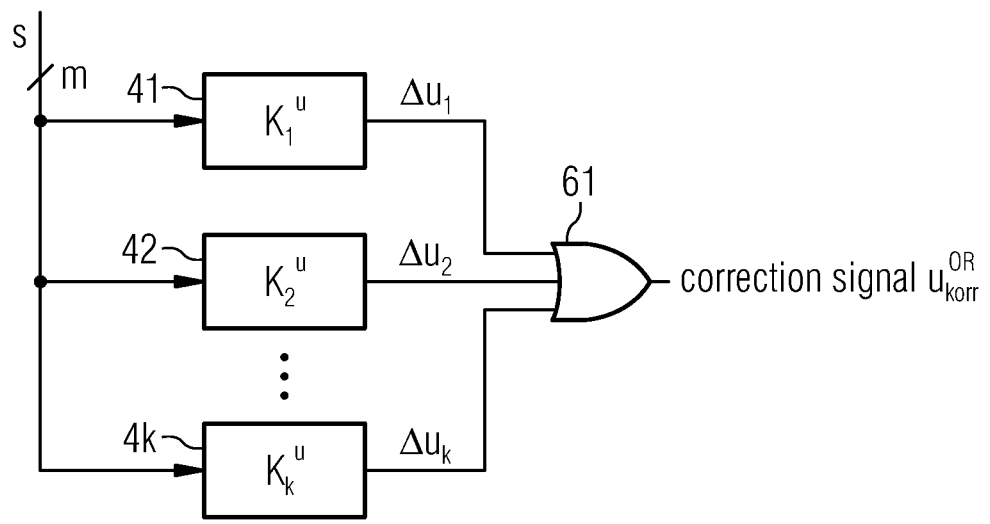
FIGS. 10, 11, 12, and 13 are schematic illustrations of a derivation of a correction signal.

In FIG. 10, it is illustrated how for $i=1, \ldots, k$, the outputs of circuits $K_i^u$, which are outputting a correction signal $\Delta u_i$ for correcting the bit $u'_i$, are connected by an OR-gate with k inputs 61 to a correction signal $u_{korr}^{OR}$. Based on signal $u_{korr}^{OR}$, it can be determined easily whether a correction has taken place at all in bits $u'_1, \ldots, u'_k$. The outputs of circuits $K_i^u$, $i=1, \ldots, k$ are connected with the respective $i^{th}$ input of the OR-gate 61 outputting the signal $$u_{korr}^{OR} = \Delta u_1 \oplus \Delta u_2 \oplus \ldots \oplus \Delta u_k$$

at its output.

Figure 11:
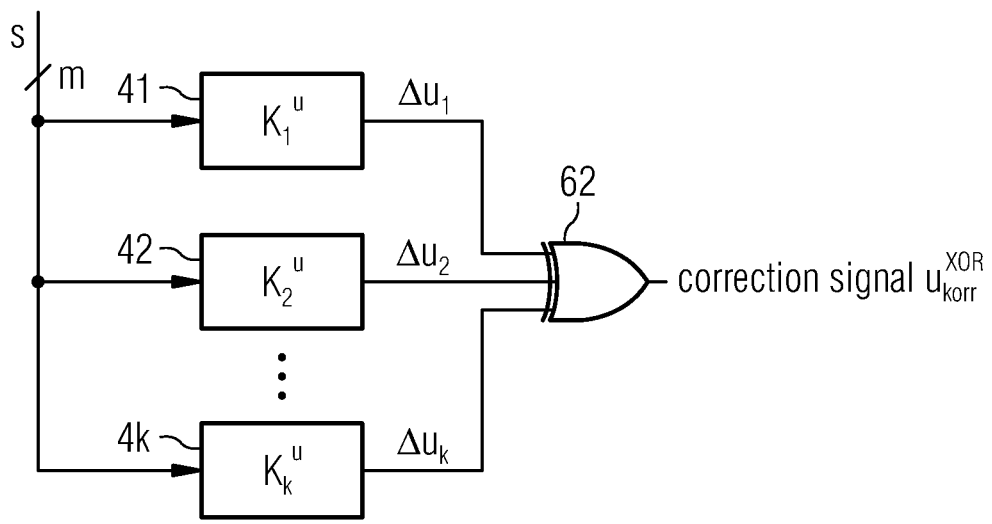

In FIG. 11, it is illustrated how for $i=1, \ldots k$, the outputs of circuits $K_i^u$, which are outputting a correction signal $\Delta u_i$ for correcting the bit $u'_i$ at its output, are connected to a correction signal $u_{korr}^{XOR}$ by an XOR-gate with k inputs 62. Based on the signal $u_{korr}^{XOR}$, it can be determined easily whether an odd number of corrections of bits $u'_1, \ldots, u'_k$ has taken place. The outputs of circuits $K_i^u$, $i=1, \ldots, k$ are connected with the respective $i^{th}$ input of the XOR-gate 62 outputting the signal $$u_{korr}^{XOR} = \Delta u_1 \oplus \Delta u_2 \oplus \ldots \oplus \Delta u_k$$

at its output.

Figure 12:
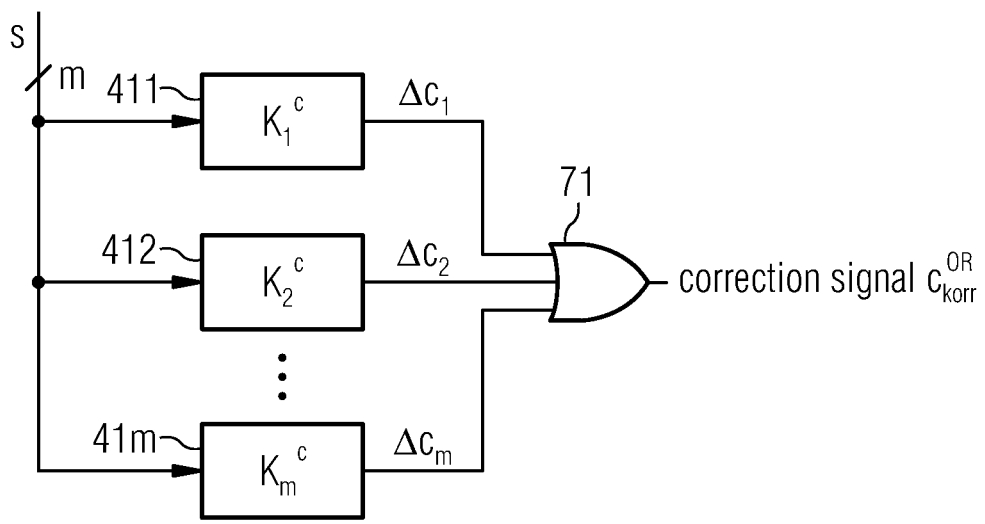

In FIG. 12, it is illustrated how for $i=1, \ldots, m$ the outputs of circuits $K_i^c$, which are outputting a correction signal $\Delta c_i$ for correcting the bits $c'_i$ at their output, are connected to a correction signal $c_{korr}^{OR}$ by an OR-gate with m inputs 71. Based on the signal $c_{korr}^{OR}$, it can be determined easily whether correction has taken place at all in bits $c'_1, \ldots, c'_m$. The outputs of circuits $K_i^c$, $i=1, \ldots, m$ are connected to the respective $i^{th}$ input of the OR-gate 71 outputting the signal $$c_{korr}^{OR} = \Delta c_1 \vee \Delta c_2 \vee \ldots \vee \Delta c_m$$

at its output.

Figure 13:
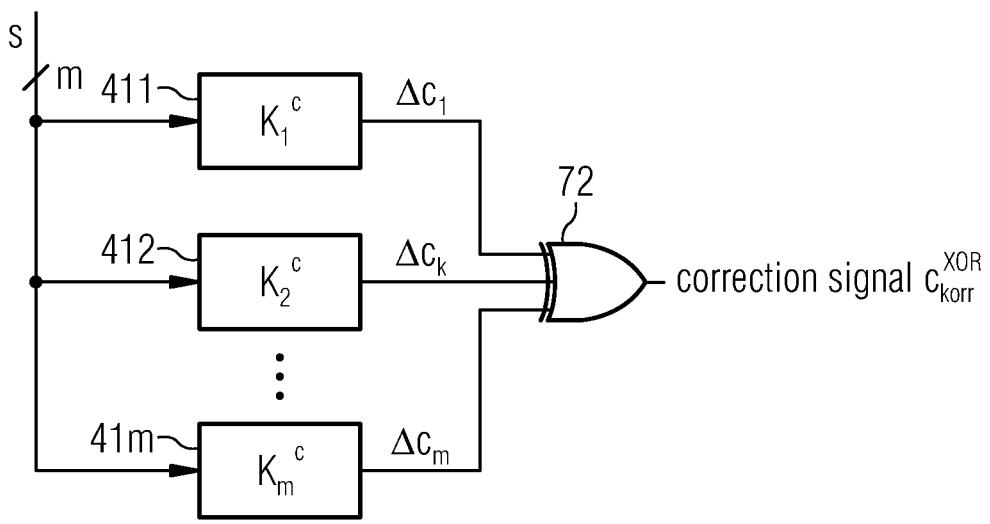
Figure 14A:
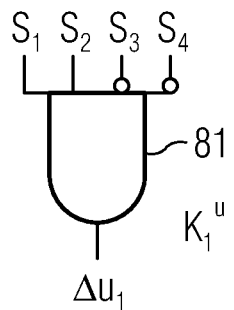
FIGS. 14a-14i are schematic illustrations of a determination of correction values.
Figure 14B:
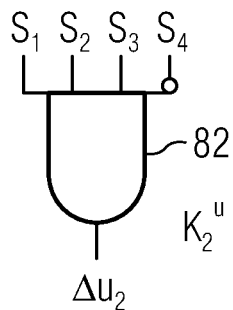
Figure 14C:
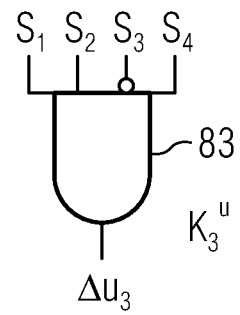
Figure 14D:
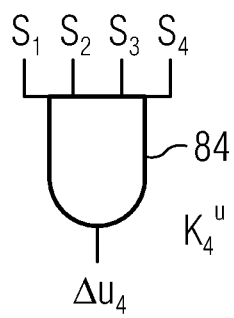
Figure 14E:
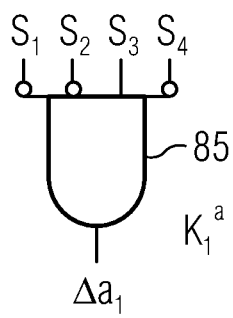
Figure 14F:
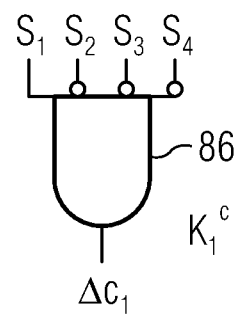
Figure 14G:
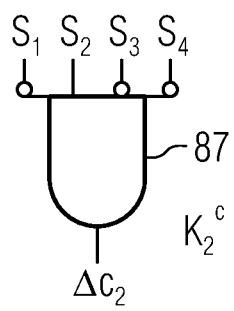
Figure 14H:
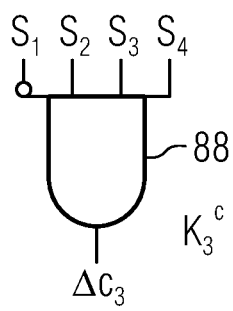
Figure 14I:
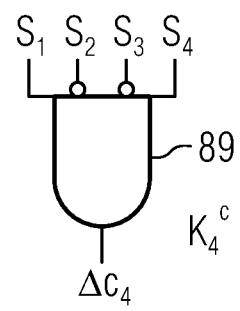

In FIG. 13, it is illustrated how for $i=1, \ldots, m$, the outputs of circuits $K_i^c$, which are outputting a correction signal $\Delta c_i$ for correcting the bit $c'_i$ at their output, are connected to a correction signal $c_{korr}^{XOR}$ by an XOR-gate with m inputs 72. Based on the signal $c_{korr}^{XOR}$, it can be determined easily whether an odd number of corrections of the bits $c'_1, \ldots, c'_m$ has taken place. The outputs of circuits $K_i^c$, $i=1, \ldots, m$ are connected to the respective $i^{th}$ input of the XOR-gate 72, which outputs the signal $$c_{korr}^{XOR} = \Delta c_1 \oplus \Delta c_2 \oplus \ldots \oplus \Delta c_m$$

at its output.

Since the used BCH code is shortened, it can happen that a multi-bit error is mapped to the syndrome $S(1)$ of a 1-bit error, wherein $S(1)$ is equal to a column of the check matrix of the unshortened BCH code, which had been deleted when reducing the matrix. This situation can be detected easily when the signals $u_{korr}^{OR}$ and $c_{korr}^{OR}$ are both equal 0, but the error syndrome $S(1)$ of a 1-bit error exists.

The proposed concept is now to be described at a particularly simple example of a unshortened Hamming code having four information bits $u_1, u_2, u_3, u_4$, four check bits $c_1, \ldots, c_4$ and two address bits $a_1, a_2$. The word width k=4, m=4 and l=2 are selected to be small intentionally in order to be able to illustrate the concept as clearly as possible.

The check matrix of the unshortened Hamming code is $$H = (1_{bin}, 2_{bin}, 3_{bin}, 4_{bin}, \ldots, [15]_{bin}) = \begin{pmatrix} 1 & 0 & 1 & 0 & \ldots & 1 \\ 0 & 1 & 1 & 0 & \ldots & 1 \\ 0 & 0 & 0 & 1 & \ldots & 1 \\ 0 & 0 & 0 & 0 & \ldots & 1 \end{pmatrix}.$$

The set $Sp^{00}$ of the columns of the check matrix whose first two components are equal to 0,0 is $$Sp^{00} = \{(0010)^T, (0001)^T, (0011)^T\}.$$

The set $Sp^{01}$ of the columns of the check matrix whose first two components are equal to 0,1 is $$Sp^{01} = \{(0110)^T, (0101)^T, (0111)^T, (0100)^T\},$$

The set $Sp^{10}$ of the columns of the check matrix whose first two components are equal to 1,0 is $$Sp^{10} = \{(1010)^T, (1001)^T, (1011)^T, (1000)^T\}.$$

The set $Sp^{11}$ of the columns of the check matrix whose first two components are equal to 1,1 is $$Sp^{11} = \{(1110)^T, (1101)^T, (1111)^T, (1100)^T\}.$$

As columns of the (second) sub-matrix $H^a$, two linearly independent columns are selected from $Sp^{00}$, e.g. columns $(0010)^T$, $(0001)^T$.

As columns of the (third) sub-matrix $H^c$, four columns are selected from $Sp^{10}$ and $Sp^{01}$ namely columns $(0100)^T$, $(0111)^T$, $(1000)^T$, $(1001)^T$, that are linearly independent. As columns of the (first) sub-matrix $H^u$, four columns are selected from $Sp^{11}$, namely columns $(1100)^T$, $(1101)^T$, $(1110)^T$, $(1111)^T$. In the first two components, each of the values 10, 01, 11 occurs an even number of times, so that the XOR-sum of the first and second components of the matrix $$H = (H^u, H^a, H^c) = \begin{pmatrix} 1 & 1 & 1 & 1 & 0 & 0 & 1 & 0 & 0 & 1 \\ 1 & 1 & 1 & 1 & 0 & 0 & 0 & 1 & 1 & 0 \\ 0 & 1 & 0 & 1 & 1 & 0 & 0 & 0 & 1 & 0 \\ 0 & 0 & 1 & 1 & 0 & 1 & 0 & 0 & 1 & 1 \end{pmatrix}$$

is equal 00. For the syndrome $S=S_1, S_2, S_3, S_4$, we have $$S = H \cdot (u,a,c)^T$$

$$S_1 = u_1 + u_2 + u_3 + u_4 + c_1 + c_4$$

$$S_2 = u_1 + u_2 + u_3 + u_4 + c_2 + c_3$$

$$S_3 = u_2 + u_4 + a_1 + c_3$$

$$S_4 = u_3 + u_4 + a_2 + c_3 + c_4$$

For the two-dimensional binary vector $a''_1, a''_2$, determined according to equation (7), the following results $$s_{All-1} = (H^u, H^c) \cdot \underbrace{(1 \ldots, 1)}_{s}^T = (0010)^T$$

and, hence, $$(0010)^T = \begin{pmatrix} 0 & 0 \\ 0 & 0 \\ 1 & 0 \\ 0 & 1 \end{pmatrix} \cdot (a''_1, a''_2)^T$$

with the solution $a''_1=1$ and $a''_2=0$.

Since $a''_2=0$, constantly $a_2=1$ is set, which results in equations $$S_1 = u_1 + u_2 + u_3 + u_4 + c_1 + c_4$$

$$S_2 = u_1 + u_2 + u_3 + u_4 + c_2 + c_3$$

$$S_3 = u_2 + u_4 + a_1 + c_3$$

$$S_4 = u_3 + u_4 + 1 + c_3 + c_4$$

which logically describes a syndrome generator according to the described concept, whose implementation may be realized, for example, with a commercially available synthesis tool.

The available addresses are here only addresses $a_1, a_2=0,1$ and $a_1, a_2=1,1$. The syndrome of the vector $(0000a_1, a_2 0000)$ is $S=(00a_11)$ and, hence, unequal 0. The syndrome of the vector $(1111a_1, a_21111)$ is equal $S=(00\bar{a}_11)$ and, hence, unequal 0. Hence, the vectors $(0000a_1, a_20000)$ and $(1111a_1, a_21111)$ are never code vectors.

Vector $0000a_1, a_2 0100$ will be considered as an example of a vector having a one in the bits stored in the memory. The associated syndrome is $S=(01a_11)$. The same has at least 2 ones. By checking all possible 1-bit errors, it is easy to confirm that no 1-bit error can modify the vector $0000a_1, a_20100$ into a code word with the error syndrome $S=0$.

A respective statement applies for all vectors having exactly one 1 in bits $u_1, u_2, u_3, u_4 c_1, c_2, c_3, c_4$. An example for the circuit for determining the correction values $K_1^u$, $K_2^u$, $K_3^u$, $K_4^u$, $K_1^a$, $K_1^c$, $K_2^c$, $K_3^c$, $K_4^c$ is shown in FIGS. 14a-14i. The value $S=(S_1, S_2, S_3, S_4)$ is inserted into the correction circuits $K_1^u$ 81, $K_2^u$ 82, $K_3^u$ 83, $K_4^u$ 84, $K_1^a$ 85, $K_1^c$ 86, $K_2^c$ 87, $K_3^c$ 88, $K_4^c$ 89.

The correction circuit $K_1^u$ 81 outputs the correction values $\Delta u_1=1$ exactly when S=1100.

The correction circuit $K_2^u$ 82 outputs the correction values $\Delta u_2=1$ exactly when S=1110.

The correction circuit $K_3^u$ 83 outputs the correction values $\Delta u_3=1$ exactly when S=1101.

The correction circuit $K_4^u$ 84 outputs the correction values $\Delta u_4=1$ exactly when S=1111.

The correction circuit $K_1^a$ 85 outputs the correction values $\Delta a_1=1$ exactly when S=0010.

The correction circuit $K_1^c$ 86 outputs the correction values $\Delta c_1=1$ exactly when S=1000.

The correction circuit $K_2^c$ 87 outputs the correction values $\Delta c_2=1$ exactly when S=0100.

The correction circuit $K_3^c$ 88 outputs the correction values $\Delta c_3=1$ exactly when S=0111.

The correction circuit $K_4^c$ 89 outputs the correction values $\Delta c_4=1$ exactly when S=1001.

The illustrated concept is also applicable when bits $u=u_1, \ldots, u_k$ consist of K payload data and q bits derived therefrom. Then with k=K+q, the following applies $$u_1, \ldots, u_k = u_1, \ldots, u_K, w_1, \ldots, w_q.$$

Bits $w_1, \ldots, w_q$ can also be referred to as inner check bits and these bits as check bits of an inner code that are determined from bits $u_1, \ldots, u_K$ by $$w_1 = f_1(u_1, \ldots, u_K),$$

$$w_2 = f_2(u_1, \ldots, u_K),$$

$$\vdots$$

$$w_q = f_q(u_1, \ldots, u_K)$$

Thereby, $f_1, \ldots, f_q$ are K-digit boolean functions and k=K+q applies. If the boolean functions $f_1, \ldots, f_q$ are linear, then the inner code is linear. If at least one of these functions is non-linear, then the code is non-linear.

Bits $u_1, \ldots, u_k = u_1, \ldots, u_K, w_1, \ldots, w_q$ are corrected, for example, by a shortened BCH code correcting a 2-bit error by using its check bits $c_1, \ldots, c_m$. For obtaining a particularly high probability for error detection of errors in bits $u_l, \ldots, u_k$ after the possible error correction by the BCH code, error detection in bits $u_l, \ldots, u_k$ can be performed by using the check bits of the inner code, without having to increase the number of check bits of the external code.

As an example, a non-linear code described in document DE 10 2006 005 836 or "Gössel, M., Otcheretny, V., Sogomonyan, E. and Marienfeld, D.: New Methods of Concurrent Checking, Springer Verlag 2008, p. 49-53" may be used, where, here, two internal check bits are determined by $$w_1 = u_1 u_2 \oplus u_3 u_4 \oplus \ldots \oplus u_{K-1} u_K$$

and $$w_2 = u_2 \vee u_3 \oplus u_4 \vee u_5 \oplus \ldots \oplus u_K \vee u_1$$

Any arbitrary error that does not corrupt simultaneously all bits $u_1, \ldots, u_k$ can then be detected advantageously at least with the probability ½ as, for example, described in "Gössel, M., Otcheretny, V., Sogomonyan, E. and Marienfeld, D.: New Methods of Concurrent Checking, Springer Verlag 2008, p. 49-53". It is also possible to include the address bits into the determination of the check bits of the inner code. For example, $w_1$ and $w_2$ can be determined as $$w_1 = u_1 u_2 \oplus u_3 u_4 \oplus \ldots \oplus u_{K-1} u_K \oplus a_1 a_2 \oplus \ldots$$
$$\oplus a_{l-1} a_l \vee \overline{(a_1 \vee \ldots \vee a_l)}$$

and $$w_2 = (u_2 \vee u_3 \oplus u_4 \vee u_5 \oplus \ldots \oplus u_K \vee a_1 \oplus a_2 \vee a_3 \oplus \ldots$$
$$\oplus a_l \vee u_1) \wedge \overline{(\bar{a}_1 \wedge \ldots \wedge \bar{a}_l)}$$

It is also possible that bits $w_1, \ldots, w_q$ only depend on address bits $a_1, \ldots, a_l$ and not on bits $u_1, \ldots, u_k$. For example, bits $w_1, w_2$ can be determined by $$w_1, w_2 = (a_1 + 2a_2 + \ldots + 2^{i-1} a_l) \bmod 3$$

By using the proposed concept, an error correction circuit for 1-bit and 2-bit errors in which the address bits are integrated into error detection, wherein also the errors All-0 and All-1 may be detected as being errors in any address values, may be enabled.

Further, the described concept may enable to write, under any address any data, in particular also the value $(0, \ldots, 0)$, $(1, \ldots, 1)$ into all data bits without all memory cells being occupied by 0 (1), so that All-1 (All-0) is under no address a valid codeword in all memory cells.

Likewise, the circuitry may enable to differentiate every 1-bit-error from errors "All-1" and "All-0", which is advantageous. Thus, it may not be the case that a word read out of storage in case of a correctable 1-bit error is mixed up with an error "All-0" or in "All-1".

In the following, the very detailed example described before is explained in more general words also indicating some of the optional or additional features.)

There is a circuitry for generating a m-digit syndrome $S=(S_1, \ldots, S_m)$ of a code C correcting at least a 1-bit error of a code word of the length n having a check matrix H for correcting errors of bits stored in an addressable memory. A first group $u=u_1, \ldots, u_k$ of k bits, a second group $a=a_1, \ldots, a_l$ of l bits and a third group $c=c_1, \ldots, c_m$ of m bits exist, and the first group of k bits and the third group of m bits are stored in addressable memory under the address a. In the error-free case, bits $c=c_1, \ldots, c_m$ are derived logically from bits $u=u_1, \ldots, u_k$ and $a=a_1, \ldots, a_l$ by XOR connections, n=k+l+m, wherein the circuitry has n inputs, where the bits $u_1, \ldots, u_k, a_1, \ldots, a_l, c_1, \ldots, c_m$ are applied, wherein bits $u_1, \ldots, u_k, c_1, \ldots, c_m$ are output from the memory when applying the address $a_1, \ldots, a_l$ and the values of the error syndrome $S=S_1, \ldots, S_m$ are determined by $$S = H \cdot (u, a, c)^T$$

and $(u,a,c)^T$ is the transposed column vector of the row vector $(u,a,c)$ and the check matrix H.

The check matrix H consists of three sub-matrices $H^u$, $H^a$, $H^c$, wherein the sub-matrix $H^u$ consists of k first columns of H, the sub-matrix $H^a$ consists of l second columns of H and the sub-matrix $H_c$ consists of the residual m columns of H, so that $$H = (H^u, H^a, H^c)$$

applies.

Further, there is a first predefined component and a second predefined component of columns of $H^u$ and $H^c$ each unequal [0,0] and such that the XOR-sum of these first predefined components of the columns of $H^u$ and the columns of $H^c$ component-by-component and the XOR-sum of the second predefined components of the columns of $H^u$ and $H^c$ component-by-component are each equal to 0.

The values of the first predefined component and the values of the second predefined component of columns of $H^a$ are each equal to [0,0].

The l columns of matrix $H^a$ are linearly independent.
The m columns of matrix $H^c$ are linearly independent.
Further, there is a bit position r, $1 \leq r \leq l$ so that $$H \cdot (\underbrace{1, \ldots, 1}_{k}, \underbrace{0, \ldots 0}_{l}, \underbrace{1, \ldots, 1}_{m})= H^a \cdot (a_1'', \ldots, a_{r-1}'', 0, a_{r+1}'', \ldots, a_l'')^T$$

applies, wherein $$a_1'', \ldots, a_{r-1}'', a_{r+1}'', \ldots, a_l'' \in \{0, 1\}$$

with $m+l+k \leq 2^m - 1$ and $l \leq m-2$.

According to an aspect, k correction circuits $K_1^u, \ldots, K_k^u$ having each m inputs and an output for generating correction values $\Delta u_1, \ldots, \Delta u_k$ for XOR connection with bits $u_1', \ldots, u_k'$ read out from the memory are simultaneously connected to m outputs of the circuit mentioned before outputting the m components of the error syndrome $S = S_1, \ldots, S_m$.

Further, the correction circuits $K_1^u, \ldots, K_k^u$ when C is a 1-bit error correcting code, in the case of a 1-bit error or no error for $j=1, \ldots, k$ realize a m-digit boolean function $K_j^u(S)$ with $$\Delta u_j = K_j^u(S) = \begin{cases} 1 & \text{for } S = h_j^u \\ 0 & \text{else} \end{cases}$$

wherein $h_j^u$ is the $j^{th}$ column of the sub-matrix $H^u$.

Alternatively or additionally, the correction circuits $K_1^u, \ldots, K_k^u$, when C is a 1-bit error and 2-bit error correcting code, in the case of a 1-bit error or a 2-bit error or no error for $j=1, \ldots, k$ realize a m-digit boolean function $K_j^u(S)$ with $$\Delta u_j = K_j^u(S) = \begin{cases} 1 & \text{for } S = h_j^u \\ 1 & \text{for } S = h_j^u + h \\ 0 & \text{else} \end{cases}$$

wherein $h_j^u$ is the $j^{th}$ column of $H^u$ and h is an arbitrary column of $H^u$ or $H^c$.

According to another aspect, the circuitry is configured such that the logical $r^{th}$ address bit $a_r$ is set to 1 when $a_1$, $a_2, \ldots, a_{r-1}, \ldots, a_l = 0, \ldots, 0$ and when $$a_1, a_2 \ldots, a_{r-1}, a_{r+1}, \ldots, a_l = a''_1, a''_2 \ldots, a''_{r-1}, a''_{r+1}, \ldots, a''_l$$

wherein $$a''_1, a''_2 \ldots, a''_{r-1}, a''_{r+1}, \ldots, a''_l$$

is determined such that $$H \cdot (\underbrace{1, \ldots, 1}_{k}, \underbrace{0, \ldots, 0}_{l}, \underbrace{1, \ldots, 1}_{m}) = H^a \cdot (a''_1, \ldots, a''_{r-1}, 0, a''_{r+1}, \ldots, a''_l)$$

applies.

Further, it may be configured such that $a_r$ is constantly set to 1.

According to a further aspect, a further sub-circuit $F_o$ having k+m inputs and an output for detecting the allocation All-0 of a memory cells exists, realizing an (k+m)-digit boolean function $F_0(u,c)$, for which the following applies:

$$F_0(u,c) = \bar{u}_1 \vee \bar{u}_2 \vee \ldots \vee \bar{u}_k \vee \bar{c}_1 \vee \ldots \vee \bar{c}_m$$

According to an aspect, a further sub-circuit $F_1$ having k+m inputs and an output for detecting the allocation All-1 of a memory cells exists, realizing an (k+m)-digit boolean function $F_1(u,c)$, for which the following applies:

$$F_1(u,c) = u_1 \wedge u_2 \wedge \ldots \wedge u_k \wedge c_1 \wedge \ldots \wedge c_m.$$

Further, the check matrix H may be supplemented by a row $$\underbrace{1, 1, \ldots, 1}_{k+m}.$$

According to another aspect, there are q components $i_1, i_2, \ldots, i_q$ of the columns of the check matrix H, so that for every column h of the check matrix H, the XOR-sum of the values of these components is each equal 1.

Additionally, a circuit component having q inputs and an output for forming the XOR-sum of the q components $s_{i1}, \ldots, s_{iq}$ of the error syndrome for forming the parity P, $$P = s_{i1} \oplus \ldots \oplus s_{iq}$$

may exist.

According to an aspect, a further sub-circuit for address error detection (same-bit-value-detection) may exist, which outputs an error signal at its output in the case of an address error.

Further, the sub-circuit for address error detection in the case that the code C is a 1-bit error detecting code may output, in the case of a 1-bit error or no error, the value $E^a(S)$ with $$E_a(S) = \begin{cases} 1 & \text{for } S = h^a \\ 0 & \text{else} \end{cases}$$

wherein $h^a$ is an arbitrary column of sub-matrix $H^a$.

Additionally, the sub-circuit for address error detection in the case that the code C is a 1-bit error and 2-bit error correcting code may output, in the case of a 1-bit error, a 2-bit error or no error, the value $E_a(S)$ with $$E_a(S) = \begin{cases} 1 & \text{for } S = h^a \\ 1 & \text{for } S = h^a + h \\ 0 & \text{else} \end{cases}$$

wherein $h^a$ is an arbitrary column of matrix $H^a$, h an arbitrary column of matrices $H_u$, $H^a$, $H^c$ with $h \neq h^a$.

According to another aspect, l additional correction circuits $K_1^a, \ldots, K_l^a$ having m inputs and one output exist, so that for $j=1, \ldots, l$ the correction circuit $K_j^a$ for the case that C is a 1-bit error correcting code realizes a 1-digit boolean function $K_j^a(s)$, for which $$K_j^a(S) = \begin{cases} 1 & \text{for } S = h_j^a \\ 0 & \text{else} \end{cases}$$

applies, wherein $h_a^j$ is the $j^{th}$ column of check matrix $H^a$.

According to a further aspect, l additional correction circuits $K_1^a, \ldots, K_l^a$ having m inputs and one output exists, so that for $j=1, \ldots, l$ the correction circuit $K_j^a$ for the case that C is a 1-bit error and 2-bit error correcting code realizes a 1-digit boolean function $K_j^a(S)$, for which $$K_j^a(S) = \begin{cases} 1 & \text{for } S = h_j^a \\ 1 & \text{for } S = h_j^a + h \\ 0 & \text{else} \end{cases}$$

applies, wherein $h_j^a$ is the $j^{th}$ column of check matrix of $H^a$ and h an arbitrary column of matrices $H^u$ and $H^c$ with $h' \neq h_j^a$.

Additionally, the l outputs of correction circuits $K_1^a, \ldots, K_l^a$ may be connected to inputs of a circuit having l inputs and one output, realizing the logical OR-connection of its inputs.

According to an aspect, m additional correction circuits $K_1^c, \ldots, K_m^c$ having m inputs and one output exist, wherein in the case that C is a 1-bit error correcting code for j=1, . . . , m, the correction circuit $K_j^c$ realizes a m-digit boolean function $K_j^c(S)$, for which, in the case for 1-bit error or no error, the following applies $$\Delta c_j = K_j^c(S) = \begin{cases} 1 & \text{for } S = h_j^c \\ 0 & \text{else} \end{cases}$$

and $h_j^c$ is the $j^{th}$ column of sub-matrix $H^c$.

According to another aspect m additional correction circuits $K_1^c, \ldots, K_m^c$ having m inputs and one output exist, wherein, in the case that C is a 1-bit and a 2-bit error correcting code, for j=1, . . . ,m the correction circuit $K_j^c$ realizes a m-digit boolean function $K_j^c(S)$, for which the following applies in the case of a 1-bit error, a 2-bit error or no error:

$$\Delta c_j = K_j^c(S) = \begin{cases} 1 & \text{for } S = h_j^c \\ 1 & \text{for } S = h_j^c + h \\ 0 & \text{else} \end{cases}$$

wherein $h_j^c$ is the $j^{th}$ column of sub-matrix $H^c$ and h an arbitrary column of sub-matrices $H^u$ or $H^c$ with $h \neq h_j^c$.

According to a further aspect, the k outputs of the correction circuits $K_1^u, \ldots, K_k^u$ are connected into the inputs of a circuit having k inputs and one output, realizing a logic OR connection of its inputs.

According to an alternative aspect, the m outputs of correction circuits $K_1^u, \ldots, K_k^u$ are connected to the inputs of a circuit having k inputs and an output realizing a logical XOR connection of its inputs.

Further, the m outputs of the correction circuits $K_1^c, \ldots, K_m^c$ may be connected to the inputs of a circuit having m inputs and one output realizing a logic OR-connection of its inputs.

Additionally, the m outputs of correction circuits $K_1^c, \ldots, K_m^c$ may be connected to the inputs of a circuit having m inputs and one output realizing a logic XOR-connection of its inputs.

According to an aspect, the bits $u_k, \ldots, u_{k-v}$ stored in the memory are determined from the bits $u_1, \ldots, u_{k-v-1}$ stored in the memory and the address bits $a_1, \ldots, a_l$ by v+1 circuits $f_k, f_{k-1}, \ldots, f_{k-v}$ each having k−v−1+l inputs and one output, realizing the (k−v+1)-digit boolean functions $$u_k = f_k(u_1, \ldots, u_{k-v-1}, a_1, \ldots, a_l),$$
$$\vdots$$
$$u_{k-v} = f_{k-v}(u_1, \ldots, u_{k-v-1}, a_1, \ldots, a_l)$$

Additionally, the boolean functions $f_k, \ldots, f_{k-v}$ may not depend on address bits $a_1, \ldots, a_l$.

Further, the boolean functions $f_k, \ldots, f_{k-v}$ may not depend on bits $u_1, \ldots u_{k-v-1}$.

Additionally, at least one of the boolean functions $f_k, \ldots, f_{k-v}$ may be non-linear. Further, v may be equal to 1.

Additionally, $f_k$ may be defined by:

$$f_k(u_1, \ldots, u_{k-2}, a_1, \ldots, a_l) = (u_1 \vee u_2 \oplus u_3 \vee u_4 \oplus \ldots \\ \oplus u_{k-3} \vee u_{k-2} \oplus a_1 \vee a_2 \\ \oplus a_{l-1} \vee a_l) \vee \overline{(a_1 \ldots \vee a_l)}$$

and optionally $f_{k-1}$ may be defined by:

$$f_{k-1}(u_1, \ldots, u_{k-2}, a_1, \ldots, a_l) = (u_2 \vee u_5 \\ \oplus u_4 \vee \\ u_5 \oplus \ldots \oplus u_{k-4} \vee u_{k-3} \oplus u_{k-2} \wedge a_1 \oplus a_2 \wedge a_3 \ldots \\ \oplus a_1 \wedge u_1) \vee \overline{(a_1 \ldots \vee a_l)}$$

According to an aspect, the check matrix $H_{unverk}$ of the not shortened BCH code has the form $$H_{unverk} = \begin{pmatrix} \alpha^{2^M-2} & \ldots & \alpha^j & \ldots & \alpha^1 & \alpha^0 \\ \alpha^{3(2^M-2)} & \ldots & \alpha^{3j} & \ldots & \alpha^{31} & \alpha^0 \end{pmatrix}$$

and the respective exponent j of $a^j$ is to be interpreted modulo $2^M-1$.

According to another aspect, the correction circuit $K_i^u$ are at least partly jointly implemented, the correction circuits $K_j^c$ and $K_i^u$ are at least partly jointly implemented and/or the correction circuits $K_i^c$, $K_i^u$ and $K_j^a$ are at least partly jointly implemented.

Some embodiments according to the invention relate to an apparatus for correcting at least one bit error within a coded bit sequence comprising a means for determining an error syndrome and a means for correcting bit errors. The means for determining an error syndrome may determine an error syndrome of a coded bit sequence derived by a multiplication of a check matrix with the coded bit sequence. The check matrix comprises a first sub-matrix, a second sub-matrix and a third sub-matrix, each sub-matrix comprising a plurality of lines, each line comprising a plurality of binary components. At least a first predefined component or a second predefined component of each line of the first sub-matrix comprises a first bit value. Further, the second sub-matrix comprises lines being linearly independent from each other. The first predefined component and the second predefined component of each line of the second sub-matrix comprises a same second bit value. The third sub-matrix comprises lines being linearly independent from each other and the first predefined component or the second predefined component of each line of the third sub-matrix comprises the first bit-value. Further, either an XOR-sum of the first predefined components of all lines of the first sub-matrix and the third sub-matrix is equal to the bit value 0 and an XOR-sum of the second predefined components of all lines of the first sub-matrix and the third sub-matrix is equal to the bit value 0. Additionally, a result of a multiplication of the check matrix and the test vector is equal to a result of a multiplication of the second sub-matrix and a resulting vector, wherein at least one component of the resulting vector comprises the second bit value. The means for correcting bit errors may correct a bit error within the coded bit sequence based on the determined error syndrome of the coded bit sequence.

Some further embodiments according to the invention may relate to a decoder 1500 for decoding a faulty, coded bit sequence as it is shown in FIG. 15. The decoder 1500 may comprise an apparatus for correcting a bit error within a coded bit sequence according to the concept described above and a decoding unit 1510. The decoding unit 1510 may decode the corrected bit sequence 122 provided by the apparatus for correcting a bit error within a coded bit sequence to obtain a decoded bit sequence 1512.

FIG. 16 shows a flow chart of a method 1600 for correcting at least one bit error within a coded bit sequence according to an embodiment of the invention. The method 1600 comprises determining 1610 an error syndrome of a coded bit sequence derivable by a multiplication of a check matrix with the coded bit sequence. The check matrix comprises a first sub-matrix, a second sub-matrix and a third sub-matrix, each sub-matrix comprising a plurality of lines, each line comprising a plurality of binary components. Further, at least a first predefined component or a second predefined component of each line of the first sub-matrix comprises a first bit value. The second sub-matrix comprises lines being linearly independent from each other and the first predefined component and the second predefined component of each line of the second sub-matrix comprises a second bit value. The third sub-matrix comprises lines being linearly independent from each other and the first predefined component or the second predefined component of each line of the third sub-matrix comprises the first bit value.

Further, an XOR-sum of the first predefined components of all lines of the first sub-matrix and the third sub-matrix is equal to the second bit value and an XOR-sum of the second predefined components of all lines of the first sub-matrix and the third sub-matrix is equal to 0. Additionally, the result of a multiplication of the check matrix and a test vector is equal to a result of a multiplication of the second sub-matrix and a resulting vector, wherein at least one component of the resulting vector comprises the second bit value. Further, the method 1600 comprises correcting 1620 a bit error within the coded bit sequence based on the determined error syndrome of the coded bit sequence.

Additionally, the method 1600 may comprise further steps representing one or more of the optional aspects of the proposed concept described above.

Figure 17:
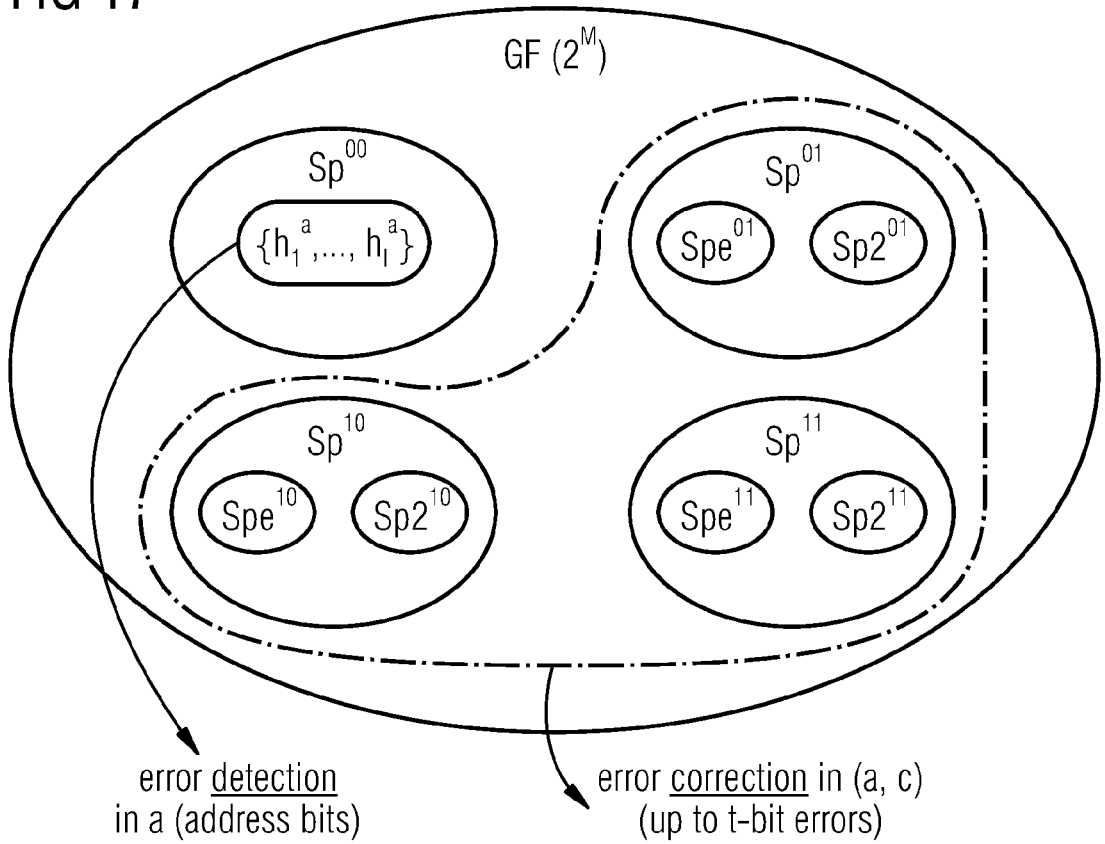
FIG. 17 schematically illustrates a Venn Diagram of a Galois field $GF(2^M)$ and some of its subsets, the elements of which may be used as columns in sub-matrices of the parity check matrix.

FIG. 17 schematically illustrates the elements of the Galois field $GF(2^M)$ and different subsets of elements of the Galois field $GF(2^M)$ in a Venn diagram form or set theory diagram form. As explained further above, it is possible to divide the Galois field in four disjoint sets $Sp^{00}$, $Sp^{01}$, $Sp^{10}$, and $Sp^{11}$. The elements of each disjoint set, e.g. $Sp^{00}$, are characterized in that they have the same first (selected) components (j-th component) with the value "0" and second (selected) components (k-th component) with the value "0" (and in an analogue manner for the three other disjoint sets $Sp^{01}$, $Sp^{10}$, $Sp^{11}$). The components of the various disjoints sets in $GF(2^M)$ can be used for different ones of the sub-matrices $H^u$, $H^a$, and $H^c$ as columns or rows. For example, some of the elements of the set $Sp^{00}$ may be used for the submatrix $H^a$ as columns and thus form an error detecting code for the address bits. The three remaining sets $Sp^{01}$, $Sp^{10}$, $Sp^{11}$ may be used together (dashed curve) and some of their elements may be used as columns in the sub-matrices $H^u$ and $H^c$ in order to thereby form an H-matrix of an error correcting code for the information bits u and the check bits c, for example an error correcting code for correcting up to t-bit errors within the information bits (payload data bits) u and the check bits c.

FIG. 17 also illustrates graphically how each of the four disjoint sets $Sp^{00}$, $Sp^{01}$, $Sp^{10}$, and $Sp^{11}$ can be further subdivided. In particular, the sets $Spe^{10}$, $Spe^{01}$, $Spe^{11}$ are formed from the sets $Sp^{10}$, $Sp^{01}$ and $Sp^{11}$ by deleting two random columns each and summarizing the deleted column into the sets $Sp2^{10}$, $Sp2^{01}$ and $Sp2^{11}$, respectively. Thus, the set $Sp2^{01}$ contains the two columns which were deleted from the set $Sp^{01}$ in order to determine the set $Spe^{01}$. The union of the sets $Spe^{10}$, $Spe^{01}$, $Spe^{11}$, i.e., $\{Spe^{10} \cup Spe^{01} \cup Spe^{11}\}$, may be used to select m linearly independent columns from, designated by $h_1^c, \ldots h_m^c$ and which form the matrix (third sub-matrix)

$$H^c = (h_1^c, \ldots, h_m^c)$$

From the set $Spe^{00}$ l columns are determined which are linearly independent. These columns are designated by $h_1^a, \ldots, h_l^a$ and they form the matrix (second sub-matrix).

$$H^a = (h_1^a, \ldots, h_l^a).$$

The matrix $H^u$ (first sub-matrix) consists of k columns $h_1^u, \ldots, h_k^u$, wherein $$h_i^u \in \{Spe^{10} \cup Spe^{01} \cup Spe^{11}\} \backslash SP^{H^c}$$

apply and wherein at least one column from $Spe^{10}$, at least one column from $Spe^{01}$ and at least one column from $Spe^{11}$ is contained in $(h_1^u, \ldots, h_k^u)$.

Subdividing the Galois field $GF(2^M)$ as schematically shown in FIG. 17 (or in a similar manner) makes it possible to select the columns (or more generally, elements) of the sub-matrices $H^u$, $H^a$, and $H^c$ in such a manner so that, in case a correctable error occurs in the information bits u or the check bits c, or a detectable error occurs in the address bits (or more generally, identifier bits) a, the corresponding error syndromes are clearly distinguishable and different for the various error classes. In other words, a detectable error in the address bits (identifier bits) a does typically not lead to an error syndrome that is associated with a correctable error in the information bits u or check bits c, due to the aforementioned properties and selection of the elements of the sub-matrices.

The following part of the specification describes two special cases of the proposed error correction and detection in more detail. FIGS. 18 to 27 and the accompanying description relate to an error correcting code with 1-bit correction and address error detection. FIGS. 28 to 37 relate to an error correcting code with two-bit correction or more-bit correction and address error detection. The term "two-bit correction" typically means that a single erroneous bit or two erroneous bits can be corrected. In an analogue manner, the term "multi-bit correction" typically means that all errors from a single erroneous bit to a maximal correctable number of t erroneous bits can be corrected.

The suggestions described below in connection with FIGS. 18-27 may aim, for example, at facilitating the design of an error correction code (ECC) with a very high probability of address error detection (or more generally: identification data error detection), of All-0 detection and All-1 detection for an ECC with 1-bit error correction, 2-bit error detection with the same number of check bits which are typically needed by an ordinary Hsiao Code.

The data bits may be stored unmodified in the memory.

Without address error detection, the following may happen: If an address error occurs, data are read from an erroneous address location and these data may be completely different from the requested data. Therefore it is desirable to detect address errors with high probability. If an address error is mapped to an error syndrome of a correctable error or to the error syndrome 0, the address error might not be detected and consequently result in a miscorrection or in no correction.

Furthermore, it may also be desired that All-0 and All-1 situations can be detected for an arbitrary address. Accordingly, the problems that might be solved are:

to achieve a high probability for address error detection simultaneously to guarantee All-0 and All-1 detection for arbitrary addresses with 100% to use no more check bits than for an ordinary Hsiao Code.

As alternatives to the solution(s) proposed herein, in particular with respect to FIGS. 18-27, additional ROMs may be used for regeneration of the addresses from active word lines and bit lines and to compare the regenerated addresses with the applied addresses. However, these additional ROMs are typically relatively costly.

As another alternative, in case of 2-bit ECC, additional check bits may have to be added, to guarantee the necessary high error detection probability for the arbitrary address errors since a relatively large number of arbitrary errors might be mapped to 1-bit and 2-bit error syndromes or in general to t-bit error syndroms. The costs are typically a large wordlength of the memory.

According to the suggestions that will be described in more detail in connection with FIGS. 18-27, the H-matrix of the code is designed such that an arbitrary address fault is never mapped to a syndrome of a correctable error of the data bits or check bits. This property is independent of the used address.

Only the few address errors mapped to the syndrome 0 are not detected. An address error detection of 99.2% for 256 data bits and of 96.875% for 64 bits can be achieved without enlarging the number of check bits for the ordinary Hsiao Code.

Addresses may be mapped to fewer compacted address bits. It is possible to map arbitrary addresses to compacted address bits which are always $\neq 0$ for arbitrary addresses. The number of compacted address bits may be equal to the number of check bits minus 2 of the code. Address errors are also mapped to errors in the compacted address bits. The submatrix of the H-matrix corresponding to the compacted address bits may be denoted by $H^A$. The columns of the sub-matrix $H^A$ of the H-matrix corresponding to the compacted address bits are linearly independent.

According to some examples for implementation, the first two rows of the sub-matrix $H^a$ (or of the matrix $H^A$) are both All-1 rows. The XOR-sum of the columns of the H-matrix corresponding to the data and check bits is 0. It can be shown that All-1 or All-0 is mapped to a non-correctable error of the code for an arbitrary address.

The columns of the sub-matrix $H^c$ corresponding to the check bits may be an identity matrix and the H-matrix is in the systematic form. Therefore, data bits can be directly written into the memory and read also unchanged from the memory. The proposed solution is typically relatively cost effective with no additional check bits or ROMs needed.

The decoder is designed such that no address error is mapped to a syndrome of a correctable error. The decoder may be further designed such that All-1 and All-0 has a syndrome of a non-detectable error for an arbitrary address. The addresses may be compacted for fewer compacted address bits which are always $\neq 0$. An address error may be mapped to an error of the compacted address bits.

Figure 18:
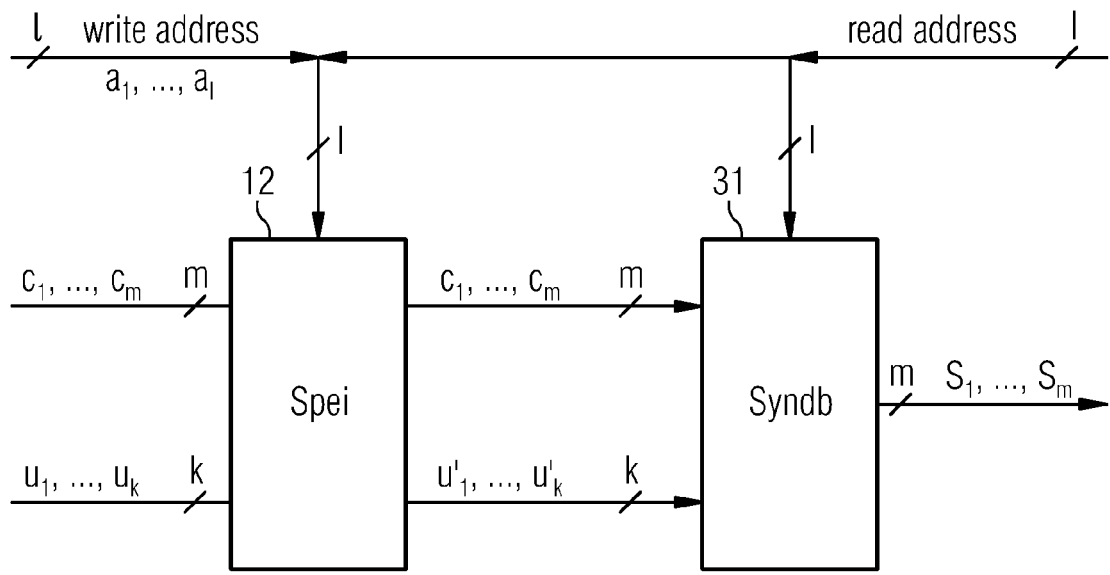
FIG. 18 schematically shows a circuitry with an addressable memory and a connected syndrome generator arrangement, FIG. 19 schematically shows a syndrome generator arrangement with a syndrome generator and a combinational circuit for compacting a read address, FIG. 20 schematically shows a circuitry using a first combinational circuit compacting the write address and a second combinational circuit for compacting the read address, FIG. 21 schematically shows a special implementation example of the invention, wherein various sub circuits are used commonly for both when writing and reading data, FIG. 22 schematically shows the sub circuits of FIG. 4, that are active during reading, FIG. 23 schematically shows the sub circuits of FIG. 4, that are active during writing, FIG. 24 schematically shows a syndrome generator arrangement and an error detection circuit downstream thereof, FIG. 25 schematically shows an illustration of a special implementation example of an error detection circuit comprising two sub circuits, FIG. 26 schematically shows a circuitry for compacting of address bits, FIG. 27 schematically shows a circuitry for modifying of, for example, linearly compacted address bits in non-linearly compacted address bits.

FIG. 18 schematically shows a circuitry comprising an addressable memory with a syndrome generator arrangement connected to the addressable memory. An error syndrome $S=S_1, \ldots, S_m$ is produced by the syndrome generator arrangement.

A code word of an error correcting code C is stored in a memory Spei 12. The memory Spei 12 has k+m binary data inputs, via which m check bits $c_1, \ldots, c_m$ and k data bits $u_1, \ldots, u_k$ are provided as input to the memory Spei, which are stored under (or at) the write address $a_1, \ldots, a_l$. The write address $a_1, \ldots, a_l$ is applied to the l bit wide address line of the memory. The check bits $c_1, \ldots, c_m$ are determined on the basis of the k data bits $u_1, \ldots, u_k$ and the address bits $a_1, \ldots, a_l$ of the write address in a unambiguous manner, as will be described below.

When reading the possibly erroneous check bits $c'_1, \ldots, c'_m$ and the possibly erroneous data bits $u'_1, \ldots, u'_k$ from the memory Spei 12 under a read address $a'_1, \ldots, a'_l$, the possibly erroneous check bits $c'_1, \ldots, c'_m$ and the possibly erroneous data bits $u'_1, \ldots, u'_k$ are presented at the m+k binary inputs of a syndrome generator arrangements Syndb 31. The syndrome generator arrangements Syndb 31 comprises further l binary inputs at which the read address $a'_1, \ldots, a'_l$ is provided, under which the possibly erroneous check bits and possibly erroneous data bits have been read out from the memory Spei 12. The syndrome generator arrangement Syndb 31 outputs, on the basis of the inputted data bits $u'_1, \ldots, u'_k$, the check bits $c'_1, \ldots, c'_m$ and the address bits $a'_1, \ldots, a'_l$ of the read address, a m-component error syndrome $S_1, \ldots, S_m$.

The syndrome generator arrangement Syndb 31 is configured such that the error syndrome of an arbitrary error in the read address is different from all syndroms of a 1-Bit error (or of 1-bit errors) in the data bits or in the check bits. Since 1-Bit errors in the data bits and in the check bits are correctable using the code C, it may be desirable that an arbitrary address error that shall be detected, but shall not result in a correction of the data bits or check bits, is different in its error syndrome from the error syndrome of each 1-bit error in the data bits and the check bits.

Figure 19:
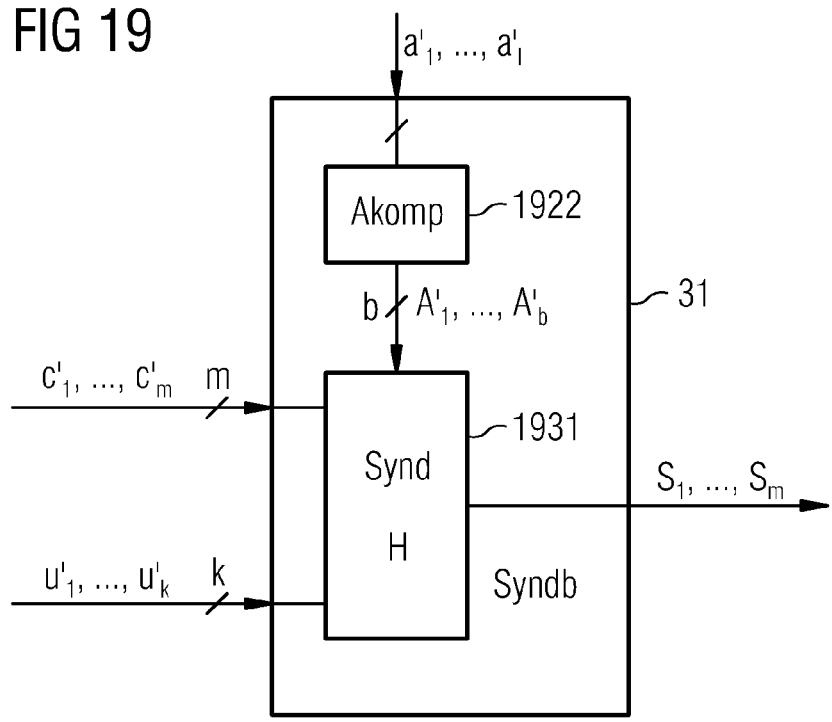

FIG. 19 schematically shows a special implementation example of a syndrome generator arrangement Syndb 31. The syndrome generator arrangement Syndb 31 comprises a syndrome generator Synd 1931 with k inputs for inputting the possibly erroneous data bits $u'_1, \ldots, u'_k$, m inputs for inputting the possibly erroneous check bits $c'_1, \ldots, c'_m$, and b binary inputs for the input of b compacted bits $A'_1, \ldots, A'_b$ derived from the address bits of the read address $a'_1, \ldots, a'_l$ with l>b. The syndrome generator Synd 1931 further comprises m binary outputs for outputting the error syndrome $S_1, \ldots, S_m$ and a combinational circuit Akomp 1922 for compacting the address bits with l inputs and b outputs, which are connected with b corresponding inputs of the syndrome generator Synd.

When the bits of the read address $a'_1, \ldots, a'_l$ are presented at the input(s) of the combinational circuit Akomp 1922 for compacting of the address bits, then this circuit outputs at its output the bits $A_1, \ldots, A'_b$ of the compacted address. The combinational circuit Akomp 1922 is configured that the bits $A'_1, \ldots, A'_b$ are determined according to the relation $$A'_1, \ldots, A'_b = F(a'_1, \ldots, a'_l),$$

wherein F is a function that maps l-tuple binary values in b-tuple binary values, wherein special useful implementation examples of the function F will be described below.

The syndrome generator Synd 1931 is in this implementation example configured so that it outputs an error syndrome $S_1, \ldots, S_m$, that is determined by $$S_1, \ldots, S_m = H \cdot (c'_1, \ldots, c'_m, u'_1, \ldots, u'_k, A'_1, \ldots, A'_b)^T,$$

wherein H is a H-matrix of the code C, wherein in this implementation example the H-Matrix is considered in its systematic form. Note that the columns (or generally, the elements) of H-matrix Hcould be arranged in a different manner so that the order of check bits c, the information bits u, and the compacted address bits A may be changed.

Accordingly, the error syndrome $S_1, \ldots, S_m$ may be alternatively determined by $$S_1, \ldots, S_m = H \cdot (u'_1, \ldots, u'_k, A'_1, \ldots, A'_b, c'_1, \ldots, c'_m)^T,$$

for example.

Figure 20:
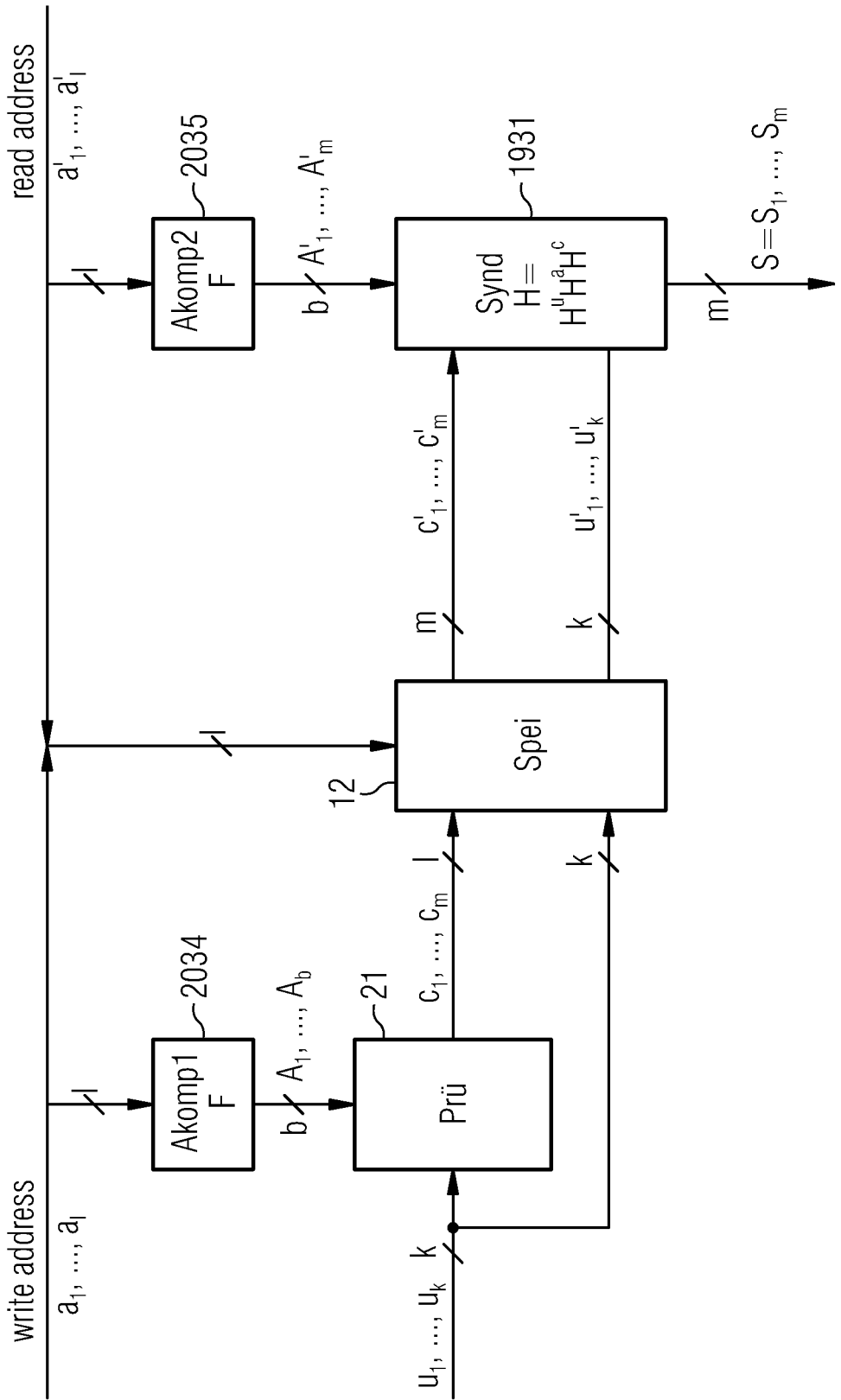

FIG. 20 schematically shows an implementation example of the invention. The circuitry of FIG. 20 comprises the combinational circuit Akomp1 2034 for compacting the write address $a_1, \ldots, a_l$ in compacted address bits $A_1, \ldots, A_b$, the combinational circuit Akomp2 2035 for compacting the read address $a'_1, \ldots, a'_l$ in compacted address bits $A'_1, \ldots, A'_b$, a combinational circuit Prü 21 (similar to the coder in systematic form 21) for forming m check bits $c_1, \ldots, c_m$ from the data bits $u_1, \ldots, u_k$ and the compacted address bits $A_1, \ldots, A_b$ of the write address, a memory Spei 12 with m+k data inputs for inputting the check bits $c_1, \ldots, c_m$ and the data bits $u_1, \ldots, u_k$ with m+k data outputs for outputting the possibly erroneous check bits $c'_1, \ldots, c'_m$ and the possibly erroneous data bits $u'_1, \ldots, u'_k$ and a l bit wide address input for inputting a write address $a_1, \ldots, a_l$ or read address $a'_1, \ldots, a'_l$, and a syndrome generator Synd 33 with k+m+b inputs for inputting the possibly erroneous data bits $u'_1, \ldots, u'_k$, the possibly erroneous check bits $c'_1, \ldots, c'_m$ and the compacted address bits $A'_1, \ldots, A'_b$, and m binary outputs for outputting the error syndrome $S=S_1, \ldots, S_m$.

The address line, that carries the write address, is connected with the l-component input of the combinational circuit Akomp1 2034 and is also fed into the address input of the memory Spei 12. The data line which carries the data bits $u_1, \ldots, u_k$ is connected to both the k first inputs of the combinational circuit Prü 21 for forming the check bits and also such to k first data inputs of the memory Spei 12. The b bit wide output of the combinational circuit Akomp1 2034 is fed to the further b binary inputs of the combinational circuit Prü 21. The m bit wide output of the circuit Prü 21 is connected with the further m data inputs of the memory Spei 12.

When the write-signal is active, the data provided at the data inputs of the memory are written to the memory at the provided address. The write-signal is not depicted in FIG. 20.

The address line that carries the read address is connected with the l-component input of the combinational circuit Akomp2 2035 and also fed to the address input of the memory Spei 12.

The first m data outputs of the memory Spei 12 carrying the possibly erroneous check bits $C'_1, \ldots, c'_m$ are connected with m first inputs of the syndrome generator Synd 1931. The further k data outputs of the memory Spei 12 carrying the possibly erroneous data bits $u'_1, \ldots, u'_k$ are connected with further k inputs of the syndrome generator Synd 1931. The output of the combinational circuit Akomp2 2035 is connected with the further b inputs of the syndrome generator Synd 1931. When the read-signal is active, the data stored at the applied address are output to the corresponding data outputs of the memory. The read-signal is not depicted in FIG. 20.

The combinational circuit Akomp1 2034 is configured so that it forms the compacted bits $A_1, \ldots, A_b$ according to the relation $$A_1, \ldots, A_b = F(a_1, \ldots, a_l)$$

on the basis of the write address $a_1, \ldots, a_l$, wherein F is a combinational function that maps l-tuple binary values to b-tuple binary values.

The combinational circuit Akomp2 2035 is configured so that it forms the compacted bits $A'_1, \ldots, A'_b$ according to the relation $$A'_1, \ldots, A'_b = F(a'_1, \ldots, a'_l)$$

on the basis of the read address $a'_1, \ldots, a'_l$, wherein F is the same combinational function as it is implemented for the circuit Akomp1 2034. Useful implementation examples of the function F are described below.

The syndrome generator Synd 1931 is configured so that it forms the error syndrome S using the H-matrix of the code C according to the relation $$S = H \cdot [c'_1, \ldots, c'_m, u'_1, \ldots, u'_k, A'_1, \ldots, A'_b]^T,$$

wherein H has the form $$H = (H^c, H^u, H^A),$$

$H^c$ is a m-dimensional identity matrix, $H^u = (h_1^u, \ldots, h_k^u)$ is a (m, k)-matrix. The first two components of each column $h_i^u$ are unequal [1,1]. The number of 1-s (ones) in every column of $H^u$ and $H^c$ is odd. Thus $H^c\ H^u$ are forming an H-matrix of a 1-bit-error correction and a 2-bit-error detection Hsiao-Code. The matrix $H^A = h_1^A, \ldots, h_b^A$ is a (m, b)-matrix for which the following holds:

$$H^A = (h_1^A, \ldots, h_b^A) = \begin{pmatrix} \overbrace{1, \ldots, 1}^{b} \\ \overbrace{1, \ldots, 1}^{b} \\ I_b \end{pmatrix} \quad (11)$$

with b=m−2 and each column of the matrix H having an odd number of ones. $I_b$ is the b-dimensional identity matrix. The matrix $H^A$ corresponds approximately to the matrix $H^a$ mentioned above, where instead of the address bits $a_1, \ldots, a_l$ compacted address bits $A_1, \ldots, A_b$ are used.

We shall now demonstrate: if the error syndrome of an address error of the read address is unequal 0, then it is different from every error syndrome of 1-Bit errors in the data bits or in the check bits.

Assume $a_1, \ldots, a_l$ with $A_1, \ldots, A_b = F(a_1, \ldots, a_l)$ to be the correct read address and, in case of an address error $\phi$, $a_1^f, \ldots, a_l^f$ with $A_1^f, \ldots, A_b^f = F(a_1^f, \ldots, a_l^f)$ the erroneous read address, then the difference $\Delta A_1, \ldots, \Delta A_b$ of the compacted, correct read address and the compacted erroneous read address is equal to $$\Delta A_1, \ldots, \Delta A_b = A_1 \oplus A_1^f, \ldots, A_b \oplus A_b^f.$$

The error syndrome $s_\phi$ corresponding to the address error $\phi$, ist then $$\begin{aligned} s_\varphi &= H^A \cdot (\Delta A_1, \ldots, \Delta A_b)^T \\ &= s_\varphi \\ &= H^A \cdot (\Delta A_1, \ldots, \Delta A_b) \\ &= \begin{bmatrix} \Delta A_1 \otimes \ldots \otimes \Delta A_b \\ \Delta A_1 \otimes \ldots \otimes \Delta A_b \\ \Delta A_1 \\ \Delta A_2 \\ \vdots \\ \Delta A_b \end{bmatrix}. \end{aligned} \quad (12)$$

We shall now consider two cases:
The number of the ones in $\Delta A_1, \ldots, \Delta A_b$ is even.
According to equation (12) we then have $$s_\varphi = \begin{bmatrix} 0 \\ 0 \\ \Delta A_1 \\ \Delta A_1 \\ \vdots \\ \Delta A_b \end{bmatrix}, \quad (13)$$

and $s_\varphi$ exhibits an even number of ones. However, each column of the matrices $H^c$ and $H^u$ has an odd number of ones. Since each 1-bit error in the data or in the check bits corresponds to an error syndrome that is equal to one column of the matrices Hr or $H^u$, the error syndrome $s_\varphi$ is unequal to each error syndrome of a 1-bit error in the data bits or the check bits.

The number of the ones in $\Delta A_1, \ldots, \Delta A_b$ is odd.
According to equation (12) we then have $$s_\varphi = \begin{bmatrix} 1 \\ 1 \\ \Delta A_1 \\ \Delta A_1 \\ \vdots \\ \Delta A_b \end{bmatrix}. \quad (14)$$

The first two components of $s_\varphi$ are now equal to [1,1]. Since the first two components of each column of the matrices $H^c$ and $H^u$ are unequal [1,1] in each case (i.e., for each column), the error syndrome $s_\varphi$ is different from every error syndrome of a 1-bit error in the data bits or check bits.

It is of course possible to interchange or swap individual rows of the H-matrix H without changing the spirit of the invention. The arrangement of the rows of the H-matrix H, and consequently also in the matrix $H^A$ have been chosen herein in order to facilitate a simple and comprehensible description. It is possible to interchange or swap the first row with the fourth row. Consequently the second row and the fourth row of the matrix $H^A$ will present all ones in this case, and the swapped new first row is then the previous fourth row $$\underbrace{0, 1, 0 \ldots, 0}_{b},$$

and so on.

Figure 21:
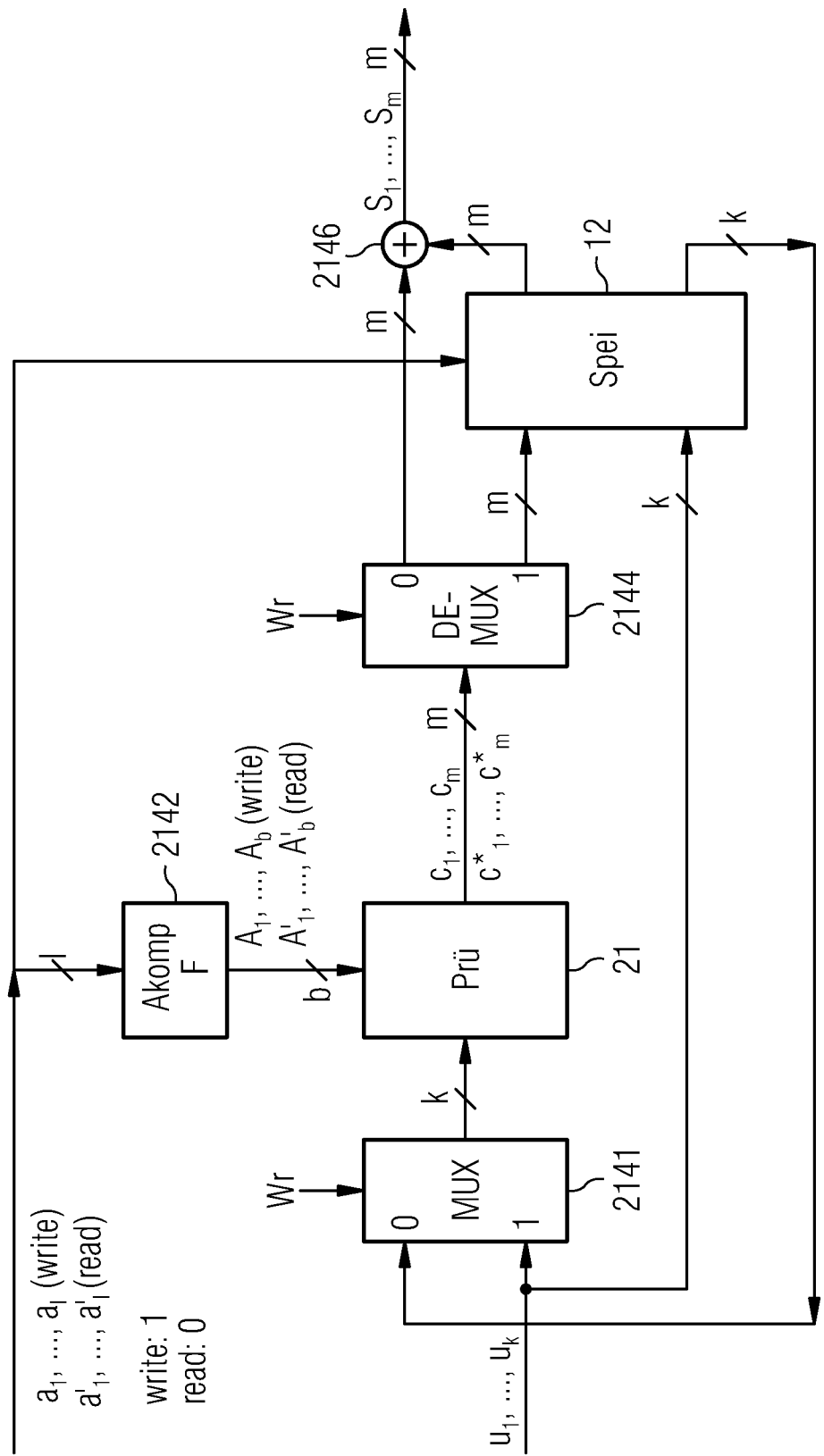

FIG. 21 schematically shows a special implementation example of the invention.

Circuit portions or sub circuits that are implemented in a separate manner in the implementation example of FIG. 20, are implemented in a partially joint manner in FIG. 21.

The circuitry in FIG. 21 comprises
a combinational circuit Akomp 2142 for compacting both a write address $a_1, \ldots, a_l$ in corresponding compacted address bits $A_1, \ldots, A_b$, as well as a read address $a'_1, \ldots, a'_l$ in corresponding compacted bits $A'_1, \ldots, A'_b$,
a multiplexer MUX 2141 having a control input to which a binary control signal w/r (write/read) is fed, which assumes the value "1" when the write signal w is active, and assumes the value "0" when the read signal r is active, and which connects its 1-input (first multiplexer input) with its output, when the control signal is equal 1, and connects its 0-input (second multiplexer input) with its output, when the control signal assumes the value "0",
a check bit former Prü 21 with b+k binary inputs and m binary outputs for determining check bits. The check bit former Prü 21 forms the check bits $c_1, \ldots, c_m$ on the basis of the compacted address bits $A_1, \ldots, A_b$ and the data bits $u_1, \ldots, u_k$ when the write signal w is active. When the read signal r is active, the check bit former Prü 21 determines the check bits $c^*_1, \ldots, c^*_m$ on the basis of the compacted address bits $A'_1, \ldots, A'_b$ and on the basis of the data bits $u'_1, \ldots, u'_k$ read out from the memory Spei 12,
a demultiplexer DEMUX 2144 with m binary inputs and a first and a second output, each m bit wide, wherein the demultiplexer DEMUX 2144 comprises a control input to which the binary control signal w/r (write/read) is applied. When the write signal w is active, the binary control signal w/r assumes the value 1 and when the read signal is active, the binary control signal w/r assumes the value 0. The demultiplexer DEMUX 2144 is configured to connect its input with its 1-output (first demultiplexer output), when the control signal is equal 1, and to connect its input with its 0-output, when the control signal assumes the value 0,
a memory Spei 12 with k+m data inputs for inputting the data bits $u_1, \ldots, u_k$ to be written and the corresponding check bits $c_1, \ldots, c_m$, with k+m data outputs for outputting the possibly erroneous data bits $u'_1, \ldots, u'_k$ to be read and the corresponding possibly erroneous check bits $c'_1, \ldots, c'_m$, and l address inputs for inputting a write address $a_1, \ldots, a_l$ or a read address $a'_1, \ldots, a'_l$,
and a XOR-circuit 2146 with 2·m binary inputs and m binary outputs for componentwise XOR-combining the check bits $c'_1, \ldots, c'_m$ and $C^*_1, \ldots, c^*_m$ to an error syndrome $$S_1, \ldots, S_m = c'_1 \oplus c^*_1, \ldots, c'_m \oplus c^*_m.$$

The address line which carries the write address $a_1, \ldots, a_l$ when writing or the read address $a'_1, \ldots, a'_l$ when reading, is connected with the l bit wide input of the combinational circuit Akomp 2142. This combinational circuit 2142 outputs at its output the compacted bits $A_1, \ldots, A_b$ of the write address or the compacted bits $A'_1, \ldots, A'_b$ of the read address, respectively. The circuit Akomp 2142 is configured to determine the compacted bits according to the relation $$A_1, \ldots, A_b = F(a_1, \ldots, a_l)$$

and $$A'_1, \ldots, A'_b = F(a'_1, \ldots, a'_l).$$

In this context F is a combinational function that maps the l-tuple binary values to b-tuple binary values, wherein b<l.

Furthermore the address line which carries upon writing the write address $a_1, \ldots, a_l$ or upon reading the read address $a'_1, \ldots, a'_l$ is connected with the l bit wide address input of the memory Spei 12.

The b bit wide output of the combinational circuit Akomp 2142 is connected with first b binary inputs of the check bit former 2143.

The m bit wide output of the check bit former 21 is connected with the m-bit wide input of the demultiplexer DEMUX 2144. The m bit wide first output of the demultiplexer DEMUX 2144 is connected with m first data inputs of the memory Spei 12, further k data inputs of which are connected with the input line that carries the data bits $u_1, \ldots, u_k$ and which is in addition connected to the 1-input of the multiplexer MUX 2141.

The m bit wide 0-output of the demultiplexer DEMUX 2144 is fed to a first m bit wide input of the XOR-circuit 2146, of which a second m bit wide input is connected with the first m data outputs of the memory Spei 12, which outputs upon reading the possibly erroneous check bits $c'_1, \ldots, c'_m$, and which in the case of the reading operation are combined in the XOR-circuit 2146 with the bits $c^*_1, \ldots, c^*_m$ to yield the error syndrome $S_1, \ldots, S_m$, which is provided at the output of the XOR-circuit.

When reading, the possibly erroneous data bits $u'_1, \ldots, u'_k$ that are provided to the 0-input of the multiplexer MUX 2141, are output at the second k bit wide output of the memory Spei 12. When reading, the 0-input of the multiplexer 2141 is connected with its output so that the possibly erroneous data bits $u'_1, \ldots, u'_k$ are provided at the second k bit wide input of the check bit former Prü 21. The compacted bits $A'_1, \ldots, A'_b$ are provided at the first b bit wide input of the check bit former Prü 21.

The check bit former Prü 21 is configured to form the check bits $c^*_1, \ldots, c^*_m$ according to the relation $$c^*_1, \ldots, c^*_m = (u'_1, \ldots, u'_k, A'_1, \ldots, A'_b) \cdot P$$

and provides them at its output. In this context, P designates the parity matrix of the contemplated code C.

When writing, the 1-input of the multiplexer 2141 is connected with its output so that the data bits $u_1, \ldots, u_k$ are provided at the second, k bit wide input of the check bit former Prü 21. Now the compacted bits $A_1, \ldots, A_b$ are provided at the first b bit wide input of the check bit former Prü 21. The check bit former Prü 21 is configured so that it forms the check bits $C_1, \ldots, C_m$ according to the relation $$c_1, \ldots, c_m = (u_1, \ldots, u_k, A_1, \ldots, A_b) \cdot P$$

and provides them at its output.

Figure 22:
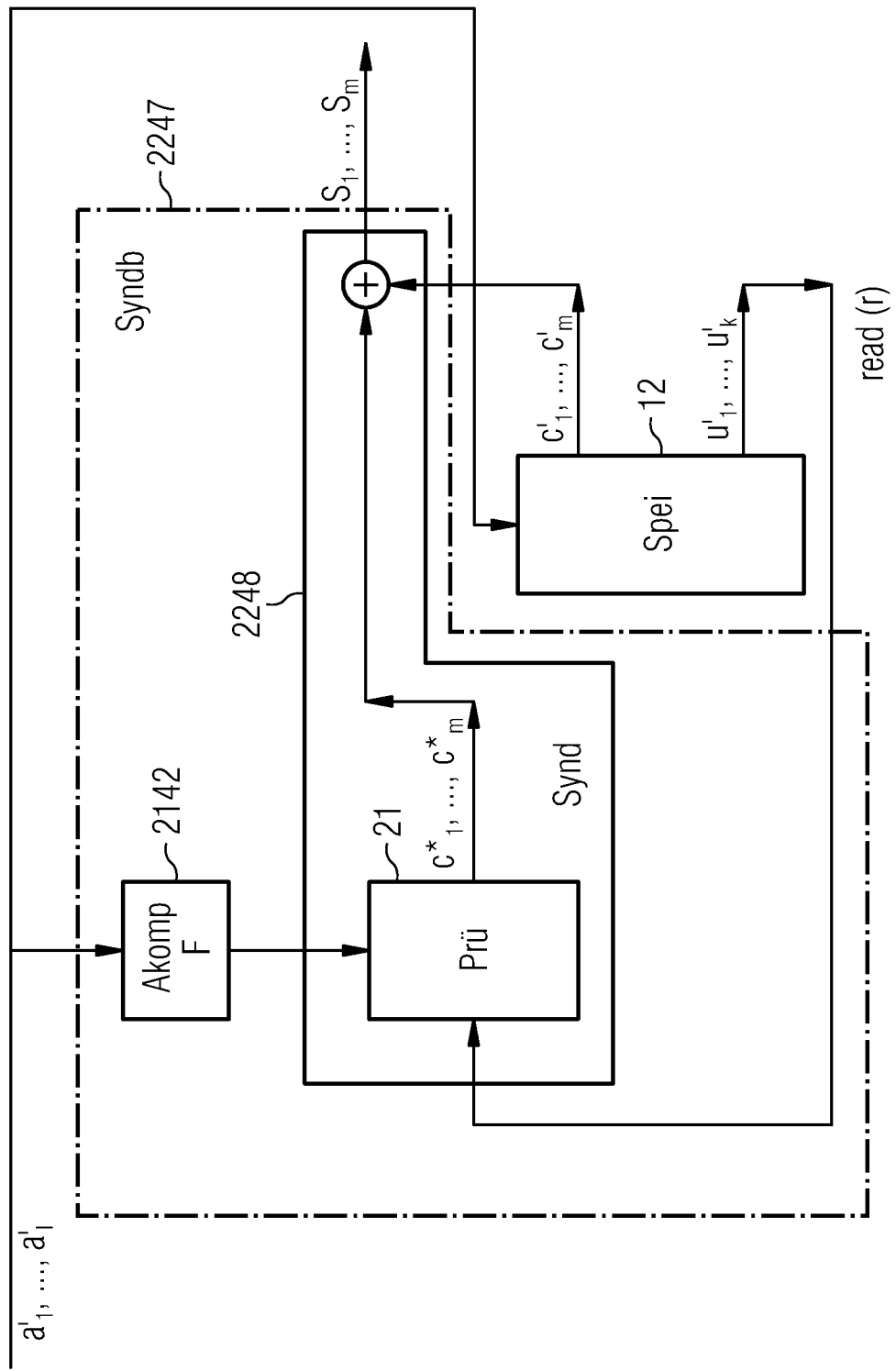

FIG. 22 illustrates the reading of data from the memory Spei 12. The circuit components of FIG. 22 are designated with the same reference numerals as in FIG. 21.

Since the multiplexer MUX 2141 in FIG. 21 connects its 0-input with its output when the control signal "reading" (r) is active, the data output of the memory Spei 12 from FIG. 21 carrying the possibly erroneous data bits $u'_1, \ldots, u'_k$ is in FIG. 22 connected directly with the second k bit wide input of the check bit former Prü 21.

Since the demultiplexer DEMUX 2144 in FIG. 21 connects its input with its 0-output when the control signal "reading" (r) is active, the output of the check bit former 21 in FIG. 22, which carries the bits $c^*_1, \ldots, c^*_m$, is connected directly with the first input of the XOR-circuit 2146. The possibly erroneous check bits $c'_1, \ldots, c'_m$ provided by the memory 12 are provided at the second input of the XOR-circuit 2146.

In FIG. 22 it is illustrated that the check bit former Prü 21 and the XOR-circuit 2146 form a syndrome generator Synd 2248 of the contemplated systematic code C and that the combinational circuit Akomp 2142, the check bit former Prü 21 and the XOR-circuit 2146 form a syndrome generator arrangement Syndb 2247.

Figure 23:
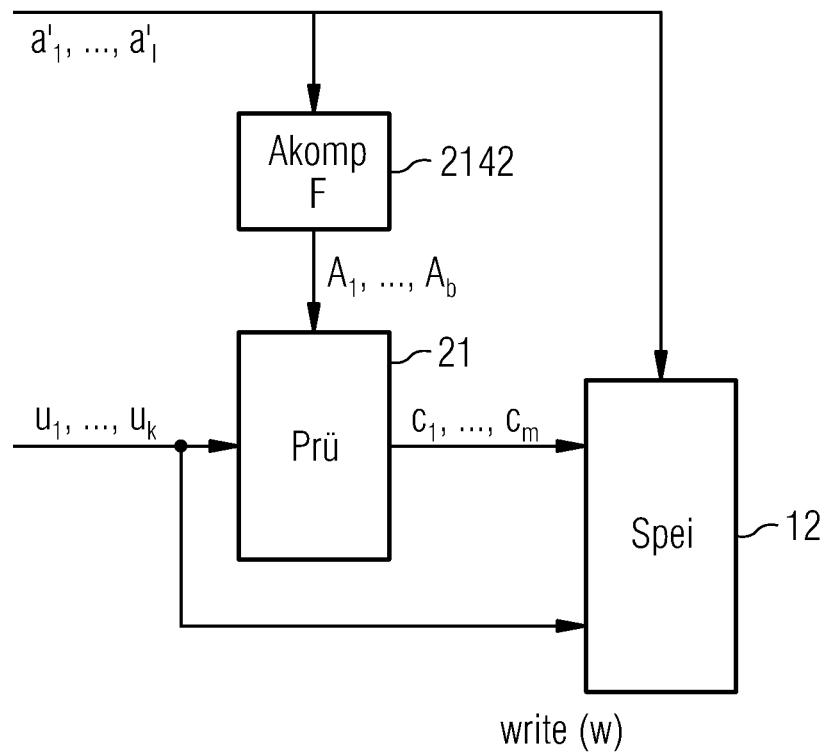

FIG. 23 illustrates the writing of data in the memory Spei 12 of the circuitry of FIG. 21.

The circuit components of FIG. 23 are designated with the same reference numerals as in FIG. 21.

Since the multiplexer MUX 2141 in FIG. 21 connects its 1-input with its output when the control signal w is active, the data input carrying the data bits $u_1, \ldots, u_k$ is connected in FIG. 23 directly with the second k bit wide input of the check bit former Prü 21. The compacted bits $A_1, \ldots, A_b$, which are output by the combinational circuit Akomp 2142, are provided at the first b inputs of the check bit former Prü 21. The combinational circuit Akomp 2142, which upon reading is part of the syndrome generator arrangement 2247 in FIG. 22, serves for the formation of the compacted bits $A_1, \ldots, A_b$ on the basis of the write address $a_1, \ldots, a_l$ upon writing. FIG. 23 illustrates that this portion of the circuit is used commonly upon writing and upon reading in the illustrated implementation example of the invention. The check bit former Prü 21 outputs the check bits $c_1, \ldots, C_m$ at its m bit wide output, which are applied along with the data bits $u_1, \ldots, u_k$ to the data inputs of the memory 12. The check bit former 21 is also commonly used upon writing and reading.

In case the circuitry, as it is for example illustrated in FIG. 21, is optimized using a synthesis tool, gates of the circuit are then usually used jointly in different circuit portions, as it is common in circuit design, so that partial circuits are implemented at least in part in a joint or common manner.

Figure 24:
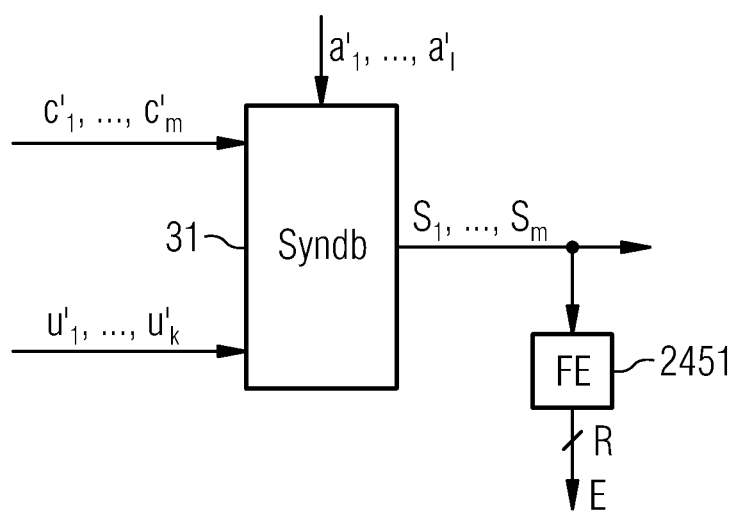

FIG. 24 schematically illustrates a syndrome generator arrangement Syndb 31 of FIG. 18. An error syndrome $S_1, \ldots, S_m$ is output at the output of the syndrome generator arrangement Syndb 31 and an error detection circuit FE 2451 is connected to the output of the syndrome generator arrangement Syndb 31. The error detection circuit FE 2451 has a m bit wide input and a R bit wide output wherein R≥1. In this implementation example the syndrome generator arrangement Syndb 31 is configured so that it generates different syndromes for all 1-Bit errors in the data bits and check bits, which are also different from the syndromes of all 2-Bit errors in the data bits and the check bits. If the number of 1s in all columns of the H-matrix is odd, the considered code is a shortened Hsiao-Code.

Then the error detection circuit FE 2451 may be configured to output, for each syndrome of a 1-Bit-error in the data bits or check bits that is equal to a column of the H-matrix of the contemplated code C, a first value $E_1$, and to output a value $E_0$ different to the first value $E_1$, when the error syndrome is equal 0, and to output a further value $E_2$, when the syndrome is unequal 0 and assumes a value that is not equal to a column of the matrices $H^u$ or $H_c$. The value $E_2$ indicates an uncorrectable error when the code C is a 1-bit error correcting and 2-Bit error detecting shortened Hsiao code.

Only those multi-bit errors that are mapped to a syndrome equal 0 are not detected, and only those multi-bit errors that are mapped to a syndrome, which is equal to one of the columns of the H-matrix, which are assigned to the data bits or the check bits, are corrected erroneously. All further multi-bit errors are detected as uncorrectable errors. In other words: When multi-bit errors are mapped to a syndrome that does not correspond to any column of the H-matrix relative to the data bits or the check bits, these multi-bit errors are indicated as non-correctable (uncorrectable) errors.

In the described implementation example it holds that R=2. It is also possible that the error detection circuit outputs a first value $E_0$ when the error syndrome is equal 0 and when the error syndrome is the error syndrome of a correctable error, and outputs a second value $E_1$ different from the first value when via the error syndrome an error is indicated that is not correctable by the code. In this case it is possible to choose R=1.

Figure 25:
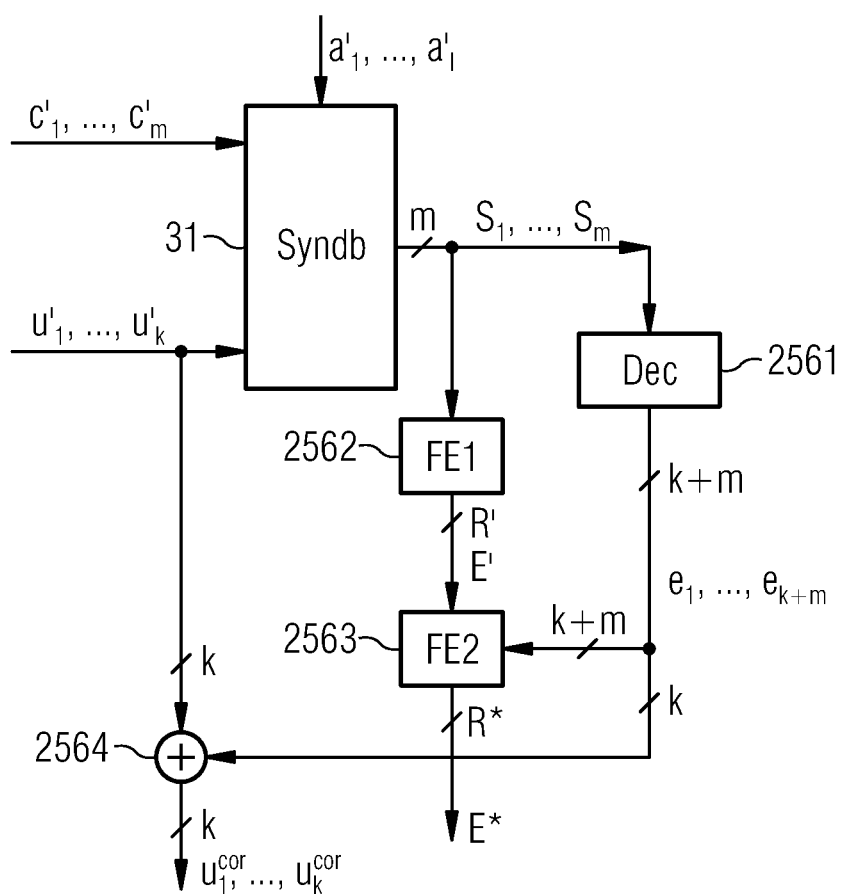

FIG. 25 schematically shows a special implementation example of error detection and error correction. A syndrome generator arrangement Syndb 31 of FIG. 18 provides at its output an error syndrome $S_1, \ldots, S_m$, wherein this output is connected with the input of a decoder Dec 2561 and simultaneously with the input of a first error detection circuit FE1 2562. The R' bit wide output of the first error detection circuit FE1 2562 which carries the error signal E' is connected with a R' bit wide input of a second error detection circuit FE2 2563, a second k+m bit wide input of which is connected to the k+m bit wide output of the decoder Dec 2561, and which provides at its R* bit wide output an error signal E*. The k first output lines of the decoder Dec 2561, which carry the correction values $e_1, \ldots, e_k$ for the possibly erroneous data bits $u'_1, \ldots, u'_k$, are fed to a first k bit wide input of a XOR circuit 2564. The values $u'_1, \ldots, u'_k$ are provided at the second input of the XOR circuit 2564 which has a width of k bits, too. The XOR circuit 2564 provides at its k bit wide output the corrected data bits $$u_1^{cor}, \ldots, u_k^{cor} = u'_1 \oplus e_1, \ldots, u'_k \oplus e_k.$$

In this implementation example it is assumed, that all columns of the H-matrix of the used code C present an odd number of ones and are pairwise different, wherein however not all possible columns with an odd number of ones and m components actually occur as columns of the H-matrix, because the code is a so called shortened Hsiao-code.

All 1-Bit errors in the data bits or the check bits can be corrected.

The error detection circuit FE1 2562 is here configured that it determines a first value $E'_0$ when the error syndrome is equal 0, that it determines a second, different value $E'_1$ when the error syndrome exhibits an odd number of ones, and that it determines a third value $E'_2$, when the error syndrome is unequal to 0 and presents an even number of ones.

In case a 1-Bit error occurs in the data bits or the check bits, then the error syndrome exhibits an odd number of ones, and error signal output by the error detection circuit FE1 is equal $E'_1$.

However, it is also possible that an error syndrome occurs with an odd number of ones in the case of a multi-bit error, for example a 3-Bit error or a 5-Bit-error. In this situation it is possible that a multi-bit error corresponds to an error syndrome with an odd number of ones, which does not appear as column of the H-matrix. By using the error detection circuit FE2 2563 such a case can be detected.

The error detection circuit FE2 2563 is here configured that it checks whether actually a single correction signal $e_1, \ldots, e_{k+m}$ equal 1 has been produced by the decoder Dec 2561, when the first error detection circuit FE1 2562 determines a value $E'_1$. In this manner it can be excluded that a multi-bit error, that results in an error syndrome with an odd number of ones, but that is not equal to any column of the H-matrix corresponding to the data bits or the check bits, is erroneously indicated as a correctable 1-bit error.

The error detection circuits FE1 2562 and FE2 2563 together form an error detection circuit, that generate an error signal on the basis of the error syndrome and of the decoder-determined correction signals.

Figure 26:
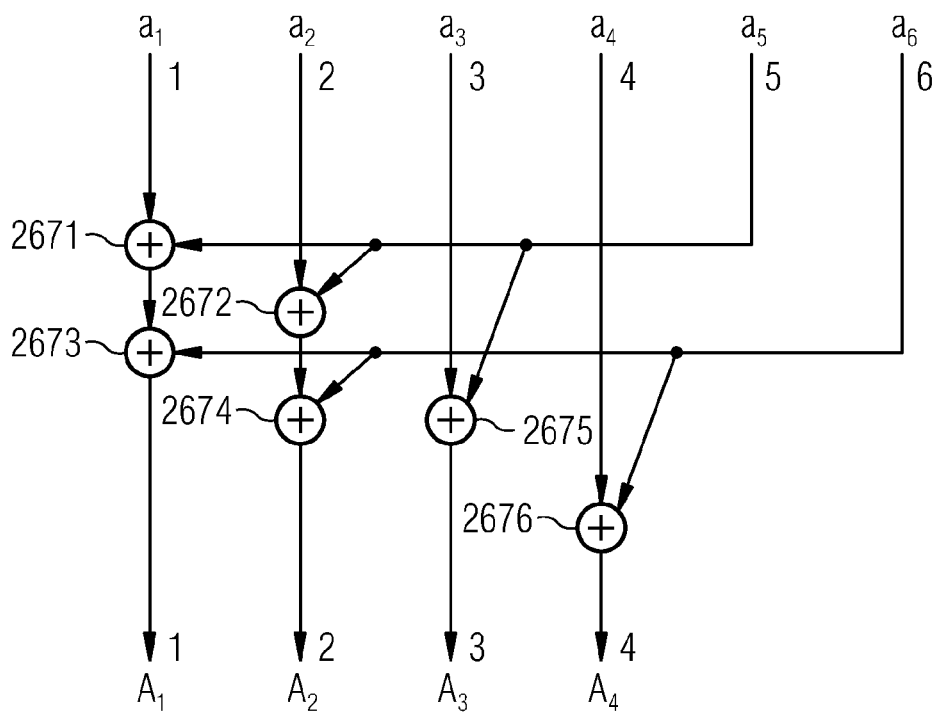

FIG. 26 schematically shows an implementation example of a combinational circuit Akomp, which implements the transformation (or compaction) of the address bits of the write address $a_1, \ldots, a_6$ in compacted bits $$A_1, \ldots, A_4 = F(a_1, \ldots, a_6) = [F_1(a_1, \ldots, a_6), \ldots, F_4(a_1, \ldots, a_6)].$$

Hence, l=6 and b=4 is considered in this implementation example.

The compaction is performed in this implementation example according to the relation $$(A_1, \ldots, A_4)^T = K \cdot (a_1, \ldots, a_6)^T \quad (15)$$

with $$K = \begin{pmatrix} 1 & 0 & 0 & 0 & 1 & 1 \\ 0 & 1 & 0 & 0 & 1 & 1 \\ 0 & 0 & 1 & 0 & 1 & 0 \\ 0 & 0 & 0 & 1 & 0 & 1 \end{pmatrix}, \quad (16)$$

so that $$A_1 = a_1 \oplus a_5 \oplus a_6 = F_1(a_1, \ldots, a_6)$$

$$A_2 = a_2 \oplus a_5 \oplus a_6 = F_2(a_1, \ldots, a_6)$$

$$A_3 = a_3 \oplus a_5 = F_3(a_1, \ldots, a_6)$$

$$A_4 = a_4 \oplus a_6 = F_4(a_1, \ldots, a_6).$$

All columns of the matrix K are pairwise different and have an odd number of ones.

The circuitry of FIG. 25 has 6 binary inputs, numbered from 1 to 6, to which the addresses $a_1$ to $a_6$ are provided as inputs and 4 binary outputs, numbered from 1 to 4, and via which the compacted bits $A_1, A_2, A_3, A_4$ are output.

The inputs 1, 5 and 6 are connected, via the XOR gates 2671 and 2673, to the output 1. The inputs 2, 5 and 6 are connected, via the XOR gates 2672 and 2674, to the output 2. The inputs 3 and 5 are connected, via the XOR gate 2675, to the output 3. The inputs 4 and 6 are connected, via the XOR gate 2676, to the output 4.

In some applications it may be useful that during compacting of the address bits in compacted address bits no address is mapped to compacted bits, which are equal to $$\underbrace{0, \ldots, 0}_{b}.$$

The function F may in this case be chosen such that for all combinations $a_1, \ldots, a_l \in \{0,1\}^l$ it holds that $$F(a_1, \ldots, a_l) \neq 0.$$

It is possible to set a first compacted bit of the compacted b bits identical to equal 1 and to compact the address bits $a_1, \ldots, a_l$ onto the remaining b−1 bits, for example using a (b−1, l)-matrix $K^+$ in the form $$(A_2, \ldots, A_b)^T = K^+ \cdot (a_1, \ldots, a_l)^T.$$

It is equally possible to derive compacted bits $A^*_1, \ldots, A^*_b$ from already determined compacted bits $A_1, \ldots, A_b$, such that the new compacted bits $A^*_1, \ldots, A^*_b$ can never assume the value $0, \ldots, 0$.

This approach shall be illustrated using an example of 4 compacted bits.

From the four determined compacted bits, which might possible assume the value 0,0,0,0, the modified compacted bits $A^*_1, A^*_2, A^*_3, A^*_4$ can be formed according to the relation $$A^*_1 A_{1*} = A_1 \vee \overline{(A_1 \vee A_2 \vee A_3 \vee A_4)}$$

$A^*_2 A_{2^*} = A_2$, $A^*_3 A_{3^*} = A_3$, $A^*_4 A_{4^*} = A_4$, so that the following also holds:

$A^*_1 A_{1^*} = F_1(a_1, \ldots, a_6) = (a_1 \oplus a_5 \oplus a_6) \vee$
$\vee \overline{[(a_1 \oplus a_5 \oplus a_6) \vee (a_2 \oplus a_5 \oplus a_6)}$
$\overline{\vee (a_3 \oplus a_5) \vee (a_4 \oplus a_6)]}$ $A^*_2 A_{2^*} = F_2(a_1, \ldots, a_6) = a_2 \oplus a_5 \oplus a_6$, $A^*_3 A_{3^*} = F_3(a_1, \ldots, a_6) = a_3 \oplus a_5$, $A^*_4 A_{4^*} = F_4(a_1, \ldots, a_6) = a_4 \oplus a_6$.

Figure 27:
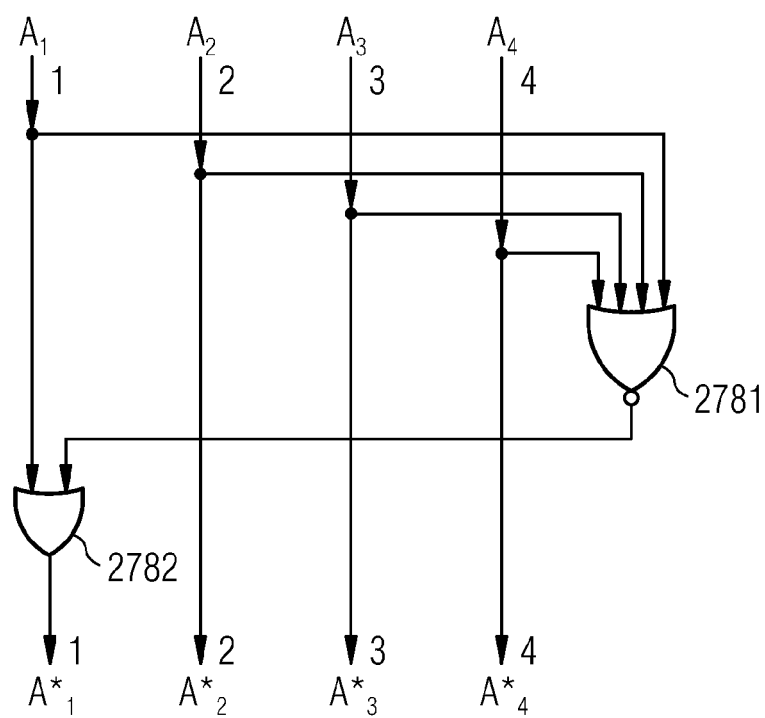

A possible implementation of the determination of the modified compacted bits $A^*_1, A^*_2, A^*_3, A^*_4$ is schematically shown in FIG. 27. The circuitry of FIG. 27 has four inputs 1, 2, 3, and 4, to which are applied the compacted bits $A_1, A_2, A_3$ and $A_4$, and four outputs 1, 2, 3, and 4, via which the modified compacted bits $A^*_1, A^*_2, A^*_3, A^*_4$ are output.

The input 1 is connected with the first input of an OR gate 2782 with two inputs and one output, and also connected with a first input of a NOR gate 2781 with four inputs and an output. The input 2 is connected with the output 2 and with a second input of the NOR gate 2781. The input 3 is connected with the output 3 and with a third input of the NOR gate 2781. The input 4 is connected with the output 4 and the fourth input of the NOR gate 2781, the output of which is fed into the second input of the OR gate 2782. The output of the OR gate 2782 is also the output 1 of the circuitry.

In order to achieve that none of the addresses is compacted to a compacted value $$\underbrace{0, \ldots, 0}_{b},$$

it is possible to set one bit of the compacted bits, for example $A_1$, constant equal 1. This approach shall be explained for an implementation example with six address bits $a_1, \ldots, a_6$, which are to be compacted to four bits, of which $A_1$ is set to $A_1 = 1$.

The remaining compacted bits $A_2, A_3, A_4$ can be determined, for example, according to the relation $$(A_2, A_3, A_4)^T = K^+ \cdot (a_1, \ldots, a_6)^T \quad (17)$$

with $$K^+ = \begin{pmatrix} 100110 \\ 010101 \\ 001011 \end{pmatrix}. \quad (18)$$

All columns of the matrix $K^+$ are pairwise different.

The invention is now explained using an actual or realistic implementation example with 64 data bits $u_1, \ldots, u_{64}$, 8 check bits $c_1, \ldots, c_8$ and 21 address bits $a_1, \ldots, a_{21}$, which are compacted to 6 compacted bits $A_1, \ldots, A_6$, of which the bit $A_1$ is set to constant equal 1.

A shortened Hsiao code C in systematic form is used. All columns of the H matrix of the code C have an odd number of ones.

The code is a 1-bit-error-correcting and 2-bit-error-detecting code.

For address errors an error detection and no error correction is realized.

First, the address bits $a_1, \ldots, a_{21}$ are compacted to 6 bits 1, $A_2, \ldots, A_6$, wherein for the 5 bits $A_2, \ldots, A_6$ the following holds:

$$(A_2, \ldots, A_6)^T = K^+ \cdot (a_1, \ldots, a_{21})^T. \quad (19)$$

In this example, $K^+$ is a (5,21)-matrix, the columns of which are all unequal 0 and pairwise different from each other. A constant bit 1 is adjoined to the 5 bits $A_2, \ldots, A_6$. This constant bit 1 results in that each address $a_1, \ldots, a_{21}$ is mapped to a 6-component vector $[1, A_2, \ldots, A_6] \neq 0$. Since the columns of $K^+$ are all unequal 0 and pairwise different, two different addresses, that differ from each other in only one bit or two bits, can never be mapped to the same vector $1, A_2, \ldots, A_6$.

In this manner, all 1-bit and all 2-bit errors in the bits $a_1, \ldots, a_{21}$ are reliably detected.

The H matrix of the code is the H matrix of a shortened Hsiao-code.

We assume that the generator matrix G of the code is used in its systematic form. The generator matrix $G = (P_{70,8}, I_{70})$ is then formed by a 70-dimensional identity matrix $I_{70}$ and a (70,8)-parity matrix $P_{70,8}$. Since the G matrix is used in its systematic form, the data bits can be written unchanged in the memory.

The H matrix is also used in its systematic form. The systematic form of the H matrix has the benefit that the hardware, which is used for the implementation of the parity matrix during coding, can also be employed during decoding for determining the error syndrome.

The H matrix has the form $$H = (I_8, P_{8,70}^T) = (H^c, H^u, H^A) \text{ with } I_8 = H^c \text{ and } P_{8,70}^T = H^u, H^A. \quad (20)$$

All columns of the matrix H are unequal 0, pairwise different, and each column has an odd number of ones.

In the preceding equation
$H^c = I_8$ is a (8,8)-identity matrix,
$H^u$ is a (8,64) matrix,
$H^A$ is a (8,6) matrix.

In particular, the sub-matrix $H^c$ (check bits-related sub matrix) has the form $$H^c = I_8 = (h_1^c, \ldots, h_8^c) = \begin{pmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{pmatrix}. \quad (21)$$

The columns of the matrix $H^c$ are linearly independent.
The columns $h_1^c, \ldots, h_8^c$ of the matrix $H^c$ are chosen so that $$h_1^c \oplus h_2^c \oplus \ldots \oplus h_8^c = [\underbrace{1, \ldots, 1}_{8}]^T, \quad (22)$$

wherein $\oplus$ designates the component-wise addition modulo-2.

The matrix $H^A$ (compressed address bits-related sub matrix) has the form $$H^A = (h_1^A, \ldots, h_6^A) = \begin{pmatrix} 1 & 1 & 1 & 1 & 1 & 1 \\ 1 & 1 & 1 & 1 & 1 & 1 \\ 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \end{pmatrix}. \quad (23)$$

The first two components of each column of the matrix $H^A$ are [1,1], i.e., the matrix is constant in these components. The third to eight row form a 6-dimensional identity matrix.

The matrix $H^u$ (user data bits-related sub matrix) with $$H^u = (h_1^u, h_2^u, \ldots, h_{64}^u)$$

has the following properties:
1. The first two components of $h_i^u$, i=1, ..., 64, are unequal [1,1] and therefore either equal [0,1], [1,0] or [0,0].
2. For i=1, ..., 64 the number of the components of $h_i^u$, that are equal 1, is either equal 3 or equal 5.
3. The matrix $H^u$ is determined such that $$h_1^u \oplus h_2^u \oplus \ldots \oplus h_{64}^u = [\underbrace{1, \ldots, 1}_{8}]^T \quad (24)$$

The first 6 columns $h_1^u, \ldots, h_6^u$ of $H^u$ are:

$$h_1^u, \ldots, h_6^u = \begin{pmatrix} 0 & 0 & 0 & 0 & 0 & 0 \\ 0 & 0 & 0 & 0 & 0 & 0 \\ 1 & 0 & 1 & 0 & 1 & 1 \\ 1 & 1 & 0 & 1 & 0 & 1 \\ 1 & 1 & 0 & 1 & 1 & 0 \\ 0 & 1 & 1 & 0 & 0 & 0 \\ 0 & 0 & 1 & 0 & 1 & 0 \\ 0 & 0 & 0 & 1 & 0 & 1 \end{pmatrix}. \quad (25)$$

Each of these 6 columns has 3 ones. It holds:

$$h_1^u \oplus h_2^u \oplus h_3^u \oplus h_4^u \oplus h_5^u \oplus h_6^u = [0,0,0,0,0,0]^T = 0. \quad (26)$$

The remaining 58 columns $h_7^u, \ldots, h_{64}^u$ of the matrix $H^u$ are determined as 29 pairs of successive columns $h_i^u, h_{i+1}^u$, i=7, 9, 11, ..., 63 such that $h_i^u$ has three components that are equal 1 and $h_{i+1}^u$ has five components that are equal 1. $h_i^u$ and $h_{i+1}^u$ are complementary to each other. If the r-th component of $h_i^u$ is equal 1, then the r-th component of $h_{i+1}^u$ is equal 0. If the r-th component of $h_i^u$ is equal 0, then the r-th component of $h_{i+1}^u$ is equal 1. The first two components of $h_i^u$ and $h_{i+1}^u$ are either equal [0,1] or [1,0] and therefore unequal [1,1]. For the component-wise XOR combination of $h_i^u$ and $h_{i+1}^u$ we have $$h_i^u \oplus h_{i+1}^u = [1,1,1,1,1,1,1,1]^T$$

The columns $h_i^u$ and $h_{i+1}^u$ are determined based on the following considerations:
There are $$\binom{6}{2} = 15$$

column vectors with eight components in total and with 3 ones, the first two components of which are equal 1,0 and wherein 2 ones are distributed among the 6 components 3 to 8.

There are $$\binom{6}{4} = 15$$

column vectors with eight components in total and with 5 ones, the first two components of which are equal 0,1 and wherein 4 ones are distributed among the 6 components 3 to 8.

For each vector with 3 ones with the first two components being 1,0 there is exactly one complementary vector with 5 ones and the first two components 0,1, so that the component-wise XOR-sum of the vector with 3 ones and its complementary vector with 5 ones equals $[1,1,1,1,1,1,1,1]^T$.

In an analogous manner we have:
There are $$\binom{6}{2} = 15$$

column vectors with eight components in total and with 3 ones, the first two components of which are equal 0,1 and wherein 2 ones are distributed among the 6 components 3 to 8.

There are $$\binom{6}{4} = 15$$

column vectors with eight components in total and with 5 ones, the first two components of which are equal 1,0 and wherein 4 ones are distributed among the 6 components 3 to 8.

For each vector with 3 ones and with the first two components 0,1 there is exactly one complementary vector with 5 ones and the first two components 1,0, so that the component-wise XOR-sum of the vector with 3 ones and its complementary vector with 5 ones equals $[1,1,1,1,1,1,1,1]^T$.

The 58 columns $h_7^u, \ldots, h_{64}^u$ are chosen as 29 pairs of complementary columns. The first 30 columns consist of 15 first pairs of complementary columns, wherein the first column of each pair is one of the 15 column vectors with 3 ones and the first two components 0,1. The associated second complementary column is then one of the 15 column vectors with 5 ones and the first two components 1,0.

The remaining 28 columns consist of 14 second pairs of complementary columns, wherein the first column of each of these second pairs is one of 15 column vectors with 3 ones and the first two components 1,0. The associated second complementary column is then one of the 15 column vectors with 5 ones and the first two components 0,1.

For the component-wise XOR-sum of the 58 columns $h_7^u, \ldots, h_{64}^u$ or the 29 pairs $[h_7^u, h_8^u], [h_9^u, h_{10}^u], \ldots, [h_{63}^u, h_{64}^u]$ of complementary columns we have $$[h_7^u \oplus h_8^u] \oplus [h_9^u \oplus h_{10}^u] \oplus \ldots \oplus [h_{63}^u \oplus h_{64}^u] = [1,1,1,1,1,1,1,1]^T \quad (27)$$

from which using equations (22), (24) and (26) it follows $$h_1^c \oplus \ldots \oplus h_8^c \oplus h_1^u \oplus \ldots \oplus h_6^u \oplus h_7^u \oplus \ldots \oplus h_{64}^u = 0 \quad (28)$$

and therefore $$(H^c H^x) \cdot (\underbrace{1, \ldots, 1}_{72}) = 0. \quad (29)$$

Next the error correction and error detection properties of the preceding implementation example are described.

The H matrix H is, as previously explained, a H matrix of a shortened Hsiao code, and all columns of the H matrix have an odd number of ones.

For the data bits and the check bits we have:
Each 1-bit error results in an error syndrome that has an odd number of ones and that is equal [0,0], [1,0] or [0,1] in the first two components.
A 2-bit error in the data bits and/or check bits results in an error syndrome ≠0, that has an even number of ones. An error syndrome unequal 0 with an even number of ones is indicated as a non-correctable error.

For the address bits we have in summary:
address errors have an error syndrome that is either equal [1,1] or equal [0,0] in the first two components.

In case the error syndrome is equal [1,1] in the first two components, then it differs from the error syndrome of an arbitrary 1-bit error in the data bits and check bits, that is either equal [0,0], [1,0] or [0,1] in the first two components. It is indicated as a non-correctable error and detected in a reliable manner.

In case the first two bits of the error syndrome of an address error are equal [0,0], then the number of the components that are equal 1 is even. Since a 1-bit error in the data bits and check bits presents an odd number of ones, the address error is detected as a non-correctable error when the error syndrome is ≠0.

These statements are now explained more in detail.
The modification of the compressed (compacted) address values $\Delta A_2, \ldots, \Delta A_6$ is defined by $$\Delta A_2, \ldots, \Delta A_6 = A_2 \oplus A_2^f, \ldots, A_6 \oplus A_6^f. \quad (30)$$

$[A_2, \ldots, A_6]^T = K^+ \cdot [a_1, \ldots, a_{21}]^T$ are the compacted values of the correct address bits and $[A_2^f, \ldots, A_6^f]^T = K^T \cdot [a_1^f, \ldots, a_{21}^f]^T [A_2, \ldots, A_6]^T = K^+ \cdot [a_1, \ldots, a_{21}]^T$ $[A_2^f, \ldots, A_6^f]^T = K^T \cdot [a_1^f, \ldots, a_{21}^f]^T$ the compacted values of the erroneous address bits. The syndrome resulting from an address error S(A) is $$S(A) = H^A \cdot [0, \Delta A_2, \Delta A_3, \Delta A_4, \Delta A_5, \Delta A_6]^T = \quad (31)$$

$$= \begin{pmatrix} \Delta A_2 \oplus \Delta A_3 \oplus \Delta A_4 \oplus \Delta A_5 \oplus \Delta A_6 \\ \Delta A_2 \oplus \Delta A_3 \oplus \Delta A_4 \oplus \Delta A_5 \oplus \Delta A_6 \\ 0 \\ \Delta A_2 \\ \Delta A_3 \\ \Delta A_4 \\ \Delta A_5 \\ \Delta A_6. \end{pmatrix}$$

Every address error for which holds $\Delta A_2, \ldots, \Delta A_6 \neq 0, 0,0,0,0$, results in a syndrome unequal 0.

If the number of ones in $\Delta A_2, \ldots, \Delta A_6$ is odd, then the first two components of S(A) are equal [1,1], and the address error is detected as non-correctable error. If the number of ones in $\Delta A_2, \ldots, \Delta A_6$ is even and if $\Delta A_2, \ldots, \Delta A_6 \neq 0,0,0,0,0$, then the number of the components of S(A) that are equal 1 is even so that the error is detected as non-correctable error.

If $\Delta A_2, \ldots, \Delta A_6 = 0,0,0,0,0$, although an address error exists in the address bits $a_1, \ldots, a_{21}$, then the error is not detected. This case occurs very seldom.

It may be of interest that two special errors, in which all memory cells assume the value 0 or all memory cells assume the value 1, are reliably detected independent from the value of the address.

In case all memory cells assume the value 0, then this is typically called an All-0 error. In case all memory cells assume the value 1, then this is typically called an All-1 error.

In other words, if all memory cells have the value 0, then an All-0 error has occurred (is present). Since the address bits and the compacted address bits are not stored, an All-0 error means that all data bits and check bits are equal 0 and the compacted address bits $A_2, \ldots, A_6$ can assume arbitrary values, including $$\underbrace{0, \ldots, 0}_{5}.$$

If all memory cells have the value 1, then an All-1 error has occurred (is present). Since the address bits and the compacted address bits are not stored, an All-1 error means that all data bits and check bits are equal 1 and the compacted address bits $A_2, \ldots, A_6$ can assume arbitrary values, including $$\underbrace{0, \ldots, 0}_{5}.$$

We now determine the error syndrome S(All-0) for an All-0 error. We have $$s(\text{All}-0) = (H^c, H^u, H^A) \cdot [\underbrace{0, \ldots, 0}_{72}, 1, A_2, \ldots, A_6]^T \quad (32)$$

$$= H^A \cdot [1, A_2, \ldots, A_6]^T$$

$$= \begin{bmatrix} 1 \oplus A_2 \oplus A_3 \oplus A_4 \oplus A_5 \oplus A_6 \\ 1 \oplus A_2 \oplus A_3 \oplus A_4 \oplus A_5 \oplus A_6 \\ 1 \\ A_2 \\ A_3 \\ A_4 \\ A_5 \\ A_6 \end{bmatrix}.$$

At the same time we have $$[A_2, \ldots, A_6]^T = K^+ \cdot [a_1, \ldots, a_{21}]^T.$$

If the number of the values $A_2, \ldots, A_6$ that are equal 1 is odd, then the first two components of the error syndrome S (All-0) are equal [0,0] and the error syndrome presents an even number of ones. In this manner the error All-0 is detected as a non-correctable error. If the number of the values $A_2, \ldots, A_6$ that are equal 1 is even, then the first two components of the error syndrome s(All 0) are equal [1,1]. In this manner the error All-0 is detected as a non-correctable error.

Irrespective of the value of the address bits, All-0 is detected as a non-correctable error.

We now determine the error syndrome S(All-1) for an All-1 error. We have $$S(\text{All}-1) = (H^c, H^u, H^A) \cdot [\underbrace{1, \ldots, 1}_{72}, 1, A_2, \ldots, A_6]^T \quad (33)$$

$$= H^A \cdot [1, A_2, \ldots, A_6]^T$$

$$= \begin{bmatrix} 1 \oplus A_2 \oplus A_3 \oplus A_4 \oplus A_5 \oplus A_6 \\ 1 \oplus A_2 \oplus A_3 \oplus A_4 \oplus A_5 \oplus A_6 \\ 1 \\ A_2 \\ A_3 \\ A_4 \\ A_5 \\ A_6 \end{bmatrix}.$$

Care has been taken that the columns of $H^c$ and $H^u$ have been determined that $$(H^c, H^u) \cdot [\underbrace{1, \ldots, 1}_{72}] = \underbrace{0, \ldots, 0}_{8}.$$

If the number of the values $A_2, \ldots, A_6$ that are equal 1 is odd, then the first two components of the error syndrome S(All-1) are equal [0,0] and the error syndrome has an even number of ones. In this manner All-1 is detected as a non-correctable error. If the number of the values $A_2, \ldots, A_6$ that are equal 1 is even, then the first two components of the error syndrome S(All-1) are equal [1,1]. In this manner an All-1 is detected as an uncorrectable error.

Irrespective of the value of the address bits, All-1 is detected as an uncorrectable error.

The functionality of the error detection and correction will be explained subsequently using actual examples for 64 data bits, 8 check bits and 21 address bits. The code C that is used, is constructed via its H matrix H. The sub matrices $H^c$ and $H^A$, as well as the first 6 column vectors of the Matrix $H^u$ are already given by the equations (21), (23) and (25). The remaining 58 column vectors of the Matrix $H^u$ are chosen according to the description above as 29 pairs of complementary column vectors. The H matrix H of the code C can be selected according to $$H = \begin{pmatrix} 10000000 & 00000010101010101010101010101010101001010101010101010101010101\,111111 \\ 01000000 & 00000001010101010101010101010101011010101010101010101010101010\,111111 \\ 00100000 & 10101101010101010101010110101010100101010101010101101010101\,100000 \\ 00010000 & 11010101010101011010101001010101100101010101011010101001010101\,010000 \\ 00001000 & 11011001010110101001010110010101100101011010100101011001010110\,001000 \\ 00000100 & 01100001101001011001011001010110010101101001011001010110001011001\,000100 \\ \underline{00000010} & \underline{00101010011001100101100101011001010110011001100101100101011001011}\,\underline{000010} \\ \phantom{xxxxxx}H^c & \phantom{xxxxxxxxxxxxxxxxxxxxxxxxxxxxxxxxxxxxxxxxxxxx}H^u & \phantom{xxxxx}H^A \end{pmatrix} \quad (34)$$

The sub matrices $H^u$, $H^A$ form the transposed $P_{8,70}^T$ of the parity matrix $P_{70,8}$ of the code C:

$$P_{8,70}^T = \begin{pmatrix} 00000010101010101010101010101010101001010101010101010101010101\,111111 \\ 00000001010101010101010101010101011010101010101010101010101010\,111111 \\ 10101101010101010101010110101010100101010101010101101010101\,100000 \\ 11010101010101011010101001010101100101010101011010101001010101\,010000 \\ 11011001010110101001010110010101100101011010100101011001010110\,001000 \\ 01100001101001011001011001010110010101101001011001010110001011001\,000100 \\ \underline{00101010011001100101100101011001010110011001100101100101011001011}\,\underline{000010} \\ \phantom{xxxxxxxxxxxxxxxxxxxxxxxxxxxxxxxxxxxxxxxxxxx}H^u & \phantom{xxxxx}H^A \end{pmatrix} \quad (35)$$

The parity matrix can be obtained from $P_{8,70}^T$ by transposing:

$$P_{70,8} = (P_{8,70}^T)^T \tag{36}$$

The parity matrix $P_{70,8}$ of the example code is represented in equation (37). One obtains $P_{70,8}$ from $P_{8,70}^T$ by interchanging ("swapping") the rows and the columns.

$$P_{70,8} = \begin{bmatrix}
00111000 \\
00011100 \\
00100110 \\
00011001 \\
00101010 \\
00110001 \\
10000011 \\
01111100 \\
10000101 \\
01111010 \\
10000110 \\
01111001 \\
10001001 \\
01110110 \\
10001010 \\
01110101 \\
10001100 \\
01110011 \\
10010001 \\
01101110 \\
10010010 \\
01101101 \\
10010100 \\
\\
01101011 \\
10011000 \\
01100111 \\
10100001 \\
01011110 \\
10100010 \\
01011101 \\
10100100 \\
01011011 \\
10101000 \\
01010111 \\
10110000 \\
01001111 \\
01000011 \\
10111100 \\
01000101 \\
10111010 \\
01000110 \\
10111001 \\
01001001 \\
10110110 \\
01001010 \\
10110101 \\
01001100 \\
10110011 \\
01010001 \\
10101110 \\
01010010 \\
10101101 \\
01010100 \\
10101011 \\
01011000 \\
10100111 \\
01100001 \\
10011110 \\
01100010 \\
10011101 \\
01100100 \\
10011011 \\
01101000 \\
10010111 \\
\\
11100000 \\
11010000 \\
11001000 \\
11000100 \\
11000010 \\
11000001
\end{bmatrix} \tag{37}$$

In the contemplated implementation examples 64 data bits $u_1, \ldots, u_{64}$ are to be stored in the memory under the address $a_1, \ldots, a_{21}$. For forming the 8 check bits associated with the 64 data bits, in a first step the 21 address bits $a_1, \ldots, a_{21}$ are compacted on the basis of the matrix $K^+$ to 6 bits $A_1, \ldots, A_6$. The (5,21) matrix $K^+$ can be chosen, according to at least some aspects of the invention, as follows:

$$K^+ = \begin{pmatrix} 100001111000000111111 \\ 010001000111000111000 \\ 001000100100110100110 \\ 000100010010101010101 \\ 000010001001011001011 \end{pmatrix} \tag{38}$$

All columns of the matrix $K^+$ are unequal 0 and pairwise different.

The compacted address bits $A_2, \ldots, A_6$ of the write address are formed due to (19) according to the relation $$(A_2, \ldots, A_6)^T = K^+ \cdot (a_1, \ldots, a_{21})^T$$

and the compacted bit $A_1$ is set to $A_1 = 1$. The check bits $c_1, \ldots, c_8$ to be written are generated as a function of the data bits and the compacted address bits using the parity matrix $P_{70,8}$:

$(c_1, \ldots, c_8, u_1, \ldots, u_{64}, A_1, \ldots, A_6) \cdot H^T = 0 (c_1, \ldots, c_8) = (u_1, \ldots, u_q, A_1, \ldots, A_6) \cdot P_{70,8} \cdot (c_1, \ldots, c_8, u_1, \ldots, u_{64}, A_1, \ldots, A_6)$ is a codeword of the systematic code C and it holds that $$(c_1, \ldots, c_8, u_1, \ldots, u_{64}, A_1, \ldots, A_6) \cdot H^T = 0$$

The check bits and the data bits are stored in memory under the address $a_1, \ldots, a_{21}$.

It is possible that the check bits and the data bits stored in memory and also the address bits are erroneous.

If the values $c_1, \ldots, c_8, u_1, \ldots, u_{64}, 1, A_2, \ldots, A_6$ differ from the values $c'_1, \ldots, c'_8, u'_1, \ldots, u'_{64}, 1, A'_2, \ldots, A'_6$, then typically an error has occured.

An error can be described by an error vector $$f = (f_1^c, \ldots, f_8^c, f_1^u, \ldots, f_{64}^u, f_1^A, \ldots, f_6^A) = \\ (c_1 \oplus c'_1, \ldots, c_8 \oplus c'_8, u_1 \oplus u'_1, \ldots, u_{64} \oplus u'_{64}, \\ 1 \oplus 1, A_2 \oplus A'_2, \ldots, A_6 \oplus A'_6).$$

If $$f = (\underbrace{0, \ldots, 0}_{78}),$$

then typically no error has occurred. If $$f \neq (\underbrace{0, \ldots, 0}_{78}),$$

then an error has occurred. The error syndrome $S_f$ of an error $f$ is $$S_f = (s_1, \ldots, s_8)^T = H \cdot f^T$$

For explaining the mode of operation of the invention, we contemplate first the case that the 7-th data bit $u'_7$ is erroneous and that all other bits are not erroneous. We assume that the read address $a'_1 = a_1, \ldots, a'_{21} = a_{21}$ is equal to the write address and thus also the compacted address bits of the read address are equal to the compacted bits of the write address.

The error vector is then $$f = (\underbrace{0, \ldots, 0}_{8}, \underbrace{0, \ldots, 0}_{6}, 1, \underbrace{0, \ldots, 0}_{57}, \underbrace{0, \ldots, 0}_{6}),$$

and the error syndrome $s_f$ is $$s_f^T = H \cdot f^T = (10000011)^T.$$

The error syndrome is equal to the 7-th column of the matrix $H^u$. Since $s_f \neq 0$ and has an odd number of ones, a correction signal $e_7^u = 1$ is generated by the decoder Dec 2561. No further correction signals $\neq 0$ are output by the decoder. The corrected 7-th data bit $u_7^{cor}$ is then $u_7^{cor} = u'_7 \oplus e_7^u = x'_7 \oplus 1 = \overline{u}'_7$. No further bits are corrected.

The error syndrome $s_f$ presents an odd number of ones and for the first two components we have $s_1, s_2 \neq 1,1$. Furthermore, the syndrome s corresponds to the 15-th column of the matrix H, that is to column vector that corresponds to the 7-th data bit. The decoder determines correction signals of the form $$e_1, \ldots, e_{72} = e_1^c, \ldots, e_8^c, e_1^u, \ldots, e_{64}^u$$

to the check bits and the data bits on the basis of the error syndrome s, wherein $e_i^c = 0$ for $i = 1, \ldots, 8$, $e_j^u = 0$ for $j = 1, \ldots, 6, 8, \ldots, 64$ and $e_7^u = 1$.

The check bits and the data bits to be corrected are then combined with the corresponding correction signals to yield the corrected check bits and data bits:

$$(c_1^{cor}, \ldots, c_8^{cor}, u_1^{cor}, \ldots, u_{64}^{cor}) =$$
$$(c'_1, \ldots, c'_8, u'_1, \ldots, u'_{64}) \oplus (e_1^c, \ldots, e_8^c, e_1^u, \ldots, e_{64}^u) =$$
$$(c_1, \ldots, c_8, u_1, \ldots, u_6, \overline{u_7}, u_8, \ldots, u_{64}) \oplus (\underbrace{0, \ldots, 0}_{14}, 1, \underbrace{0, \ldots, 0}_{57}) =$$
$$(c_1, \ldots, c_8, u_1, \ldots, u_6, u_7, u_8, \ldots, u_{64}).$$

We now consider the case that the 5-th check bit $c'_5$ and the 29-th data bit $u'_{29}$ are erroneous. It is assumed that no further errors are present.

The error vector f is then $$f = \left(00001000 \; \underbrace{0, \ldots, 0}_{28} \; 1 \; \underbrace{0, \ldots, 0}_{35} \; 0 \; \underbrace{0, \ldots, 0}_{6}\right),$$

and the error syndrome $s_f$ is $$s_f^T = H \cdot f^T = (10101010)^T,$$

which corresponds to the component-wise XOR-sum of the 5-th column $(00001000)^T$ of the matrix $H^c$ and the 29-th column $(10100010)^T$ of the matrix Hu. The error syndrome $S_f$ is unequal 0, and has an even number of ones. A non correctable error is indicated.

We now describe the mode of operation of the invention for a first address error. Let us consider the case in which the read address $a'_1, a_{21}'$ differs from the write address $a_1, \ldots, a_{21}$ in the 13-th bit, i.e., $a'_{13} \neq a_{13}$. It is assumed that no further error has occurred. We have $$(\Delta A_2, \ldots, \Delta A_6)^T = [K^+ \cdot (a_1, \ldots, a_{21})^T] \oplus [K^+ \cdot (a_{1'}, \ldots, a'_{21})^T] a'_1, \ldots,$$
$$a'_{21}(\Delta A_2, \ldots, \Delta A_6)^T = [K^+ \cdot (a_1, \ldots, a_{21})^T] \oplus [K^+ \cdot (a_{1'}, \ldots, a'_{21})^T] =$$
$$K^+ \cdot (a_1 \oplus a_{1'}, \ldots, a_{21} \oplus a'_{21})^T = K^+ \cdot \left(\underbrace{0, \ldots, 0}_{12}, 1, \underbrace{0, \ldots, 0}_{8}\right)^T a'_1,$$
$$\ldots, a'_{21} = K^+ \cdot (a_1 \oplus a_{1'}, \ldots, a_{21} \oplus a'_{21})^T =$$
$$K^+ \cdot \left(\underbrace{0, \ldots, 0}_{12}, 1, \underbrace{0, \ldots, 0}_{8}\right)^T = (0, 0, 1, 1, 0)^T,$$

and the address error affects the compacted address bits in a manner that 1, $A'_2, \ldots, A'_6$ differs from 1, $A_2, \ldots, A_6$ by 0,0,0,1,1,0 and $\Delta A_1, \Delta A_2, \ldots, \Delta A_6 = 0,0,0,1,1,0$. The constant value $A_1 = A'_1 = 1$ can not be erroneous.

The error vector f is $$f = \left(\underbrace{0, \ldots, 0}_{8}, \underbrace{0, \ldots, 0}_{64}, 0, 0, 0, 1, 1, 0\right),$$

and the error syndrome $S_f$ is then $$S_f^T = H \cdot \left(\underbrace{0, \ldots, 0}_{8}, \underbrace{0, \ldots, 0}_{64}, 0, 0, 0, 1, 1, 0\right)^T = (0, 0, 0, 0, 0, 1, 1, 0)^T.$$

The error syndrome $S_f$ is equal to the component-wise XOR-sum of the fourth column $(1,1,0,0,0,1,0,0)^T$ and the fifth column $(1,1,0,0,0,0,1,0)^T$ of $H^A$. Since the error syndrome $s_f$ is unequal 0 and has an even number of ones, the address error is detected as a non-correctable error.

Now a second address error shall be considered. According to this error the read address and the write address differ in the 8-th and in the 18-th bit, i.e. $a'_8 \neq a_8$ and $a'_{18} \neq a_{18}$. No further errors are assumed.

We now have $$(\Delta A_2, \ldots, \Delta A_6)^T = [K^+ \cdot (a_1, \ldots, a_{21})^T] \oplus [K^+ \cdot (a_{1'}, \ldots, a'_{21})^T] a'_1, \ldots,$$
$$a'_{21}(\Delta A_2, \ldots, \Delta A_6)^T = [K^+ \cdot (a_1, \ldots, a_{21})^T] \oplus [K^+ \cdot (a_{1'}, \ldots, a'_{21})^T] =$$
$$K^+ \cdot (a_1 \oplus a_{1'}, \ldots, a_{21} \oplus a'_{21})^T = K^+ \cdot \left(\underbrace{0, \ldots, 0}_{12}, 1, \underbrace{0, \ldots, 0}_{8}\right)^T a'_1,$$

-continued $$\ldots, a'_{21} = [K^+ \cdot (a_1 \oplus a_{1\prime}, \ldots, a_{21} \oplus a'_{21})^T] =$$
$$K^+ \cdot (\underbrace{0, \ldots, 0}_{7}, 1, \underbrace{0, \ldots, 0}_{9}, 1, 0, 0, 0,)^T = (0, 1, 0, 1, 1)^T.$$

The compacted address bits 1, A'$_2$, ..., A'$_6$ of the read address differ from the compacted address bits 1, A$_2$, ..., A$_6$ of the write address by 0,0,1,0,1,1.

The error vector f is $$f = (\underbrace{0, \ldots, 0}_{8}, \underbrace{0, \ldots, 0}_{64}, 0, 0, 1, 0, 1, 1)$$

and the error syndrome $S_f$ is $$S_f^T = H \cdot (\underbrace{0, \ldots, 0}_{8}, \underbrace{0, \ldots, 0}_{64}, 0, 0, 1, 0, 1, 1)^T = (1, 1, 0, 0, 1, 0, 1, 1)^T.$$

and it is equal to the component-wise XOR-sum of the third, fifth and sixth column of the matrix $H^4$.

Since the first two components of $S_f^T$ are equal 1,1 and the error syndrome of each 1-bit error in the data bits or the check bits in the first two components is unequal 1,1, the address error(s) is detected as uncorrectable error.

FIGS. 28-37 relate to an alternative solution according to which an at least 2-bit error correcting code (i.e. a t-bit error correcting code, with t≥2) for the information bits and the check bits is combined with an address error detection having a high detection probability, e.g., higher than 99% or even higher than 99.9%.

In order to achieve an address error detection with about 99.9%, a new code is proposed for error correction of t-bit errors in the data bits and check bits and very high error detection probability for arbitrary address errors. Detection of address errors with 99.9% can now be achieved with much less check bits as it is possible until now.

In memories, it may be desired to correct t-bit errors and to detect multi-bit errors, e.g., for t=2. Of special importance are address errors with potentially catastrophic consequences. Address errors have to be detected with very high probability. In a currently used design (internal knowledge of the assignee), address errors may be detected with 98.8% by use of 21 check bits, but a higher probability is desired.

Errors may be corrected and detected by use of their error syndromes. An error is typically mapped to an error syndrome, and the error syndrome determines what type of error occurred and whether it can be corrected, or only detected. For a code length of n there are $2^n-1$ arbitrary errors. If the syndrome has m components, there are only $2^m$ error syndromes and in general $2^{n-m}$ errors are mapped to each syndrome.

If an arbitrary error which is not a t-bit error is mapped to a syndrome corresponding to a t-bit error, when t-bit errors are corrected, then the arbitrary error is miscorrected. This is one of the reasons for the relatively high miscorrection rate of arbitrary errors if the code is used for error correction of t-bit errors with t≥1, for example, for the above mentioned design currently used within the assignee.

According to what will be described in more detail below with respect to FIGS. 28-37, the parity check matrix of the proposed code is constructed such that arbitrary address errors are never mapped to syndromes of 1-bit, 2-bit, ... t-bit errors. The construction is possible for t≥2. Only if an address-multi-bit error is mapped to the syndrome 0 (syndrome of no error) then it cannot be detected. This occurs only on one out of $2^m$ cases and therefore the error detection probability for address errors is extremely high.

As an example, for a currently contemplated new design with 256 data bits and 21 check bits, >99.9% detection probability for address errors can be achieved, as compared to 98.8% detection probability that could be achieved with preceding designs. This result can be achieved by a syndrome generator that implements a parity matrix with special properties, as will be explained below.

It is known to a person skilled in the art to detect and to correct errors in a sequence of bits by error-detecting and error-correcting codes. For example, k data bits or information bits $u=u_1, \ldots, u_k$ may be supplemented by m check bits $c=c_1, \ldots, c_m$, so that the bits $v_1, \ldots, v_n=c_1, \ldots, c_m, u_1, \ldots, u_k$ form a codeword of a code C.

It is also possible to add the check bits of the right side to the information bits. Then, $u_1, \ldots, u_k, c_1, \ldots, c_i$ is a codeword of the considered code.

Since the unmodified information bits are bits of a codeword, the code is called a systhematic code.

The invention is not restricted to systematic codes. Also, non-systhematic codes can be used.

If the code C is a linear systhematic or non-systhematic linear code, then a codeword v may be determined from the information bits by $$v=u \cdot G$$

wherein G is the generator matrix of the code. G may be either in systhematic or in non-systhematic form as it is known to an ordinary expert in this field.

A G-matrix in non-systhematic form can be always transformed into a G-matrix in systhematic form by component-wise XOR-combining of rows and by permuting columns of the G-matrix in non-systhematic form.

On the other hand, a G-matrix in its systhematic form can also be transformed in arbitrarily given non-systhematic form of the code by component-wise XOR-combining the rows and by permuting the columns of the G-matrix in its systhematic form.

Since it is often advantageous to store data unmodified in the memory, which is possible if the codes are used in their systhematic form, the invention is described mainly by examples with the codes in their systhematic form.

Of course, the invention can also be used, if the considered code is a non-systhematic code.

If C is a linear code, then a codeword v may be determined by $$v=u \cdot G,$$

wherein G is the generator matrix of the code, G is here a (k, n) matrix with n–k=m.

A codeword $v=v_1, \ldots, v_n$ may be changed by errors into an erroneous word $v'=v'_1, \ldots, v'_n$. An error may be described by an error vector. The error vector $e=e_1, \ldots, e_n$ is defined by $$e=e_1, \ldots, e_n=v_1 \oplus v'_1, \ldots, v_n \oplus v'_n.$$

If the i-th component $e_i$ of the error vector e is equal to 1, $v_i$ and $v'_i$ are different and an error exists in the i-th bit. If $e_i=0$, $v_i$ and $v'_i$ are not different and there is no error in the i-th bit.

The error syndrome s of a sequence $v'=v'_1, \ldots, v'_n$ is determined by $$S^T=H \cdot [v'_1, \ldots, v'_n]^T = H \cdot [e_1, \ldots, e_n]^T.$$

Here, H is the H matrix or parity check matrix of the code C and $S^T$ is the transposed vector of the row vector $S=S_1, \ldots, S_m$. Hence, $S^T$ is a column vector. Likewise, $[v'_1, \ldots, v'_n]^T$ and $[e_1, \ldots, e_n]^T$ designate the transposed column vectors of the row vectors v' and e. The matrix H here is a m,n-matrix.

Note that in the above equation the erroneous code word v' can be split up as the sum of the corresponding (error-free) code word v and the corresponding error vector e. The syndrome of an (error-free) code word is 0, so that the syndrome of the erroneous codeword v' is equal to the syndrome of the corresponding error vector e, as demonstrated in the above equation.

The error syndrome S may be determined by a syndrome generator from the bits $v'_1, \ldots, v'_n$. For linear codes, the syndrome generator may be a combinational circuit with n inputs and m outputs, into which the bits $v'_1, \ldots, v'_n$ are input and which outputs the associated error syndrome S. The syndrome generator may be realized using XOR gates.

If all components of the error vector e are equal to 0, no error is present and v'=v applies. For a code vector, v'=v applies and the error syndrome is equal to $0|^T$, wherein 0| here designates an m-component column vector whose components are all 0 (accordingly its transpose $0|^T$ designates an m-component row vector).

If exactly one component of the error vector e is equal to 1, a 1-bit error exists. If exactly t components of the error vector e are equal to 1, then a t-bit error exists.

If the code C is a t-bit error correcting code with t≥1, then the error syndromes of all 1-bit to t-bit errors are pair-wise different and based on the existing syndrome it may be determined by a decoder which bits are to be corrected. In principle, this is easily possible using a table, which is, however, often elaborate for realistic word widths, which is why special correction methods have been developed for the different codes. The correction of bits may take place by XOR-ing the bit to be corrected with the correction value.

The decoder and the corresponding XOR-combinations may be combined to form a corrector. If negated values of the bits or of the correction values are used, the combinations of the bits to be corrected and the correction values may be implemented by XNOR gates.

If the code C is a T-bit error detecting code with T≥1, then the error syndromes of all 1-bit to T-bit errors are unequal to 0 and each 1-bit to T-bit error unequal 0 may be differentiated from a correct codeword by the fact that the error syndrome corresponding to the same is ≠0|.

An example for a 1-bit error correcting code is the Hamming code and a known example for a 1-bit error correcting and 2-bit error detecting code is the Hsiao code.

Examples for t-bit error correcting codes for t≥2 are the BCH codes, for example described in the textbook by Lin, S. And Costello, D. "Error Control Coding, Fundamentals and Applications" Prentice Hall, pp. 141-170, 1983. Apart from that, reference is further to be made to the paper by Okano, H. And Imai, K. "A construction method of high-speed decoders using ROM's for Bose-Chaudhuri Hocqenhem and Reed Solomon codes" IEEE trans. Comp C 36, pp. 1165-1171, 1987.

Figure 28:
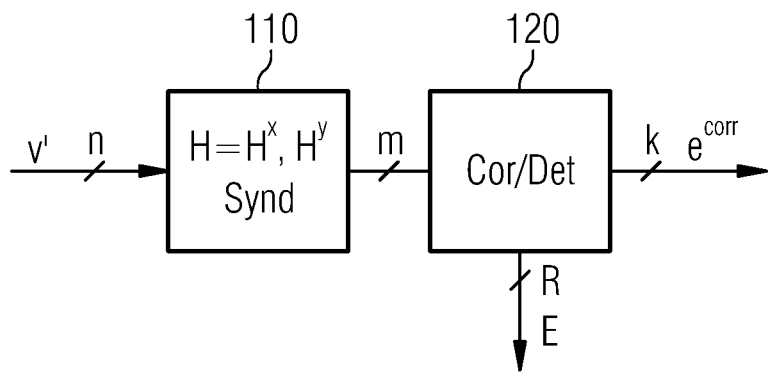
FIG. 28 shows a syndrome generator of an embodiment having an n-bit wide input for inputting an n-bit wide binary word and having an m-bit wide output connected to an m-bit wide input of a subcircuit.

For a first embodiment, FIG. 28 shows a syndrome generator Synd 110 having an n-bit wide input for inputting an n-bit wide binary word $v'=v'_1, \ldots, v'_n$ and having an m-bit wide output connected to an m-bit wide input of a subcircuit Cor/Det 120 for correcting erroneous bits and for detecting errors comprising a first k-bit wide output for outputting a correction vector $e^{cor}$ and a second R-bit wide output for outputting an R-bit wide error signal E, wherein R≥1.

The syndrome generator Synd 110 is implemented so that it forms an m-bit wide error syndrome $s=S_1, \ldots, s_m$ according to the following relation $$S^T = H \cdot (v')^T \quad (39)$$

Here, H is the H matrix (parity check matrix) of the considered linear code C. H is an (m, n) matrix, wherein m is the number of check bits of the code C and n is the length of the code.

The column vector $S^T$ designates the transposed vector of the row vector $S=S_1, \ldots, S_{mL}$. Accordingly, $(v')^T$ designates the transposed vector of the row vector v'.

The H matrix H of the code C comprises a first sub-matrix $H^x$ which is a (m, k) matrix, and a second sub-matrix $H^a$ which is an (m, l) matrix, so that the following applies $$H = (H^x, H^a). \quad (40)$$

The sub-matrix $H^a$ may also be referred to as $H^y$. The letter "x" when used as an exponent or index may be understood as relating to parts of the code word for which an error correction is intended (up to t-bit errors), and the letter "y" as exponent or index may be understood as relating to parts of the code word for which an error detection is intended (depending on the embodiment, up to the entire length said part of the code word, i.e., up to l bits).

Here $v'=v'_1, \ldots, v'_n=x'_1, \ldots, x'_{k+m}, a'_1, \ldots, a'_l$ with $x'=x'_1, \ldots, x'_{k+m}$ and $y'=y'_1, \ldots, y'_l$ is an n digit binary word with n=k+m+l which resulted from a codeword $v=v_1, \ldots, v_n=x_1, \ldots, x_{k+m}, y_1, \ldots, y_l$ of the considered code C due to errors. Note that the vector $x'=x'_1, \ldots, x'_{k+m}$ corresponds to the combination or concatenation of the possibly erroneous information bits $u'=u'_1, \ldots, u'_k$ and the check bits $c'=c'_1, \ldots, c'_m$ shown in, for example, FIGS. 2-8 and described in the corresponding description.

If no error exists and if $v'=v=x_1, \ldots, x_{k+m}, a_1, \ldots, a_l$ is a codeword of a code C, then the error syndrome S determined by equation (39) is equal to 0.

If $v'=x'_1, \ldots, x'_{k+m}, a'_1, \ldots, a'_l \neq x_1, \ldots, x_{k+m}, a_1, \ldots, a_l$, wherein $x_1, \ldots, x_{k+m}, a_1, \ldots, a_l$ is a codeword of a code C, then it is possible that the subcircuit Cor/Det 120 corrects errors and/or detects errors.

It is here provided in the circuitry in FIG. 28 that errors in the bits $x'_1, \ldots, x'_{k+m}$ which comprise at most t erroneous bits are corrected, wherein t≥2 applies and errors in the bits $a'_1, \ldots, a'_l$ are detected.

The syndrome generator Synd 110 is configured so that it outputs a different error syndrome for each 1-bit to t-bit error in the bits $x'_1, \ldots, x'_{k+m}$, so that the error syndromes output by the syndrome generator Synd 110 are different pair-wise for all 1-bit to t-bit errors in the bits $x'_1, \ldots, x'_{k+m}$.

Apart from that, the syndrome generator Synd 110 is configured so that for any random error in the bits $a'_1, \ldots, a'_l$, i.e. for any random 1-bit, 2-bit, ..., l-bit error in the bits $a'_1, \ldots, a'_l$ it outputs an error syndrome which is different from all error syndromes output by the syndrome generator Synd 110 in case of a 1-bit to t-bit error in the bits $x'_1, \ldots, x'_{k+m}$. If an error exists in the bits $x'_1, \ldots, x'_{k+m}$ and if the bits $a_1=a'_1, \ldots, a_l=a'_l$ are correct, it may be described by an error vector $$e^x = x_1 \oplus x'_1, \ldots, x_{k+m} \oplus x'_{k+m}, a_1 \oplus a'_1, \quad (31)$$
$$\ldots, a_l \oplus a'_l = e_1^x, \ldots, x_{k+m}^x, \underbrace{0, \ldots, 0}_{l}$$

If an error exists in the bits $a'_1, \ldots, a'_l$ and if the bits $x_1 = x'_1, \ldots, x_{k+m} = x'_{k+m}$ are correct, it may be described by an error vector $$e^a = x_1 \oplus x'_1, \ldots, x_{k+m} \oplus x'_{k+m}, a_1 \oplus a'_1, \quad (32)$$
$$\ldots, a_l \oplus a'_l = \underbrace{0, \ldots, 0}_{k+m}, e_1^a, \ldots, e_l^a.$$

For an error in the bits $x'_1, \ldots x'_{k+m}$ with the error vector $e^x$, the error syndrome $S^x$ determined by the syndrome generator Synd 110 and output at its output is equal to $$(S^x)^T = H \cdot (e^x)^T = \quad (33)$$
$$(H^x, H^a) \cdot \left(e_1^x, \ldots, e_{k+m}^x, \underbrace{0, \ldots, 0}_{l}\right)^T = H^x \cdot (e_1^x, \ldots, e_{k+m}^x)^T$$

and for an error in the bits $a'_1, \ldots, a'_l$ with the error vector $e^a$, the error syndrome $S^y$ determined by the syndrome generator Synd 110 and output at its output is equal to $$(S^a)^T = \quad (34)$$
$$H \cdot (e^a)^T = (H^x, H^a) \cdot \left(\underbrace{0, \ldots, 0}_{k+m}, e_1^a, \ldots, e_l^a\right)^T = H^a \cdot (e_1^a, \ldots, e_l^a)^T.$$

The H matrix $H=(H^x, H^a)$ may be determined so that for any possible errors in the bits $a'_1, \ldots, a'_l$, i.e. for any combinations of $e_1^a, \ldots, e_l^a$ unequal $$\underbrace{0, \ldots, 0}_{l},$$

the error syndromes $S^a$ determined by the syndrome generator according to equation (34) are different from all error syndromes $S^x$ determined according to equation (33) by the syndrome generator Synd 110, if 1-bit to t-bit errors occurred in the bits $x'_1, \ldots, x'_{k+m}$, wherein these error syndromes are also pair-wise different for any possible combinations of the bits $e_1^x, \ldots, e_{k+m}^x$ with a single one to t ones.

An error syndrome here is an m-component binary vector, wherein m is the number of check bits of the code C.

An error in the bits $a'_1, \ldots, a'_l$ may not be detected as an uncorrectable error by its error syndrome determined by the syndrome generator Synd 110, if the syndrome $$\underbrace{0, \ldots, 0}_{m}$$

is associated to this particular bit combination $a'_1, \ldots, a'_l$ by the syndrome generator. As there are in general $2^m$ different m-component binary vectors and thus also $2^m$ different error syndromes of which $2^m-1$ error syndromes are unequal $$\underbrace{0, \ldots, 0}_{m},$$

this is a very seldom case.

A corrector/detector Cor/Det 120 is connected downstream to the syndrome generator Synd 110 in FIG. 28. The corrector/detector Cor/Det 120 is here implemented so that when inputting an error syndrome $S=S^x$ it outputs a correction vector $e^{cor} = e_1^{cor}, \ldots, e_{k+m}^{cor}$, so that $e_1^{cor} = e_1^x, \ldots, e_{k+m}^{cor} = e_{k+m}^x$ applies when a single one to t-bit error exists in the bits $x'_1, \ldots, x'_{k+m}$ so that $e_1^x, \ldots, e_{k+m}^x$ comprises one to t ones.

It outputs a correction vector $e_1^{cor}=0, \ldots, e_{k+m}^{cor}=0$ so that no correction takes place in the bits $x'_1, \ldots, x'_{k+m}$ when $S=0|$ or when $S=S^a \neq 0|$ and $e_1^a, \ldots, e_l^a$ comprises at least one 1. In the latter case, the error signal E takes on a value which is different from the value of the error signal E when $S=0$ or when $S=S^x$ apply.

It is possible that the word width R of the error signal E is equal to 1. The word width R of the error signal E may also be greater than 1. It may then be differentiated using the error signal whether a 1-bit error occurred in the bits $x'_1, \ldots, x'_{k+m}$, a t-bit error occurred in the bits $x'_1, \ldots, x'_{k+m}$ or a random non-correctable error occurred in the bits $a'_1, \ldots, a'_l$.

In the following, an implementation example is to be considered, wherein t=2, so that 1-bit errors and 2-bit errors in the bits $x'_1, \ldots, x'_{k+m}$ may be corrected and (almost all) errors in the bits $a'_1, \ldots, a'_l$ shall be detected. $2 \cdot M = m$ applies.

A possible H matrix $H=(H^x, H^a)$ may be determined by $$H^x = (h_1^x, \ldots, h_{k+m}^x) = \begin{pmatrix} \alpha^{i_1} & \ldots & \alpha^{i_{k+m}} \\ \alpha^{3i_1} & \ldots & \alpha^{3i_{k+m}} \end{pmatrix},$$

and $$H^a = (h_1^a, \ldots, h_a^a) = \begin{pmatrix} 0| & \ldots & 0| \\ \alpha^{r_1} & \ldots & \alpha^{r_l} \end{pmatrix}.$$

Here, $\alpha$ is a generating element of the Galois field $GF(2^M)$, $\alpha^{i_1} \ldots, \alpha^{i_{k+m}}, \alpha^{3i_1} \ldots, \alpha^{3i_{k+m}}, \alpha^{r_1} \ldots, \alpha^{r_l}$ are used in their vector presentation as M-component column vectors, and the respective exponents of the generating element $\alpha$ are to be interpreted modulo $2^M-1$, as it is the standard in Galois fields. Here, $k+m \leq 2^M-1$.

$0|$ denotes here an M-dimensional column vector with its M components equal to 0.

The exponents $i_1, \ldots, i_{k+m}$ of $\alpha^{i_1} \ldots \alpha^{i_{k+m}}$ in the matrix $H^x$ are selected so that they are pair-wise different.

The matrix H comprises $m=2 \cdot M$ rows, so that the associated code C comprises $m=2 \cdot M$ check bits.

It may be advantageous to select also the exponents $r_1, \ldots, r_l$ in the matrix $H^a$ so that they are pair-wise different, when $l \leq 2^M-1$ applies. The $m=2 \cdot M$ components of the columns $h_i^x$, $i=1, \ldots, k+m$ of the matrix $H^x$ consist of M first components belonging to $\alpha^{i_j}$ and M second components belonging $\alpha^{3 \cdot i_j}$. The $m=2 \cdot M$ components of the columns $h_q^a$, $q=1, \ldots, l$ of the matrix $H^a$ consists of M first components 0 which form an M-component 0 vector 0| and of M second components belonging to $\alpha^{r_q}$.

As axis a generating element of the Galois field GF($2^M$), $\alpha^{r_q}$ is unequal 0| for an arbitrary value of $r_q$ and for any arbitrary M-component binary vector z≠0| there is a uniquely determined value $r_z$ with $1 \leq r_z < 2^M - 1$, so that $z = \alpha^{r_z}$ applies.

The matrix $H^x$ is an H matrix of a shortened BCH code when $k+m < 2^M - 1$ and the H matrix of an unshortened BCH code when $k+m = 2^M - 1$, wherein the BCH code is a 1-bit error and 2-bit error correcting BCH code with a code distance d≥5, so that all error syndromes $$S^x = H^x \cdot (e_1^x, \ldots, e_{k+m}^x) \quad (35)$$

for 1-bit errors and for 2-bit errors in the bits $x'_1, \ldots, x'_{k+m}$ are pair-wise different and unequal 0|.

As the exponents $i_1, \ldots, i_{k+m}$ are pair-wise different, also $\alpha^{i_1}, \ldots, \alpha^{i_{k+m}}$ are pair-wise different and unequal 0|.

For a 1-bit error in the b-th bit $1 \leq b \leq k+m$ the syndrome generator Synd 110 then determines an error syndrome $$S^x(b) = \begin{matrix} \alpha^{i_b} \\ \alpha^{3i_b} \end{matrix} \neq \begin{matrix} 0| \\ 0| \end{matrix}$$

and for a 2-bit error in the a-th and b-th bit $$S^x(a,b) = \begin{matrix} \alpha^{i_a} + \alpha^{i_b} \\ \alpha^{3i_a} + \alpha^{3i_b} \end{matrix} \neq \begin{matrix} 0| \\ z \end{matrix},$$

wherein due to $\alpha^{i_b} \neq \alpha^{i_a}$ also $\alpha^{i_b} + \alpha^{i_a} \neq 0|$ and + is the addition in GF($2^M$) which corresponds to the componentwise XOR-ing of the M-component binary vectors in the used vector presentation.

The sub-matrix $$H^{x1} = (\alpha^{i_1}, \ldots, \alpha^{i_{k+m}})$$

consisting of M rows is an H matrix of a linear code of the length k+m with Q=M check bits. It here consists of the first Q=M rows of the matrix $H^x$. The code associated with the H matrix $H^{x1}$ is a Hamming code with the code distance d=3, so that all 1-bit errors and all 2-bit errors in the bits $x'_1, \ldots, x'_{k+m}$ lead to an error syndrome $S^{x1} \neq 0|$, wherein $S^{x1}$ consists of the first Q=M columns of the error syndrome $S^x$ according to equation (35) with $$S^{x1} = H^{x1} \cdot (e_1^x, \ldots, e_{k+m}^x)^T \quad (36)$$

The Q=M first rows of the matrix $H^a$ which correspond to the Q rows of the matrix $H^{x1}$ are the rows of the matrix $H^a$ which each form an l-component row vector of only zeros. In the considered embodiment, these are the first Q=M rows of the matrix $H^y$.

As $\alpha$ is a generating element of the Galois field GF($2^M$), $\alpha_p \neq 0|$ for $p \in \{0,1, \ldots, M-2\}$ applies, and each column of the matrix $H^a$ comprises at least one 1.

Figure 29:
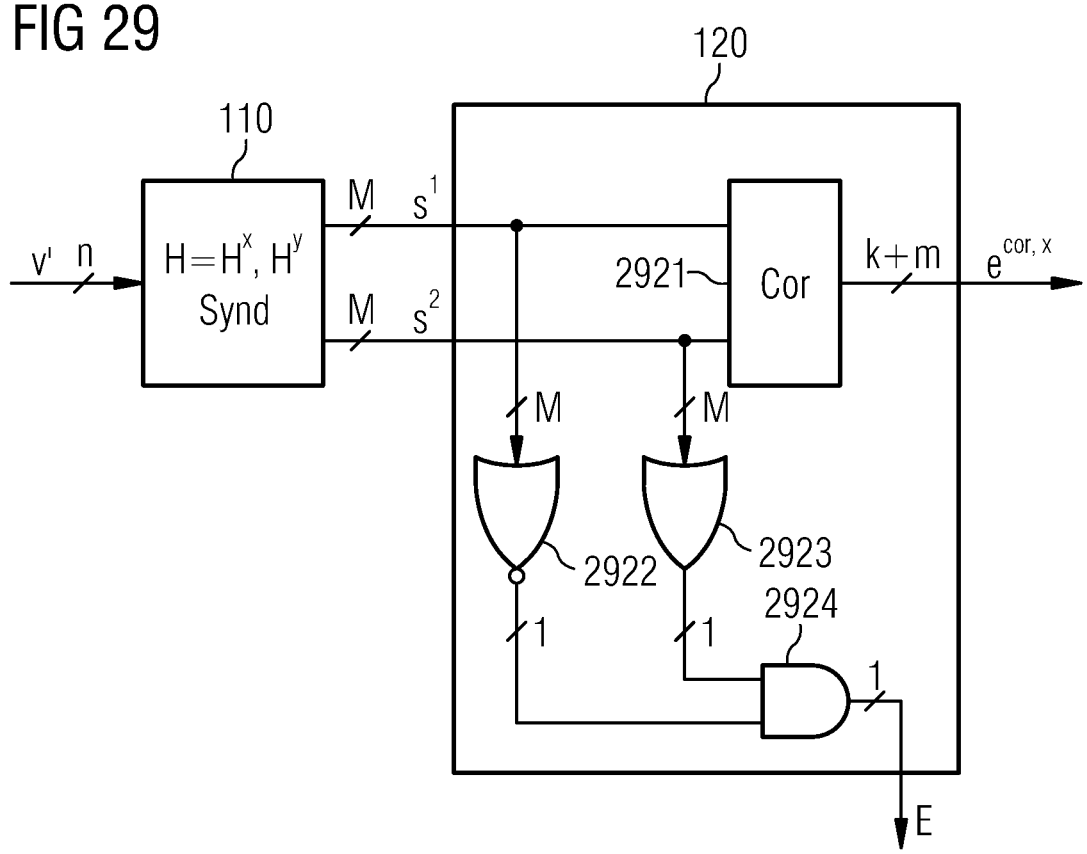
FIG. 29 shows the subcircuit Cor/Det 120 of FIG. 28 according to an embodiment.

FIG. 29 shows a possible implementation for the subcircuit Cor/Det 120 of FIG. 28 for the considered implementation example.

In FIG. 29, $m = 2 \cdot M$ applies and the syndrome generator Synd designated by reference numeral 110 like in FIG. 28 outputs the subsyndrome $S^1$ on its first M-bit wide output lines and outputs the subsyndrome $S^2$ on its second M-bit wide output lines.

The first M-bit wide output lines of the syndrome generator Synd 110 which carry the subsyndrome $S^1$ are connected to M first inputs of a corrector Cor 2921 and simultaneously to M inputs of an NOR circuit 2922 having M inputs and a 1-bit wide output. The second M-bit wide output lines of the syndrome generator Synd 110 are connected to M second inputs of the corrector Cor 2921 and simultaneously to M inputs of an OR circuit 2923 having M inputs and a 1-bit wide output.

The 1-bit wide output of the NOR circuit 2922 is connected to a first input of an AND gate 2924 having two inputs and one output, wherein the second input of the AND gate 2924 is connected to the output of the OR circuit 2923.

The AND gate 2924 outputs the error signal E at its 1-bit wide output. Here E=1 applies when $S^1 = 0|$ and $S^2 \neq 0|$, so that E=1 indicates an error in the bits $a'_1, \ldots, a'_l$.

We have E=0 when $S^1 \neq 0|$ or $S^2 = 0|$ apply. Here, the subsyndrome $S^2 = (S_1^2, \ldots, S_M^2)$ being an M-digit binary number may in principle take on $2^M$ different values.

If no error occurs in the bits $a'_1, \ldots, a'_l$, then $S^2 = 0|$. It is also possible that $S^2 = 0|$ when certain errors occurred in the bits $a'_1, \ldots, a'_l$, so that the following applies $$H^a \cdot (e_1^a, \ldots, e_l^a)^T = 0|.$$

If all values $\alpha^{r_1}, \alpha^{r_2}, \ldots, \alpha^{r_l}$ are pair-wise different it cannot happen that a 1-bit error or a 2-bit error in the bits $a'_1, \ldots, a'_l$ leads to $S^2 = 0|$. If in addition to that all values $\alpha^{r_1}, \alpha^{r_2}, \ldots, \alpha^{r_l}$ comprise an odd number of ones, it cannot happen that a 1-bit error, a 2-bit error or a 3-bit error in the bits $a'_1, \ldots, a'_l$ leads to $S^2 = 0|$.

If the values $\alpha^{r_1}, \alpha^{r_2}, \ldots, \alpha^{r_l}$ are determined so that they comprise M linearly independent vectors and if it may be assumed that random errors in the bits $a'_1, \ldots, a'_l$ occur with the same probability, then the probability that $S^2 = 0|$, although a random error exists in the bits $a'_1, \ldots, a'_l$, is equal $2^{-M}$. Already for M=10 an error detection probability of greater than 99.9% results for random errors in the bits $a'_1, \ldots, a'_l$.

The corrector Cor 2921 in FIG. 29 forms correction values $e^{cor,x} = e_1^{cor,x}, \ldots, e_{k+m}^{cor,x}$ for the bits $x'_1, \ldots, x'_{k+m}$ at its k+m-bit wide output.

For 1-bit and 2-bit errors in the bits $x'_1, \ldots, x'_{k+m}$ the correction values $e^{cor,x} = e_1^{cor,x}, \ldots, e_{k+m}^{cor,x}$ are determined by the corrector Cor 2921, for example using a 2-bit error correcting BCH code and as it is described for example in Okano, H. and Imai, K. "A construction method of high-speed decoders using ROM's for Bose-Chaudhuri Hocqenhem and Reed Solomon codes", IEEE trans. Comp. C 36, pp. 1165-1171, 1987.

In an embodiment, t≥2 so that the linear t-bit error correcting code is an at least 2-bit error correcting code.

For the bits $a'_1, \ldots, a'_l$ no correction values are formed. Errors in these bits are only detected.

Figure 30:
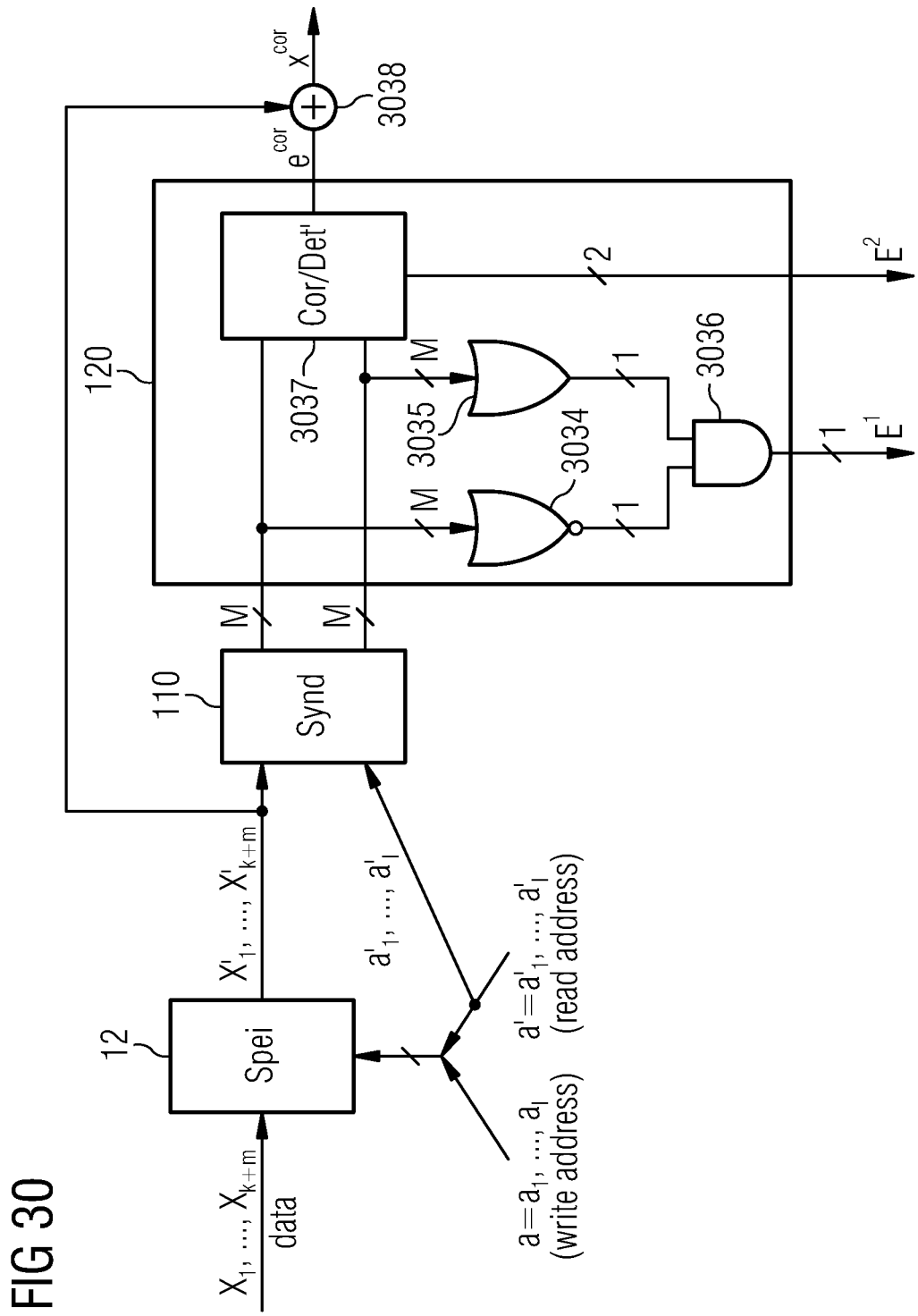
FIG. 30 shows a read out of bits from an addressable memory from a read address according to an embodiment.

FIG. 30 shows a further embodiment of the invention, wherein bits $X'_1, \ldots, X'_{k+m}$ are read out from an addressable memory Spei 12 at a read address $a' = a'_1, \ldots, a'_l$ and the bits $x'_1, \ldots, x'_{k+m}, a'_1, \ldots, a'_l$ may have resulted from errors from a codeword $x_1, \ldots, x_{k+m}, a_1, \ldots, a_l$ of a linear code C, wherein the bits $x_1, \ldots, x_{k+m}$ were written into the memory at the write address $a_1, \ldots, a_l$. It is considered here that both the bits $X_1, \ldots, X_{k+m}$ written into the memory may be disturbed by errors into $x'_1, \ldots, x'_{k+m} \neq x_1, \ldots, x_{k+m}$ when they are stored in the memory (for instance by radiation) and further bits may be read out at an erroneous address $a' = a'_1, \ldots, a'_l \neq a_1, \ldots, a_l = a$. The memory Spei 12 comprises an address input at which either a write address $a = a_1, \ldots, a_l$ or a read address $a' = a'_1, \ldots, a'_l$ may be applied. Control signals of the memory, like the write enable signal or the read enable signal are not indicated in FIG. 30.

The bits $x_1, \ldots, x_{k+m}$ written into the memory Spei 12 at a write address $a=a_1, \ldots, a_l$ for example consists of k data bits $u_1, \ldots, u_k$ and m check bits $c_1, \ldots, c_m$ which, together with the bits of the write address $a_1, \ldots, a_l$ at which the data bits and the check bits were written into the memory, form a codeword $c_1, \ldots, c_m, u_1, \ldots, u_k, a_1, \ldots, a_l$ of a linear code C of the length n=k+m+l with m check bits. If the H matrix of the code C is designated by H, the following applies $$H \cdot [\underbrace{c_1, \ldots, c_m, u_1, \ldots, u_k}_{=x_1, \ldots, x_{k+m}}, \underbrace{a_1, \ldots, a_l}_{=y_1, \ldots, y_l}]^T = (\underbrace{0, \ldots, 0}_{m})^T.$$

The bits $x'_1, \ldots, x'_{k+m}$ read out of the memory Spei 12 at the read address a' are here applied to a first k+m-bit wide input of a syndrome generator Synd 110, at whose second l-bit wide input the bits $a'_1, \ldots, a'_l$ of the read address are applied and which outputs an error syndrome S at its m=2·M-bit wide output whose first M components form the subsyndrome $S^1$ and whose second M components form the subsyndrome $S^2$. Here, the syndrome generator Synd 110 is configured so that it provides the components of the error syndrome at its output according to the H matrix H and M≥2.

The H matrix of the code C is here determined so that errors in bits of the bits $X'_1, \ldots, x'_{k+m}$ are corrected and errors in the address bits $y'_1=a'_1, \ldots, y'_l=a'_l$ are detected.

If, for example, t=2 then 1-bit errors and 2-bit errors in the bits $x'_1, \ldots, x'_{k+m}$ are corrected.

The H matrix may here have the following form $$H^x = \begin{pmatrix} \alpha^{i_1} & \ldots & \alpha^{i_{k+m}} \\ \alpha^{3i_1} & \ldots & \alpha^{3i_{k+m}} \end{pmatrix}$$

and $$H^a = \begin{pmatrix} 0| & \ldots & 0| \\ \alpha^{r_1} & \ldots & \alpha^{r_l} \end{pmatrix},$$

wherein $\alpha^{i_1} \ldots, \alpha^{i_{k+m}}, \alpha^{3i_1} \ldots, \alpha^{3i_{k+m}}, \alpha^{r_1} \ldots, \alpha^{r_l}$ are elements of the Galois field $GF(2^M)$ with a generating element $\alpha$ in their vector presentation as M-component binary vectors, 0| designates here an M-component zero vector, the values $i_1, \ldots, i_{k+m}$ are pair-wise different and 2·M=m and the exponents of the generating element $\alpha$ are to be interpreted modulo $2^M-1$.

The syndrome generator Synd 110 is configured so that it comprises, at its 2·M outputs, an error syndrome $$S^T = H \cdot [x'_1, \ldots, x'_{k+m}, a'_1, \ldots, a'_l]^T = H \cdot [c'_1, \ldots, c'_m, u'_1, \ldots, u'_k, a'_1, \ldots, a'_l]^T \quad (37)$$

with m=2·M whose first M components form the subsyndrome $S^1$ and whose second M components form the subsyndrome $S^2$. The m=2·M bit output of the syndrome generator Synd 110 is connected to the m-bit wide input of the subcircuit Cor/Det' 3037 which is configured so that at its first k+m-bit wide output it forms a correction signal $e^{cor,x} = e_1^{cor,x}, \ldots, e_{k+m}^{cor,x}$ for the bits $x'_1, \ldots, x'_{k+m}$ which are combined, according to their respective bit positions, into $$x^{cor} = x_1^{cor}, \ldots, x_{k+m}^{cor} = x'_1 \oplus e_1^{cor,x}, \ldots, x'_{k+m} \oplus e_{k+m}^{cor,x} \quad (38)$$

in the XOR circuit 3038 which comprises k+m XOR gates, each having two inputs and one output.

The subcircuit Cor/Det' 3037 is here configured so that, at its second, here 2-bit wide output which carries the error signal $E^2$, it outputs 0, 0 when $S^1=S^2=0|$ applies and no error is indicated, it outputs 0, 1 when $S^1 \neq 0|$ and $(S^1)^3 = S^2$ apply and it is indicated that a 1-bit error exists in the bits $x'_1, \ldots, x'_{k+m}$, and it outputs 1, 0 when $S^1 \neq 0|$ applies and $(S^1)^3 \neq S^2$ applies which indicates that an error exists in the bits $x'_1, \ldots, x'_{k+m}$ which is no 1-bit error.

Apart from that, the first M components of the output of the syndrome generator Synd 110 are connected to the M-bit wide input of a NOR circuit 3034 having M inputs and one output, while the second M components of the output of the syndrome generator Synd 110 are connected to the M-bit wide input of an OR circuit 3035 having M inputs and one output. The output of the NOR circuit 3034 and the OR circuit 3035 are each connected to an input of an AND gate 3036 having two inputs and one output wherein the same outputs a 1-bit error signal $E^1$ at its output.

The subcircuit Cor/Det 120 of FIG. 28 is here formed by the described subcircuit Cor/Det' 3037, the OR circuit 3035, the NOR circuit 3034 and the AND gate 3036.

The error signal $E^1$ is equal to 1, when simultaneously $S^1=0|$ and $S^2 \neq 0|$. $E^1=1$ may indicate an address error. The error signal $E^1$ is equal to 0, when $S^2=0|$ or when $S^1 \neq 0|$. For $E^1=0$ no address error can exist, except for very few specific constellations of the bits $y'_1, \ldots, y'_l$ (or $a'_1, \ldots, a'_l$), the probability of which is $2^{-M}$, which are mapped to $S^2=0|$.

Figure 31:
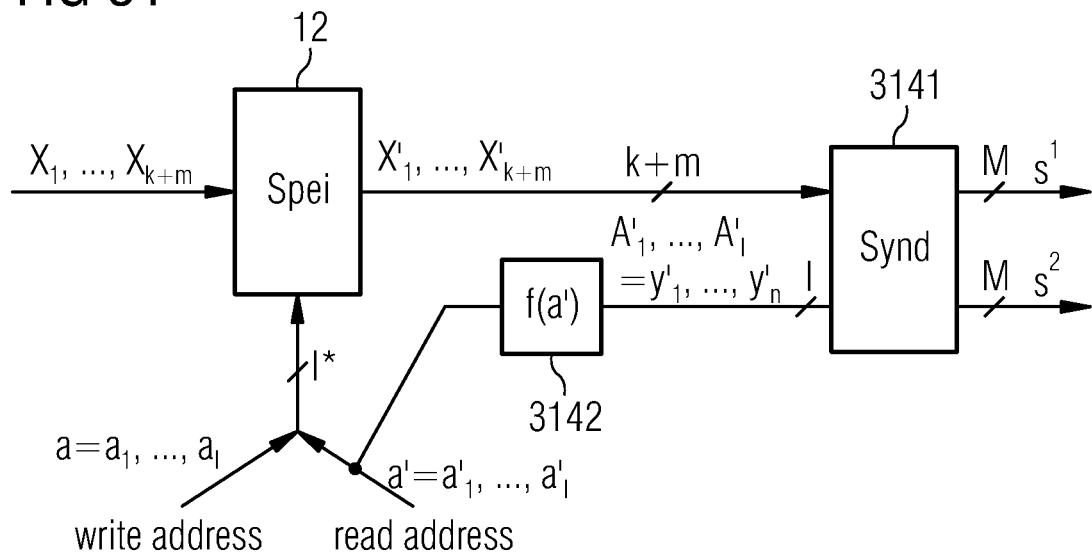
FIG. 31 shows a read out of bits from an addressable memory according to another embodiment.

FIG. 31 shows a further embodiment of the invention, wherein bits $x'_1, \ldots, x'_{k+m}$ are read out of an addressable memory Spei 12 at a read address $a'=a'_1, \ldots, a'_{l*}$, wherein $y'_1, \ldots, y'_l = A'_1, \ldots, A'_l = f(a'_1, \ldots, a'_{l*})$ applies. Here, $f: \{0,1\}^{l*} \rightarrow \{0,1\}^l$ is a function which maps l*-digit address bits $a_1, \ldots, a_{l*}$ to l-digit compacted address bits $A_1, \ldots, A_l$, wherein l*>l applies. This mapping is done by a subcircuit 3142 having l* inputs and l outputs connected to l second inputs of the syndrome generator Synd 3141. The k+m first inputs of the syndrome generator Synd 3141 are connected to the k+m data lines of the memory Spei 12 which carry the bits $x'_1, \ldots, x'_{k+m}$. The bits of the read address $a'_1, \ldots, a'_{l*}$ are applied to the l* inputs of the subcircuit 3142. The bits $x'_1, \ldots, x'_{k+m}, A'_1, \ldots, A'_l$ may have resulted due to errors from a codeword $x_1, \ldots, x_{k+m}, A_1, \ldots, A_l$ of a linear code C, wherein the bits $x_1, \ldots, x_{k+m}$ were written into the memory at the write address $a_1, \ldots, a_{l*}$. It is considered here that both the bits $x_1, \ldots, x_{k+m}$ written into the memory, when they are read out, may be changed by errors into $x'_1, \ldots, x'_{k+m} \neq x_1, \ldots, x_{k+m}$, and also bits may be read out at an erroneous address $a'=a'_1, \ldots, a_{l*}' \neq a_1, \ldots, a_{l*}$, so that also the compacted bits $A'_1, \ldots, A'_l$ formed from the read address $a'_1, \ldots, a'_{l*}$ may be erroneous. The memory Spei 12 comprises an address input to which either a write address $a=a_1, \ldots, a_{l*}$ or a read address $a'=a'_1, \ldots, a'_{l*}$ may be applied. Control signals of the memory, such as the write enable signal or the read enable signal, are not illustrated in FIG. 31.

The bits $x_1, \ldots, x_{k+m}$ written into the memory Spei 12 at a write address $a=a_1, \ldots, a_{l*}$ here, for example, consists of k data bits $u_1, \ldots, u_k$ and m check bits $c_1, \ldots, c_m$ which form a codeword $c_1, \ldots, c_m, u_1, \ldots, u_k, A_1, \ldots, A_l$ of a linear code C of the length n=k+m+l having m check bits together with the compacted bits $A_1, \ldots, A_l$ of the write address $a_1, \ldots, a_{l*}$ at which the data bits and the check bits have been written into the memory. If the H matrix of the code C is designated by H, the following applies $$H \cdot [c_1, \ldots, c_m, u_1, \ldots, u_k, A_1, \ldots, A_l]^T = (\underbrace{0, \ldots, 0}_{m})^T. \quad (5)$$

The bits $x'_1, \ldots, x'_{k+m}$ read out of the memory Spei 12 at the read address a' are here applied to a first k+m-bit wide input of a syndrome generator Synd 3141 at whose second l-bit wide input the bits $A'_1, \ldots, A'_l$ of the compacted bits of the read address are applied and which outputs an error syndrome S at its m=2·M bit wide output whose first M components form the subsyndrome $S^1$ and whose second M components form the subsyndrome $S^2$. The syndrome generator Synd 3141 is configured so that it provides the components of the error syndromes according to the H matrix Hat its output and M≥2 applies. The H matrix of the code C is here determined so that errors in bits of the bits $x'_1, \ldots, x'_{k+m}$ are corrected and errors in compacted address bits $y'_1 = A'_1, \ldots, y'_l = A'_l$ are detected.

If, for example, t=2, then 1-bit errors and 2-bit errors in bits of the bits $x'_1, \ldots, x'_{k+m}$ are corrected and errors in the bits $A'_1, \ldots, A'_l$ which may, for example, be caused by errors in the bits $a_1, \ldots, a_{l^*}$ are detected. The subcircuit 3142 may be configured so that the compacted address bits $A_1, \ldots, A_l$ are formed by l Boolean functions according to the following relation $$y_1 = f_1(a_1, \ldots, a_{1*})$$
$$y_2 = f_2(a_1, \ldots, a_{1*})$$
$$\vdots$$
$$y_l = f_l(a_1, \ldots, a_{1*}),$$

l*>l applies and $f_1, f_2, \ldots, f_l$ each are l*-ary Boolean functions.

It may here be advantageous that $$y_1, \ldots, y_l \neq \underbrace{0, \ldots, 0}_{l}$$

for all values of the addresses $a_1, \ldots, a_{l^*}$ applies. It is possible that $$\begin{aligned} y_1 &= A_1 \\ y_2 &= A_2 \\ &\vdots \\ y_l &= A_l \end{aligned} = K \cdot \begin{pmatrix} a_1 \\ a_2 \\ \vdots \\ a_{l*} \end{pmatrix}$$

applies, wherein K is a binary (l, l*) matrix. In this case, the subcircuit 3142 may be realized by XOR gates.

It is likewise possible that always $y_1 = A_1 = 1$ applies and $$\begin{aligned} y_2 &= A_2 \\ y_3 &= A_3 \\ &\vdots \\ y_l &= A_l \end{aligned} = K^+ \cdot \begin{pmatrix} a_1 \\ a_2 \\ \vdots \\ a_{l*} \end{pmatrix}$$

applies, wherein $K^+$ is a binary (l-1, l*) matrix. It then applies that $y_1, \ldots, y_l = A_1, \ldots, A_l$ is always unequal $$\underbrace{0, \ldots, 0}_{l}.$$

It is possible that due to an error all bits $x'_1, \ldots, x'_{k+m}$ are erroneously equal to 0. Such an error may be called an All-0-error. It is possible that the bits $x'_1, \ldots, x'_{k+m}$ are stored into memory cells which erroneously all take on the value 0. Then, the subsyndrome is $S^1 = 0|$. If the matrix $H^a$ is determined so that $$H^a = \begin{pmatrix} 0| & \ldots, & 0| \\ \alpha^{r_1} & \ldots, & \alpha^{r_l} \end{pmatrix}, \quad (39)$$

applies, then the subsyndrome $S^2$ is equal $$S^2 = (\alpha^{r_1}, \ldots, \alpha^{r_{l^*}}) \cdot (a_1, \ldots, a_{r_{l^*}})^T, \quad (40)$$

when the address bits are non-compacted and is equal to $$S^2 = (\alpha^{r_1}, \ldots, \alpha^{r_l}) \cdot (A_1, \ldots, A_{r_l})^T, \quad (41)$$

when the address bits $a_1, \ldots, a_{l^*}$ have been compacted into l compacted address bits $A_1, \ldots, A_l$.

If, for example, m=2·M and l=M, then there are M different M-dimensional column vectors $\alpha^{r_j}$, j=1, ..., M. They may be determined so that the M-component column vectors $\alpha^{r_1}, \ldots, \alpha^{r_M}$ are linearly independent. If, apart from that, the M compacted address bits $A_1, \ldots, A_M$ are determined so that they are unequal $$\underbrace{0, \ldots, 0}_{M}$$

for all occupations of the address bits $a_1, \ldots, a_{l^*}$ then the subsyndrome determined according to equation (41) is $S^2 \neq 0|$ and the error All-0 is detected for a random value of the address.

For example, the following may be determined $$A_1, A_2, \ldots, A_M = 1, A_2, \ldots, A_M \neq \underbrace{0, \ldots, 0}_{M}$$

so that the first compacted address bit $A_1$ is always equal 1. In other words, an All-0 error in the bits $x'_1, \ldots, x'_{k+m}$ which may have been caused by the fact that all values of the memory cells into which $x_1, \ldots, x_{k+m}$ was written erroneously take on the value 0 then leads to an error syndrome with $S^1 = 0|$ and $S^2 \neq 0|$ and the error is detected as a non-correctable error.

For example, $$\alpha^{r_1}, \ldots, \alpha^{r_M} = \alpha^0, \alpha^0, \ldots, \alpha^M = I_M$$

may be determined, wherein $I_M$ is the M-dimensional identity matrix. Then, the following applies $$(S^2)^T = I_M \cdot [1, A_2, \ldots, A_M]^T = [1, A_2, \ldots, A_M]^T \neq 0|^T.$$

It is also possible that due to an error all bits $x'_1, \ldots, x'_{k+m}$ erroneously take on the value 1. Such an error may be called an All-1 error.

If a matrix $H^x$ is used for which $$h_1^x + h_2^x + \ldots + h_{k+m}^x = 0$$

applies, wherein 0 here designates the column vector with 2·M zeroes, then an All-1 error is detected analog to an All-0 error.

Figure 32:
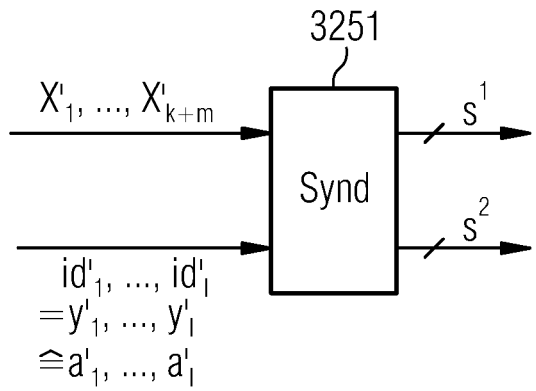
FIG. 32 shows a syndrome generator according to an embodiment.

FIG. 32 shows a syndrome generator Synd 3251 having k+m first inputs for inputting the possibly erroneous bits $x'_1, \ldots, x'_{k+m}$ which resulted from the correct bits $x_1, \ldots, x_{k+m}$ due to possible errors and having further l second inputs for inputting l possibly erroneous identifier bits
$id'_1, \ldots, id'_l = y'_1, \ldots, y'_l$ which may have resulted due to possible errors from correct identifier bits $id_1, \ldots, id_l$. The identifier bits may for example represent a password of a user. They may also serve for the identification of a receiver of the corrected data. For example, they may also be a binarily encoded name of the receiver of data on a bus. If the input identifier bits do not correspond to the correct indicator bits, a non-correctable error may be indicated which may, for example, lead to a reaction on system level, for example to an interrupt. Hence, the identifier bits $id_1, \ldots, id_l$ are regarded and treated in approximately the same manner as the address bits $a_1, \ldots, a_l$, or they may be also added to the already used address bits.

In FIG. 32, the syndrome generator Synd 3251 comprises M first outputs for outputting an M-component subsyndrome $S^1$ and M second outputs for outputting a further M-component subsyndrome $S^2$.

In some applications, data bits or coded bits may also be protected by a password against unauthorized access. The data bits can only by correctly decoded if the password or identifier bits are known to the receiver. Identifier bits may be also denoted as identifier bits.

Unexpectedly, the concept of data protection by a password or by identifier bits can be easily included into the concept of the invention as will be now described by an example.

It will be, for instance, shown how an erroneous password or erroneous identifier bits will result in an uncorrectable error. The corresponding error signal of an uncorrectable error may for instance automatically stop the readout of the data from the memory.

The error-free bits $x_1, \ldots, x_{k+m}$ may consist of m check bits $c_1, \ldots, c_m$ and k data bits $u_1, \ldots, u_k$, wherein the check bits are formed so that $$H \cdot [c_1, \ldots, c_m, u_1, \ldots, u_k, id_1, \ldots, id_l]^T = 0|$$

applies and $c_1, \ldots, c_m, u_1, \ldots, u_k, id_1, \ldots, id_l$ is a codeword of the considered code C.

Figure 33:
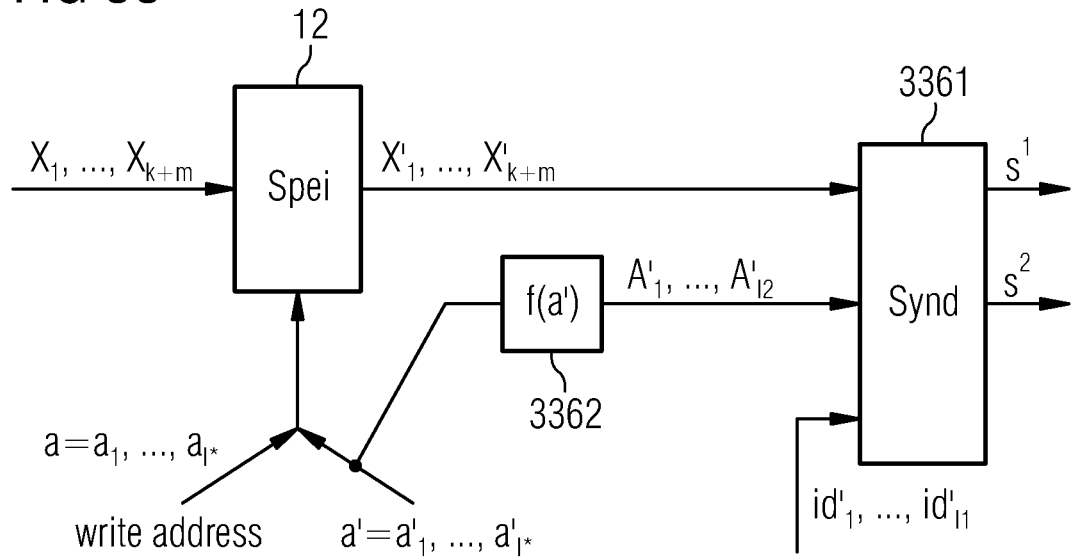
FIG. 33 shows a read out of bits from an addressable memory according to a further embodiment.

FIG. 33 shows a further embodiment of the invention, wherein bits $x'_1, \ldots, x'_{k+m}$ are read out of an addressable memory Spei 12 at a read address $a' = a'_1, \ldots, a'_{l*}$ wherein $y'_1, \ldots, y'_l = A'_1, \ldots, A'_{l2}, id'_1, \ldots, id'_{l1}$ and $A'_1, \ldots, A'_{l2} = f(a'_1, \ldots, a'_{l*})$ with $l = l_1 + l_2$. Here, $f: \{0,1\}^{l*} \to \{0,1\}^{l2}$ is a function which maps l*-digit address bits $a_1, \ldots, a_{l*}$ to l2-digit compacted address bits $A_1, \ldots, A_{l2}$, wherein $l^* > l2$. This mapping is done by a subcircuit 3362 having l* inputs and l2 outputs connected to l2 second inputs of the syndrome generator Synd 3361, wherein the k+m data lines of the memory Spei 12 which carry the bits $x'_1, \ldots, x'_{k+m}$ are connected to its k+m first inputs. Furthermore, l1 possibly erroneous identifier bits $id'_1, \ldots, id'_{l1}$ which may have resulted from possible errors of corrected identifier bits $id_1, \ldots, id_{l1}$ are applied to further third l1-digit inputs of the syndrome generator Synd 3361. The bits of the read address $a'_1, \ldots, a'_{l*}$ are applied to l* inputs of the subcircuit 3365.

The bits $x'_1, \ldots, x'_{k+m}, A'_1, \ldots, A'_{l2}, id'_1, \ldots, id'_{l1}$ may have resulted due to errors from a codeword $x_1, \ldots, x_{k+m}, A_1, \ldots, A_{l2}, id_1, \ldots, id_{l1}$ of a linear code C, wherein the bits $x_1, \ldots, x_{k+n}$ have been written into the memory at the write address $a_1, \ldots, a_{l*}$.

It is considered here that both the bits $x_1, \ldots, x_{k+m}$ written into the memory, when they are read out, may be disturbed by errors in $x'_1, \ldots, x'_{k+m} \neq x_1, \ldots, x_{k+m}$ and that also bits may be read out at an erroneous address $a' = a'_1, \ldots, a'_{l*} \neq a_1, \ldots, a_{l*}$ so that also the compacted bits $A'_1, \ldots, A'_{l2}$, formed from the read address $a'_1, \ldots, a'_{l*}$ may be erroneous, and also that the identifier bits $id_1, \ldots, id_{l1}$ may be different from the correct identifier bits. The memory Spei 12 comprises an address input to which either a write address $a = a_1, \ldots, a_{l*}$ or a read address $a' = a'_1, \ldots, a'_{l*}$ may be applied. Control signals of the memory, like the write enable signal or the read enable signal, are not indicated in FIG. 33. Also the indicator bits may be erroneous.

The bits $x_1, \ldots, x_{k+m}$ written into the memory Spei 12 at a write address $a = a_1, \ldots, a_{l*}$ here for example consist of k data bits $u_1, \ldots, u_k$ and m check bits $c_1, \ldots, c_m$ which, together with the compacted bits $A_1, \ldots, A_{l2}$ of the write address $a_1, \ldots, a_{l*}$ at which the data bits and the check bits have been written into the memory, and the identifier bits $id_1, \ldots, id_{l1}$, form a codeword $c_1, \ldots, c_m, u_1, \ldots, u_k, A_1, \ldots, A_{l2}, id_1, \ldots, id_{l1}$ of a linear code C of the length k+m+l with m check bits. If the H matrix of the code C is designated by H, the following applies $$H \cdot [c_1, \ldots, c_m, u_1, \ldots, u_k, A_1, \ldots, A_{l2}, id_1, \ldots, id_{l1}]^T = (\underbrace{0, \ldots, 0}_{m})^T.$$

The bits $x'_1, \ldots, x'_{k+m}$ read out of the memory Spei 12 at the read address a' are here applied to a first k+m-bit wide input of a syndrome generator Synd 3361, at whose second l2-bit wide input the bits $A'_1, \ldots, A'_{l2}$ of the compacted bits of the read address are applied and at whose third l1-bit wide input the possibly erroneous identifier bits $id'_1, \ldots, id'_{l1}$ are applied and which outputs at its m=2·M bit wide output an error syndrome S whose first M components form the subsyndrome $S^1$ and whose second M components form the subsyndrome $S^2$. Here, the syndrome generator Synd 3361 is configured so that it provides the components of the error syndromes according to the H matrix Hat its output and that M≥2 applies.

The H matrix of the code C is here determined so that errors in bits of the bits $x'_1, \ldots, x'_{k+m}$ are corrected and errors in the compacted address bits and in identifier bits, i.e. in the bits $y'_1, \ldots, y'_l = A'_1, \ldots, A'_{l2}, id'_1, \ldots, id'_{l1}$ are detected.

If, for example, t=2, then 1-bit errors and 2-bit errors in the bits $x'_1, \ldots, x'_{k+m}$ are corrected and errors in the bits $A'_1, \ldots, A'_{l2}$ which may for example have been caused by errors in the bits $a_1, \ldots, a_{l*}$, and errors in the bits $id'_1, \ldots, id'_{l1}$ are detected.

Figure 34:
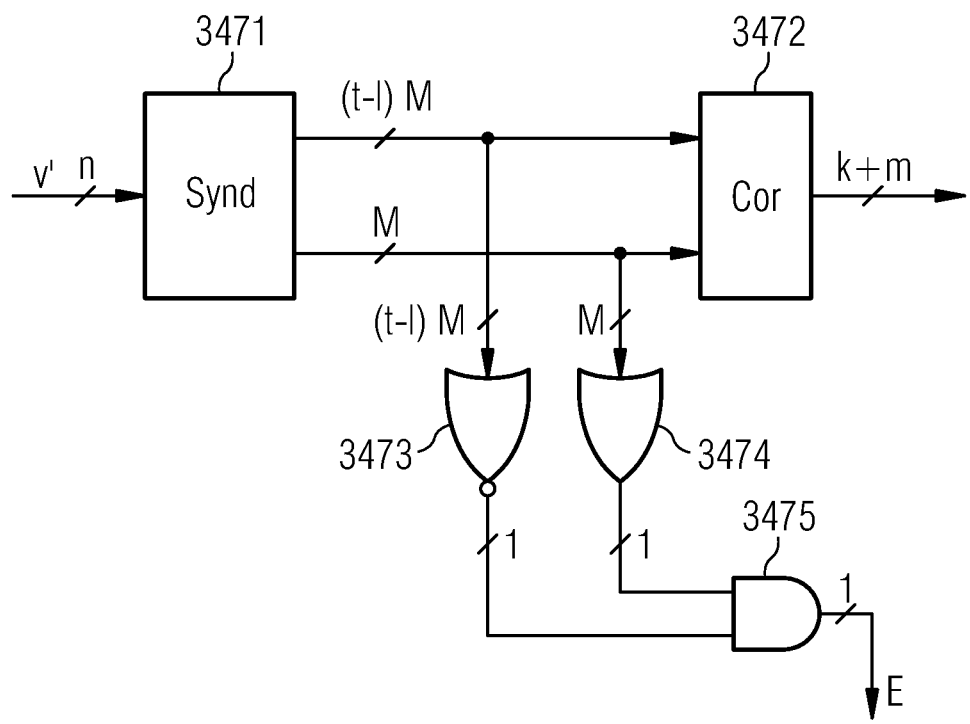
FIG. 34 shows a syndrome generator according to another embodiment.

FIG. 34 shows a syndrome generator Synd 3471 having n inputs to which an n-component word $v' = v'_1, \ldots, v'_n$ is applied which consists of a codeword $v = v_1, \ldots, v_n$ of a linear code C of the length n with t·M=m check bits.

The syndrome generator Synd 3471 comprises (t−1)·M first outputs for outputting (t−1)·M first components of an error syndrome S determined by the syndrome generator according to the H matrix of the code C which form a subsyndrome $S^1$, and M further outputs for outputting M further components of the error syndrome which are designated by $S^2$. In this embodiment, $t \geq 3$ is assumed. The Galois field used for determining the H matrix is $GF(2^M)$.

The $(t-1) \cdot M$ first outputs of the syndrome generator Synd 3471 which carry the value $S^1$ are connected to the $(t-1) \cdot M$ inputs of an NOR circuit 3473 having $(t-1) \cdot M$ inputs and one output which is connected to a first input of an AND gate 3475 having 2 inputs and one output. The M second outputs of the syndrome generator Synd 3471 which carry the value $S^2$ are connected to the M inputs of an OR circuit 3474 having M inputs and one output connected to the second input of the AND gate 3475 which outputs an error signal E at its output. The error signal E is equal to 1, if the $(t-1)$ components of $S^1$ are equal to 0 and if $S^2$ is not equal to 0|. The error signal E=1 indicates an address error.

The $t \cdot M$ outputs of the syndrome generator Synd 3471 are connected to $t \cdot M$ inputs of a corrector Cor 3472 which outputs a k+m-component correction value $e^{cor}$ for correcting possibly erroneous k+m bits of the word v' at its k+m outputs, wherein k+m designates the number of bits (length of the portion of the word of v') for which an error correction is in principle possible, up to t bit errors within said set of k+m bits.

If t=3, the H matrix of the code C may have the following form $$H=(H^x, H^a)$$

with $$H^x = \begin{pmatrix} \alpha^{i_1} & \ldots, & \alpha^{i_{k+m}} \\ \alpha^{3i_1} & \ldots, & \alpha^{3i_{k+m}} \\ \alpha^{5i_1} & \ldots, & \alpha^{5i_{k+m}} \end{pmatrix}$$

and $$H^a = \begin{pmatrix} 0| & \ldots, & 0| \\ 0| & \ldots, & 0| \\ \alpha^{r_1} & \ldots, & \alpha^{r_l} \end{pmatrix},$$

wherein $\alpha^{i_1} \ldots, \alpha^{i_{k+m}}, \alpha^{3i_1} \ldots, \alpha^{3i_{k+m}}, \alpha^{5i_1} \ldots, \alpha^{5i_{k+m}}, \alpha^{r_1} \ldots, \alpha^{r_l}$ elements of the Galois field $GF(2^M)$ in their vector presentation are M-component binary vectors, 0| designates an M-component zero vector, the values $i_1, \ldots, i_{k+m}$ are a pair-wise different, and we have $3 \cdot M = m$ and the exponents of the generating element $\alpha$ are to be interpreted modulo $2^M - 1$.

If t=4, the H matrix of the code C may have the following form $$H=(H^x, H^a)$$

with $$H^x = \begin{pmatrix} \alpha^{i_1} & \ldots, & \alpha^{i_{k+m}} \\ \alpha^{3i_1} & \ldots, & \alpha^{3i_{k+m}} \\ \alpha^{5i_1} & \ldots, & \alpha^{5i_{k+m}} \\ \alpha^{7i_1} & \ldots, & \alpha^{7i_{k+m}} \end{pmatrix}$$

and $$H^a = \begin{pmatrix} 0| & \ldots, & 0| \\ 0| & \ldots, & 0| \\ 0| & \ldots, & 0| \\ \alpha^{r_1} & \ldots, & \alpha^{r_l} \end{pmatrix},$$

wherein $\alpha^{i_1} \ldots, \alpha^{i_{k+m}}, \alpha^{3i_1} \ldots, \alpha^{3i_{k+m}}, \alpha^{5i_1} \ldots, \alpha^{5i_{k+m}}, \alpha^{7i_1} \ldots, \alpha^{7i_{k+m}}, \alpha^{r_1} \ldots, \alpha^{r_l}$ are elements of the Galois field $GF(2^M)$ with a generating element $\alpha$ in their vector representation as M-component binary vectors, 0| designates an M-component zero vector, the values $i_1, \ldots, i_{k+m}$ are all pair-wise different, and $4 \cdot M = m$ applies and the exponents of the generating element $\alpha$ are to be interpreted modulo $2^M - 1$.

Figure 35:
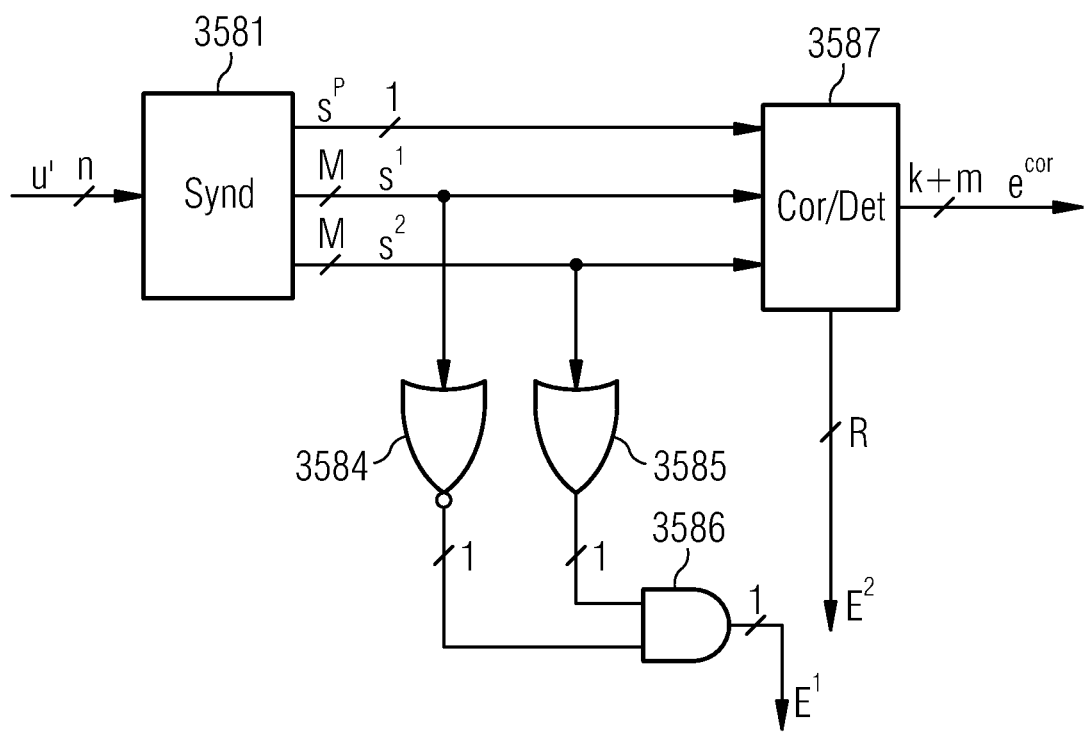
FIG. 35 illustrates an embodiment, where the parity of bits to be corrected is integrated into the formation of the H matrix of the used code C.

FIG. 35 shows an embodiment of the invention where the parity of bits to be corrected is integrated into the formation of the H matrix of the used code C.

There is a syndrome generator Synd 3581 having n inputs to which an n-component word $v' = v'_1, \ldots, v'_n = x'_1, \ldots, x'_{k+m}, y'_1, \ldots, y'_l$ is applied which may have resulted due to errors from a codeword $v = v_1, \ldots, v_n$ of a linear code C of the length n having $2 \cdot M + 1 = m$ check bits.

The syndrome generator Synd 3581 comprises a first 1-bit wide output for outputting a first component $S^P$ of an error syndrome S determined by the syndrome generator according to the H matrix of the code C, M second outputs for outputting M second components of an error syndrome S determined by the syndrome generator according to the H matrix of the code C designated by $S^1$ and M further outputs for outputting M further components of the error syndrome designated by $S^2$. In this embodiment, t=2 is assumed. The syndrome $S^P$ is the component of the error syndrome S associated with the parity. The Galois field used for determining the H matrix is $GF(2^M)$.

The M second outputs of the syndrome generator carrying the value $S^1$ are connected to the M inputs of an NOR circuit 3584 having M inputs and one output connected to a first input of an AND gate 3586 having two inputs and one output. The M third outputs of the syndrome generator carrying the value $S^2$ are connected to the M inputs of an OR circuit 3585 having M inputs and one output connected to the second input of the AND gate 3586 which outputs an error signal $E^1$ at its output.

Apart from that, the $2 \cdot M + 1$ outputs of the syndrome generator Synd 3581 are connected to $2 \cdot M + 1$ inputs of a corrector/detector Cor/Det 3587 which outputs at its k+m first outputs a k+m-component correction value $e^{cor}$ for correcting possible erroneous k+m bits $x'_1, \ldots, x'_{k+m}$ of the word v' and which outputs at further R outputs a further error signal $E^2$, wherein in the considered embodiment R=2.

One possible H matrix is $$H=(H^x, H^a)$$

with $$H^x = \begin{pmatrix} 1 & \ldots & 1 \\ \alpha^{i_1} & \ldots & \alpha^{i_{k+m}} \\ \alpha^{3i_1} & \ldots & \alpha^{3i_{k+m}} \end{pmatrix}$$

and $$H^a = \begin{pmatrix} 0 & \ldots, & 0 \\ \alpha^{r_1} & \ldots & \alpha^{r_l} \\ 0| & \ldots & 0| \end{pmatrix}$$

and $$H^{x'} = \begin{pmatrix} \alpha^{i_1} & \ldots & \alpha^{i_{k+m}} \\ \alpha^{3i_1} & \ldots & \alpha^{3i_{k+m}} \end{pmatrix}$$

and

-continued $$H^{a'} = \begin{pmatrix} \alpha^{r_1} & \ldots & \alpha^{r_l} \\ 0| & \ldots & 0| \end{pmatrix}$$

The matrices $H^{x'}$ and $H^{a'}$ here each consist of the lines 2 to 2M+1 of the matrices $H^x$ and $H^a$.

The first component $S^P$ of the error syndrome is determined by $$S^P = x'_1 \oplus x'_2 \oplus \ldots \oplus x'_{k+m}. \tag{42}$$

The following applies

If a 1-bit error exists in the bits $x'_1, \ldots, x'_{k+m}$, $S^P=1$, $(S^1)^3 = S^2$ applies and the corrector/detector Cor/Det 3587 is configured so that $E^2$ takes on a first value, for example 0, 1.

If a 2-bit error exists in the bits $x'_1, \ldots, x'_{k+m}$, $S^P=1$, $(S^1)^3 = S^2$ applies and the corrector/detector Cor/Det 3587 is configured so that $E^2$ takes on a second value, for example 1, 0.

If a 3-bit error exists in the bits $x'_1, \ldots, x'_{k+m}$, $S^P=0$, $(S^1)^3 \neq S^2$ applies and the corrector/detector Cor/Det 3587 is configured so that $E^2$ takes on a third value, for example 1, 1.

It is further possible to include the parity so that a H matrix $H=(H^x, H^a)$ is formed with $$H^x = \begin{pmatrix} \alpha^{j_1} & \ldots & \alpha^{j_{k+m}} \\ \alpha^{3j_1} & \ldots & \alpha^{3j_{k+m}} \end{pmatrix}$$

and $$H^y = \begin{pmatrix} \alpha^{r_1} & \ldots & \alpha^{r_l} \\ 0| & \ldots & 0| \end{pmatrix}$$

so that only such exponents $i_1, \ldots, i_{k+m}$ of the generating element $\alpha$ are used that $\alpha^{i_1}, \ldots, \alpha^{i_{k+m}}$ in their vector representation in $GF(2^M)$ as M-component column vectors each comprise an odd number of ones. Then, the parity of the bits $x'_1, \ldots, x'_{k+m}$ is determined by the XOR combination of the components of $S^1$.

The different representations of elements of a Galois field are known to the person skilled in the art.

For a better understanding of the invention, with reference to an embodiment, the determination of a H matrix with elements of a Galois field $GF(2^M)$ is now described, as it is for example described in Lin, S. and Costello, D. "Error Control Coding", Prentice Hall, 1983 on pages 148 and 149 with reference to page 33.

In this respect, the H matrix $$H = \begin{pmatrix} \alpha^0 & \alpha^1 & \alpha^2 & \ldots \alpha^{14} \\ \alpha^0 & \alpha^3 & \alpha^6 & \ldots \alpha^{12} \end{pmatrix} \tag{43}$$

with elements of the Galois field $GF(2^M)$ with the modular polynomial $p(X) = 1 + X + X^4$ is to be considered. The exponents of the generating element $\alpha$ are to be interpreted modulo $2^4 - 1 = 15$, so that e.g. ($3 \cdot 14 = 42 = 12$ modulo 15) applies.

The 16 elements of the Galois field may be given in the exponential representation, in the polynomial representation and in the vector or tuple representation, wherein the different representations are illustrated in table 1.

TABLE 1

| exponential representation | polynomial representation | column vector |
|---|---|---|
| 0 | 0 | 0 0 0 0 |
| $\alpha^0$ | 1 | 1 0 0 0 |
| $\alpha^1$ | $x^1$ | 0 1 0 0 |
| $\alpha^2$ | $x^2$ | 0 0 1 0 |
| $\alpha^3$ | $x^3$ | 0 0 0 1 |
| $\alpha^4$ | $1 + x$ | 1 1 0 0 |
| $\alpha^5$ | $x + x^2$ | 0 1 1 0 |
| $\alpha^6$ | $x^2 + x^3$ | 0 0 1 1 |
| $\alpha^7$ | $1 + x + x^3$ | 1 1 0 1 |
| $\alpha^8$ | $1 + x^2$ | 1 0 1 0 |
| $\alpha^9$ | $x + x^3$ | 0 1 0 1 |
| $\alpha^{10}$ | $1 + x + x^2$ | 1 1 1 0 |
| $\alpha^{11}$ | $x + x^2 + x^3$ | 0 1 1 1 |
| $\alpha^{12}$ | $1 + x + x^2 + x^3$ | 1 1 1 1 |
| $\alpha^{13}$ | $1 + x^2 + x^3$ | 1 0 1 1 |
| $\alpha^{14}$ | $1 + x^3$ | 1 0 0 1 |

As according to table 1 the following applies: $\alpha^0 = [1000]^T$, $\alpha^1 = [0100]^T$, $\alpha^2 = [0010]^T$, $\alpha^3 = [0001]^T$, $\alpha^6 = [0011]^T$, ..., $\alpha^{12} = [1111]^T$, $\alpha^{14} = [1001]$, for the matrix (43) the following results $$H = \begin{pmatrix} 1 & 0 & 0 & \ldots & 1 \\ 0 & 1 & 0 & \ldots & 0 \\ 0 & 0 & 1 & \ldots & 0 \\ 0 & 0 & 0 & \ldots & 1 \\ 1 & 0 & 0 & \ldots & 1 \\ 0 & 0 & 0 & \ldots & 1 \\ 0 & 0 & 1 & \ldots & 1 \\ 0 & 1 & 1 & \ldots & 1 \end{pmatrix}.$$

Some embodiments have been described with respect to columns of the above-described matrices. However, the person skilled in the art understands that all concepts described above are equally applicable to rows of the above-described matrices by employing the above-described concepts.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding unit or item or feature of a corresponding apparatus.

Depending on certain implementation requirements, embodiments of embodiments can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to embodiments comprise a non-transitory data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although each claim only refers back to one single claim, the disclosure also covers any conceivable combination of claims.

The invention claimed is:

1. A syndrome generator for forming an error syndrome of a linear code C of length n with an H-matrix $H=(h_1, \ldots, h_n)$ of n columns $h_1, \ldots, h_n$ of m components each such that the H-matrix is an (m, n)-matrix, wherein a codeword $v=v_1, \ldots, v_n$ of the code C comprises a first subword $x_1, \ldots, x_{k+m}$ of length k+m and a second subword $a_1, \ldots, a_l$ of length l with n=k+m+l, wherein the code C is configured for correcting $1, \ldots, $ t-bit errors in bits of the first subword and to detect $1, \ldots, l$ bit errors in bits of the second subword so that the columns of the H-matrix H corresponding to the bits of the first subword are forming a first (m, k+m)-sub-matrix $H^x=(h_1^x, \ldots, h_{k+m}^x)$ and so that the columns of the H-matrix H corresponding to the bits of the second subword are forming a second sub-matrix $H^a=(h_1^a, \ldots, h_l^a)$, wherein all linear combinations of up to t columns of the first submatrix $H^x$, which do not result in the zero vector, are pairwise different, and wherein all linear combinations of the columns of the second submatrix $H^a$ are different from all linear combinations of up to t columns of the first sub-matrix $H^x$, which do not result in the zero vector, wherein $t \geq 1$, $k>0$, $k+m \geq 4$, and $l > t+1$, and wherein the syndrome generator is implemented using digital hardware or a computer or a combination of a computer and digital hardware.

2. The syndrome generator according to claim 1, wherein at least a portion of the first subword $x_1, \ldots, x_{k+m} = u_1, \ldots, u_k, c_1, \ldots, c_m$ is stored in a memory under an address.

3. The syndrome generator according to claim 1, wherein at least one of the bits $a_1, \ldots, a_l$ of the second subword is not stored in a memory, wherein one or more bits of the first subword are stored.

4. The syndrome generator according to claim 1, wherein the second subword $a_1, \ldots, a_l$ are address bits or bits derived from address bits of an address under which at least a portion of the first subword $x_1, \ldots, x_{k+m} = u_1, \ldots, u_k, c_1, \ldots, c_m$ is stored.

5. The syndrome generator according to claim 1, wherein at least a subset of the bits $a_1, \ldots, a_l$ of the second subword are identifier bits.

6. The syndrome generator according to claim 1, wherein the second sub-matrix $H^y$ comprises two rows, the components of which are constant in said two rows.

7. The syndrome generator according to claim 1, wherein Q rows of the sub-matrix $H^x$ with Q<m form a parity check matrix $H^{x1}$ of an at least (t)-bit error detecting code of the length k+m with Q check bits and the sub-matrix $H^x$ is a parity check matrix of a t-bit error correcting code of the length k+m with m check bits, wherein the l components of the Q rows of the sub-matrix $H^y$ which correspond to the Q rows forming the parity check matrix $H^{x1}$ of the error detecting code consist of l zeroes, and wherein all columns of the sub-matrix $H^y$ comprise at least one component equal to 1.

8. The syndrome generator according to claim 7, wherein all columns of the sub-matrix Hy are pair-wise different.

9. The syndrome generator according to claim 1, wherein t=2, the parity check matrix $H=(H^x, H^y)$ is a (m, n) matrix and 2·M rows of the parity check matrix H form a matrix $(H^{x'}, H^{y'})$ with $$H^{x'} = \begin{pmatrix} \alpha^{j_1} & \ldots & \alpha^{j_{k+m}} \\ \alpha^{3j_1} & \ldots & \alpha^{3j_{k+m}} \end{pmatrix}$$

and wherein $H^{y'}$ is defined as $$H^{y'} = \begin{pmatrix} \alpha^{r_1} & \ldots & \alpha^{r_l} \\ 0| & \ldots & 0| \end{pmatrix} \text{ or } H^{y'} = \begin{pmatrix} 0| & \ldots & 0| \\ \alpha^{r_1} & \ldots & \alpha^{r_l} \end{pmatrix},$$

wherein $\alpha^{j_1}, \ldots, \alpha^{j_{k+m}}, \alpha^{3j_1}, \ldots, \alpha^{3j_{k+m}}, \alpha^{r_1}, \ldots, \alpha^{r_l}$ are elements of a Galois field $GF(2^M)$ with a generating element $\alpha$ in their vector presentation as M-component binary vectors, 0| designates an M-component zero vector, the values $i_1, \ldots, i_{k+m}$ are pair-wise different and $2 \cdot M \leq m$ and the exponents of the generating element $\alpha$ are to be regarded as modulo $2m-1$.

10. The syndrome generator according to claim 1, wherein t=3, the parity check matrix $H=(H^x, H^y)$ is an (m, n) matrix and $3 \cdot M$ rows of the parity check matrix H form a matrix $(H^{x'}, H^{y'})$ with $$H^{x'} = \begin{pmatrix} \alpha^{i_1} & \ldots & \alpha^{i_{k+m}} \\ \alpha^{3i_1} & \ldots & \alpha^{3i_{k+m}} \\ \alpha^{5i_1} & \ldots & \alpha^{5i_{k+m}} \end{pmatrix}$$

and wherein $H^{y'}$ is defined as $$H^{y'} = \begin{pmatrix} 0| & \ldots & 0| \\ 0| & \ldots & 0| \\ \alpha^{r_1} & \ldots & \alpha^{r_l} \end{pmatrix}, \text{ or } H^{y'} = \begin{pmatrix} 0| & \ldots & 0| \\ \alpha^{r_1} & \ldots & \alpha^{r_l} \\ 0| & \ldots & 0| \end{pmatrix},$$

$$\text{or } H^{y'} = \begin{pmatrix} \alpha^{r_1} & \ldots & \alpha^{r_l} \\ 0| & \ldots & 0| \\ 0| & \ldots & 0| \end{pmatrix},$$

wherein $\alpha^{i_1} \ldots, \alpha^{i_{k+m}}, \alpha^{3i_1} \ldots, \alpha^{3i_{k+m}}, \alpha^{r_1} \ldots, \alpha^{r_l}$ are elements of a Galois field $GF(2^M)$ in their vector presentation as m-component binary vectors, 0| designates an M-component zero vector, the values are all pair-wise different and $3 \cdot M + 2 \leq m$ and the exponents of the generating element $\alpha$ are to be interpreted modulo $2^M - 1$.

11. The syndrome generator according to claim 1, wherein $t \geq 2$, the sub-matrix $H^x$ is the parity check matrix of a shortened t-bit correcting BCH code in a Galois field $GF(2^M)$ in a separated form of the length k and the sub-matrix $H^y$ comprises l columns and at least $m=[(t-1) \cdot M]$ rows, wherein all l components of $(t-1) \cdot M$ of the rows of $H^y$ are Equal to 0.

12. The syndrome generator according to claim 11, wherein the components of the first $(t-1) \cdot M$ rows of the sub-matrix $H^y$ are equal to 0.

13. The syndrome generator according to claim 1, wherein the bits are compacted address bits formed from l address bits $a_1, \ldots, a_l$, according to the following relation $$y_1 = f_1(a_1, \ldots, a_{l*})$$
$$y_2 = f_2(a_1, \ldots, a_{l*})$$
$$\vdots$$
$$y_l = f_l(a_1, \ldots, a_{l*}),$$

$l \cdot > k$ applies and $f_1, f_2, \ldots, f_l$ are each l-ary Boolean functions.

14. The syndrome generator according to claim 13, characterized in that $$\begin{pmatrix} y_1 \\ y_2 \\ \vdots \\ y_l \end{pmatrix} = K \cdot \begin{pmatrix} a_1 \\ a_2 \\ \vdots \\ a_{l*} \end{pmatrix}$$

applies, wherein K is a binary (l, 1·) matrix.

15. The syndrome generator according to claim 13, characterized in that $y_1 = 1$ and $$\begin{pmatrix} y_2 \\ y_3 \\ \vdots \\ y_l \end{pmatrix} = K^+ \cdot \begin{pmatrix} a_1 \\ a_2 \\ \vdots \\ a_{l*} \end{pmatrix}$$

applies, wherein $K^+$ is a binary (l-1, 1·) matrix.

16. The syndrome generator according to claim 13, characterized in that $$y_1, \ldots, y_l \neq \underbrace{0, \ldots, 0}_{l}$$

for all values of the addresses $a_1, \ldots, a_l$.

17. The syndrome generator according to claim 16, wherein $l \cdot = l$ and the l columns of the submatrix $H^y$ are linearly independent.

18. The syndrome generator according to claim 1, wherein a component-wise XOR sum of the columns of the submatrix $H^x$ is equal to $$\underbrace{(0, \ldots, 0)^T}_{m}.$$

19. The syndrome generator according to claim 1, wherein a non-empty subset $\{y_{i_1}, \ldots, y_{i_q}\}$ of the bits $y_1 \ldots, y_l$ are identifier bits $id_{i_1}, \ldots id_{i_q}$ with $1 \leq q \leq l$.

20. The syndrome generator according to claim 19, wherein $1 \leq q \leq l$, a non-empty proper subset $\{y_{i_1}, \ldots, y_{i_q}\}$ of the bits $y_1 \ldots, y_l$ are identifier bits and a further non-empty proper subset $\{y_{j_1}, \ldots, y_{j_p}\}$ of the bits $y_1 \ldots y_l$ which are no identifier bits are address bits or bits derived from address bits, and wherein $q+p \leq l$ applies.

21. The syndrome generator according to claim 1, wherein the H-matrix $H=(h_1, \ldots h_n)$ comprises a plurality of rows, wherein one of the plurality of rows is different from another one of the plurality of rows, such that for $i=1, \ldots, m+k$, for the column $h_i^x$ of the submatrix $H^x=(h_1^x, \ldots, h_{k+m}^x)$ the pair of components which belong to the column $h_i^x$ and also either to said one of the plurality of rows or to said another one of the plurality of rows are different from [1, 1] and such that for $j=1, \ldots, l$ for the column $h_j^a$ of the submatrix $H^a=(h_1^a, \ldots, h_l^a)$ the pair of components which belong to the column $h_j^a$ and also belong either to said one of the plurality of rows or to said another one of the plurality of rows are equal to [1, 1] and wherein all columns of the H-matrix H comprise an odd number of 1s.

22. The syndrome generator according to claim 21, wherein the matrix $H^a$ is defined according to $$H^a = (h_1^a, \ldots, h_l^a) = \begin{pmatrix} \underbrace{1, \ldots, 1}_{m'} \\ \underbrace{1, \ldots, 1}_{m'} \\ L_{m'} \end{pmatrix}$$

wherein l=m'=m−2, wherein $L_{m'}$ is an (m', m')-matrix, wherein all columns of the H-matrix H comprise an odd number of 1 s, and wherein the m' columns of the matrix $L_{m'}$ are lineary independent.

23. The syndrome generator according to claim 22, wherein the matrix $L_{m'}$ is an m'-dimensional identity matrix.

24. A circuitry comprising a syndrome generator configured to generate a syndrome based on a parity check matrix and a binary word comprising a first set of bits and a second set of bits, wherein for the first set of bits an error correction of one or more correctable bit errors within the first set is provided by the parity check matrix and for the second set of bits an error detection of one or more detectable bit errors within the second set is provided by the parity check matrix;

wherein the parity check matrix comprises a first subset of columns that are associated with the first set of bits within the binary word, and a second subset of columns that are associated with the second set of bits within the binary word; and wherein syndromes generated by the first subset of columns in case one of the one or more correctable errors occurs within the first set of bits are all pairwise different for the one or more correctable errors and are also different from all syndromes generated by the second subset of columns in case an arbitrary error occurs within the second set of bits; or wherein the parity check matrix comprises a first subset of rows that are associated with the first set of bits within the binary word, and a second subset of rows that are associated with the second set of bits within the binary word; and wherein syndromes generated by the first subset of rows in case one of the one or more correctable errors occurs within the first set of bits are all pairwise different for the one or more correctable errors and are also different from all syndromes generated by the second subset of columns in case an arbitrary error occurs within the second set of bits.

25. A circuitry according to claim 24, wherein the first subset of columns forms an error correcting parity check matrix for the correctable bit errors that is based on a generating element of a Galois field, and wherein the second subset of columns forms an error detecting parity check matrix for the detectable errors that is based on the same generating element of the same Galois field, or wherein the first subset of rows forms the error correcting parity check matrix for the correctable bit errors that is based on a generating element of the Galois field, and wherein the second subset of rows forms the error detecting parity check matrix for the detectable errors that is based on the same generating element of the same Galois field.

\* \* \* \* \*